(12) United States Patent
Gallagher et al.

(10) Patent No.: US 8,783,458 B2
(45) Date of Patent: *Jul. 22, 2014

(54) PORTABLE ELECTRONIC DEVICE CASE ACCESSORIES AND RELATED SYSTEMS AND METHODS

(71) Applicant: Targus Group International, Inc., Anaheim, CA (US)

(72) Inventors: Kevin Gallagher, Los Angeles, CA (US); Robert Shortt, Laguna Beach, CA (US); Daniel Ballou, Long Beach, CA (US); Ronald DeCamp, Westminster, CA (US); Mark Thoni, Rancho Santa Margarita, CA (US); James C. Frinak, Los Angeles, CA (US)

(73) Assignee: Targus Group International, Inc., Anaheim, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/099,436

(22) Filed: Dec. 6, 2013

(65) Prior Publication Data

US 2014/0098478 A1    Apr. 10, 2014

Related U.S. Application Data

(63) Continuation of application No. 13/791,445, filed on Mar. 8, 2013, which is a continuation of application No. 13/155,266, filed on Jun. 7, 2011.

(60) Provisional application No. 61/352,286, filed on Jun. 7, 2010, provisional application No. 61/368,048, filed on Jul. 27, 2010, provisional application No. 61/421,431, filed on Dec. 9, 2010.

(51) Int. Cl.
| | |
|---|---|
| *B65D 85/00* | (2006.01) |
| *F16M 13/04* | (2006.01) |
| *F16M 11/10* | (2006.01) |
| *F16M 11/20* | (2006.01) |
| *G06F 1/16* | (2006.01) |
| *F16M 13/00* | (2006.01) |
| *H05K 5/02* | (2006.01) |

(52) U.S. Cl.
CPC .............. *G06F 1/1633* (2013.01); *F16M 13/04* (2013.01); *F16M 11/105* (2013.01); *F16M 11/2078* (2013.01); *F16M 11/2021* (2013.01); *F16M 13/005* (2013.01); *H05K 5/0226* (2013.01)
USPC ........................................ 206/320; 206/45.2

(58) Field of Classification Search
USPC ............... 206/320, 45.25, 45.2, 45.21, 45.26, 206/760, 767, 768, 754, 755, 766, 765, 762, 206/757, 759, 772, 774
See application file for complete search history.

(56) References Cited

U.S. PATENT DOCUMENTS

| | | | |
|---|---|---|---|
| 1,121,422 | A | 12/1914 | Tydings |
| 2,554,215 | A | 5/1951 | Schell et al. |

(Continued)

FOREIGN PATENT DOCUMENTS

| | | | |
|---|---|---|---|
| EP | 1 548 544 A2 | 6/2005 | |
| EP | 2 392 986 A2 | 12/2011 | |

(Continued)

OTHER PUBLICATIONS

Non-Final Office Action for U.S. Appl. No. 13/791,445, filed Mar. 8, 2013, and mailed from the USPTO on Dec. 27, 2013, 8 pgs.

(Continued)

*Primary Examiner* — Jacob K Ackun
*Assistant Examiner* — Jenine Pagan
(74) *Attorney, Agent, or Firm* — John R. Thompson; Stoel Rives LLP

(57) ABSTRACT

Case accessories for portable electronic devices are disclosed. In some embodiments, a case accessory may include a base configured to sit on a working surface, a support coupled to the base and configured to support a portable electronic device in an elevated position, a rotational mechanism coupled to the support configured to allow the holder to rotate in one or more directions relative to the support, and a holder coupled to the rotational mechanism and configured to secure the portable electronic device.

20 Claims, 54 Drawing Sheets

(56) References Cited

U.S. PATENT DOCUMENTS

| | | | |
|---|---|---|---|
| 2,556,066 A | 6/1951 | Cline | |
| 3,292,778 A | 12/1966 | Enderle | |
| 3,441,072 A | 4/1969 | Schmitt | |
| 3,530,213 A | 9/1970 | Isle | |
| 3,620,149 A | 11/1971 | Ogihara | |
| 4,106,597 A | 8/1978 | Shook et al. | |
| 4,259,568 A | 3/1981 | Dynesen | |
| 4,700,832 A | 10/1987 | Champ | |
| 4,901,897 A | 2/1990 | Briggs et al. | |
| 5,024,328 A | 6/1991 | Bontrager | |
| 5,165,649 A | 11/1992 | Neumann et al. | |
| 5,207,327 A | 5/1993 | Brondos | |
| 5,217,119 A | 6/1993 | Hollingsworth | |
| 5,330,049 A | 7/1994 | Bertelsen et al. | |
| 5,356,004 A | 10/1994 | Weinreb | |
| 5,524,754 A | 6/1996 | Hollingsworth | |
| 5,544,792 A | 8/1996 | Arnwine | |
| 5,555,157 A | 9/1996 | Moller et al. | |
| 5,594,619 A | 1/1997 | Miyagawa et al. | |
| 5,607,054 A | 3/1997 | Hollingsworth | |
| 5,622,262 A | 4/1997 | Sadow | |
| 5,769,221 A | 6/1998 | Cyr | |
| 5,775,496 A | 7/1998 | Cyr | |
| 5,797,044 A | 8/1998 | Lawther et al. | |
| 5,887,723 A | 3/1999 | Myles | |
| 5,971,148 A | 10/1999 | Jackson | |
| 6,082,543 A | 7/2000 | Béliveau | |
| 6,131,734 A | 10/2000 | Hollingsworth et al. | |
| 6,173,933 B1 | 1/2001 | Whiteside et al. | |
| 6,237,766 B1 | 5/2001 | Hollingsworth | |
| 6,334,533 B1 | 1/2002 | Hollingsworth et al. | |
| 6,334,534 B1 | 1/2002 | Hollingsworth et al. | |
| 6,535,199 B1 | 3/2003 | Canova, Jr. et al. | |
| D476,149 S | 6/2003 | Andre et al. | |
| 6,746,638 B1 | 6/2004 | Zadesky et al. | |
| 6,772,879 B1 | 8/2004 | Domotor | |
| 6,785,566 B1 | 8/2004 | Irizarry | |
| D500,923 S | 1/2005 | Gonzalez et al. | |
| D527,176 S | 8/2006 | Andre et al. | |
| D529,717 S | 10/2006 | Brancky | |
| D533,348 S | 12/2006 | Andre et al. | |
| 7,207,154 B2 | 4/2007 | Araujo | |
| D541,646 S | 5/2007 | Hayes et al. | |
| 7,281,698 B2 | 10/2007 | Patterson, Jr. | |
| D574,375 S | 8/2008 | Prest et al. | |
| D574,819 S | 8/2008 | Andre et al. | |
| 7,414,833 B2 | 8/2008 | Kittayapong | |
| 7,451,872 B1 | 11/2008 | Allen | |
| D582,405 S | 12/2008 | Andre et al. | |
| 7,467,695 B2 | 12/2008 | Gormick et al. | |
| 7,495,895 B2 | 2/2009 | Carnevali | |
| 7,500,561 B2 | 3/2009 | Matias et al. | |
| 7,503,440 B2 | 3/2009 | Gormick et al. | |
| 7,735,644 B2 | 6/2010 | Sirichai et al. | |
| 7,747,007 B2 | 6/2010 | Hyun et al. | |
| D623,404 S | 9/2010 | Andre et al. | |
| D623,638 S | 9/2010 | Richardson et al. | |
| D623,639 S | 9/2010 | Richardson et al. | |
| 7,876,550 B1 | 1/2011 | Albertini et al. | |
| 8,016,107 B2 | 9/2011 | Emsky | |
| 8,051,980 B2 | 11/2011 | Tai et al. | |
| 8,132,670 B1 | 3/2012 | Chen | |
| D658,363 S | 5/2012 | Biddle | |
| 8,173,893 B2 | 5/2012 | Huang | |
| 8,201,687 B2 | 6/2012 | Zeliff et al. | |
| 8,230,992 B2 | 7/2012 | Law et al. | |
| 8,235,208 B2 | 8/2012 | Sirichai et al. | |
| 8,281,950 B2 | 10/2012 | Potts et al. | |
| 8,312,991 B2 | 11/2012 | Diebel et al. | |
| 8,328,008 B2 | 12/2012 | Diebel et al. | |
| 8,467,183 B2 | 6/2013 | Probst et al. | |
| 8,573,394 B2 | 11/2013 | Ahee et al. | |
| 2001/0014010 A1 | 8/2001 | Jenks et al. | |
| 2001/0052710 A1 | 12/2001 | Witherell | |
| 2002/0179470 A1* | 12/2002 | Lee | 206/320 |
| 2003/0186729 A1 | 10/2003 | Engstrom et al. | |
| 2004/0018863 A1 | 1/2004 | Engstrom et al. | |
| 2004/0224732 A1* | 11/2004 | Lee et al. | 455/575.3 |
| 2004/0240164 A1 | 12/2004 | Lee | |
| 2005/0057893 A1 | 3/2005 | Homer et al. | |
| 2005/0237701 A1 | 10/2005 | Yu | |
| 2007/0001079 A1 | 1/2007 | Patterson, Jr. | |
| 2007/0056865 A1 | 3/2007 | Pelo | |
| 2007/0057140 A1 | 3/2007 | Liou et al. | |
| 2007/0166028 A1 | 7/2007 | Kranz et al. | |
| 2007/0279855 A1 | 12/2007 | Linsmeier et al. | |
| 2008/0043411 A1 | 2/2008 | Chih et al. | |
| 2008/0045279 A1* | 2/2008 | Ohki | 455/575.1 |
| 2008/0055835 A1 | 3/2008 | Kumano et al. | |
| 2008/0226286 A1 | 9/2008 | Huang | |
| 2008/0237432 A1 | 10/2008 | Patterson | |
| 2008/0302687 A1 | 12/2008 | Sirichai et al. | |
| 2009/0109558 A1 | 4/2009 | Schaefer | |
| 2009/0127423 A1 | 5/2009 | Chen et al. | |
| 2009/0178938 A1 | 7/2009 | Palmer | |
| 2009/0223765 A1 | 9/2009 | Bosma | |
| 2009/0223845 A1 | 9/2009 | Bosma et al. | |
| 2009/0230006 A1 | 9/2009 | Pidgley et al. | |
| 2010/0072334 A1 | 3/2010 | Le Gette et al. | |
| 2010/0082445 A1 | 4/2010 | Hodge et al. | |
| 2010/0116710 A1 | 5/2010 | Huang et al. | |
| 2010/0225429 A1 | 9/2010 | Tsai | |
| 2010/0258602 A1 | 10/2010 | Amin | |
| 2011/0034221 A1 | 2/2011 | Hung et al. | |
| 2011/0090626 A1 | 4/2011 | Hoellwarth et al. | |
| 2011/0221319 A1 | 9/2011 | Law et al. | |
| 2011/0284420 A1 | 11/2011 | Sajid | |
| 2011/0290687 A1 | 12/2011 | Han | |
| 2011/0297566 A1 | 12/2011 | Gallagher et al. | |
| 2011/0315579 A1 | 12/2011 | Mase | |
| 2012/0012483 A1 | 1/2012 | Fan | |
| 2012/0217174 A1 | 8/2012 | Ting | |
| 2013/0126365 A1 | 5/2013 | Hung | |

FOREIGN PATENT DOCUMENTS

| | | |
|---|---|---|
| EP | 2 337 373 B1 | 12/2013 |
| JP | H073344 U | 1/1995 |
| JP | 09135722 A | 5/1997 |
| JP | 2000014426 A | 1/2000 |
| JP | 2004509680 A | 4/2004 |
| WO | WO 01/90848 A2 | 11/2001 |
| WO | WO 2010/036090 A2 | 4/2010 |
| WO | WO 2011/115918 A1 | 9/2011 |
| WO | WO 2011/130157 A2 | 10/2011 |

OTHER PUBLICATIONS

Office Action for U.S. Appl. No. 13/739,846, filed Jan. 11, 2013, mailed Feb. 27, 2014, 19 pgs.
International Searching Authority, International Search Report and Written Opinion of PCT/2011/039287, filed Jun. 6, 2011, and mailed Dec. 28, 2011, 11 pgs.
International Preliminary Report on Patentability for PCT/2011/039287 filed Jun. 6, 2011, and mailed Dec. 20, 2012, 7 pgs.
Office Action for U.S. Appl. No. 12/370,824, filed Feb. 13, 2009, and mailed from the USPTO on Jan. 4, 2013, (19 pgs.).
Office Action for U.S. Appl. No. 13/171,225, filed Jun. 28, 2011, and mailed from the USPTO on Apr. 16, 2013, 24 pgs.
Office Action for U.S. Appl. No. 13/285,565, filed Oct. 31, 2011, and mailed from the USPTO on May 9, 2013, 14 pgs.
Office Action for U.S. Appl. No. 12/370,824, filed Feb. 13, 2009, and mailed from the USPTO on May 20, 2013, 22 pgs.
Office Action for U.S. Appl. No. 13/791,445, filed Mar. 8, 2013, and mailed from the USPTO on Jun. 21, 2013, 20 pgs.
Third-Party Submission for U.S. Appl. No. 13/791,445, filed Mar. 8, 2013, filed by Raymond Meiers on Jul. 31, 2013, and mailed from USPTO Aug. 5, 2013, 14 pgs. + 2 pgs. from USPTO.
Notice of Allowance and Fee(s) Due for U.S. Appl. No. 12/370,824, filed Feb. 13, 2009, and mailed from the USPTO on Sep. 9, 2013, 12 pgs.

(56) References Cited

OTHER PUBLICATIONS

Office Action for U.S. Appl. No. 13/747,992, filed Jan. 23, 2013, and mailed from the USPTO on Oct. 23, 2013, 21 pgs.
Office Action for U.S. Appl. No. 13/791,445, filed Mar. 8, 2013, and mailed from the USPTO on Oct. 23, 2013, 21 pgs.
Office Action for U.S. Appl. No. 13/171,225, filed Jun. 28, 2011, and mailed from the USPTO on Dec. 4, 2013, 17 pgs.
Notice of Allowance and Fee(s) Due for U.S. Appl. No. 29/431,992, filed Sep. 12, 2012, and mailed from the USPTO on Apr. 2, 2014, 27 pgs.

* cited by examiner

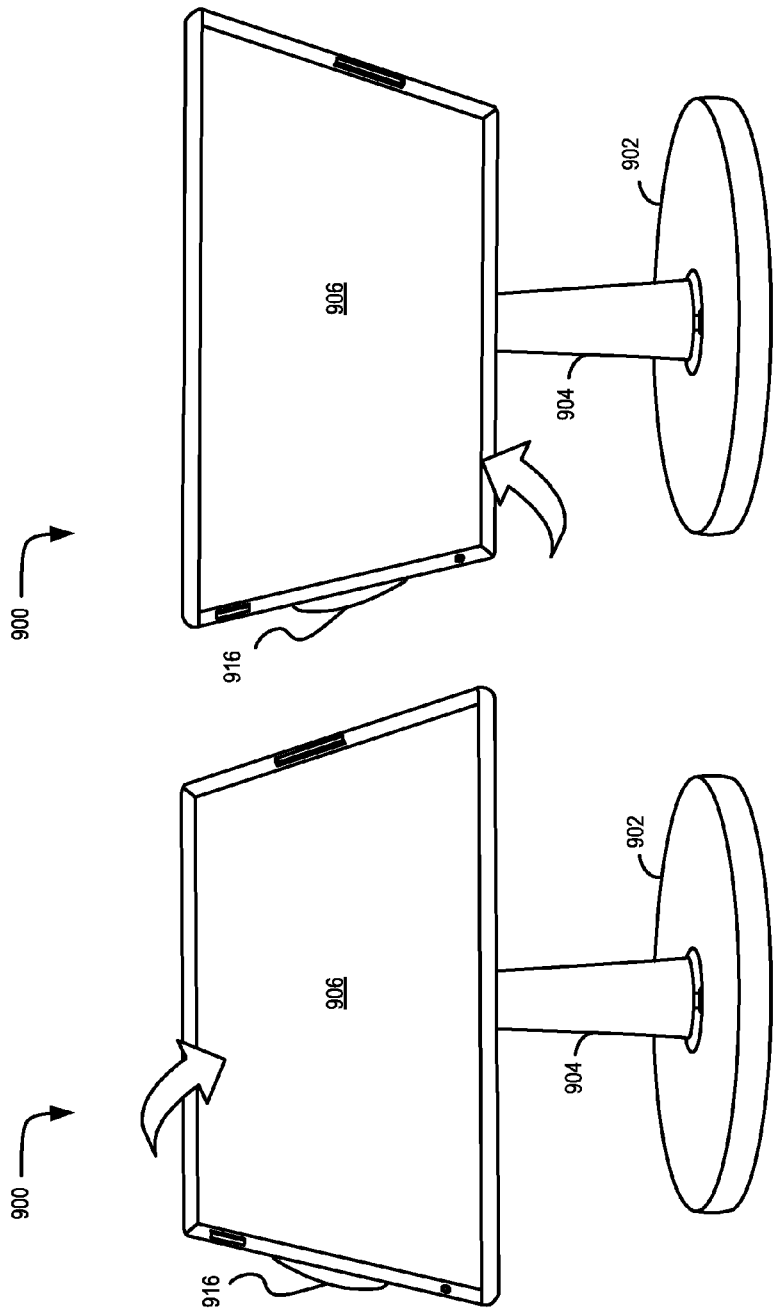

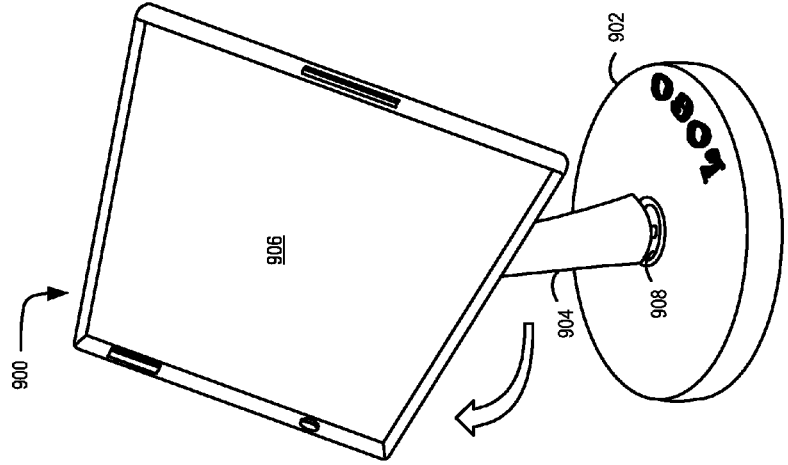
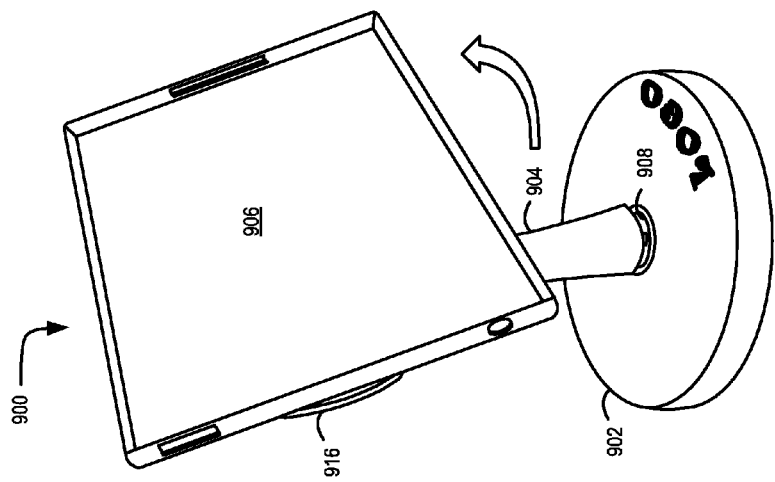

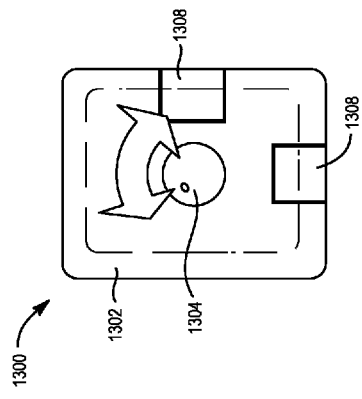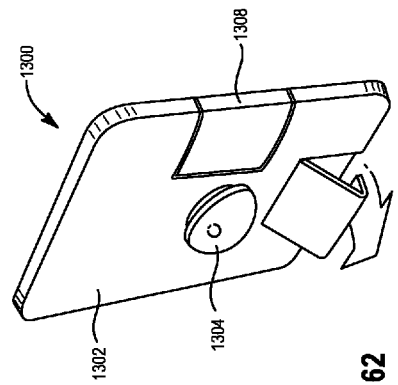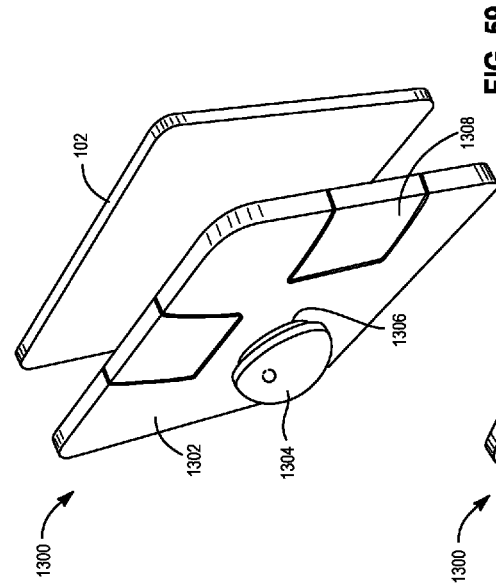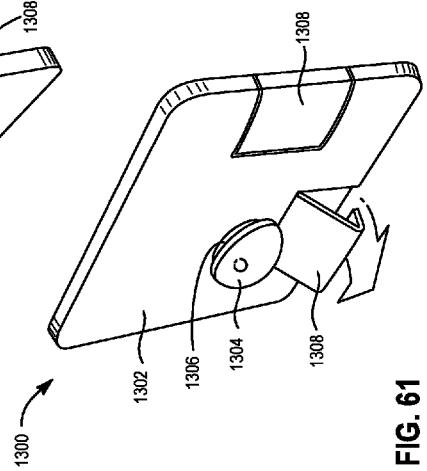

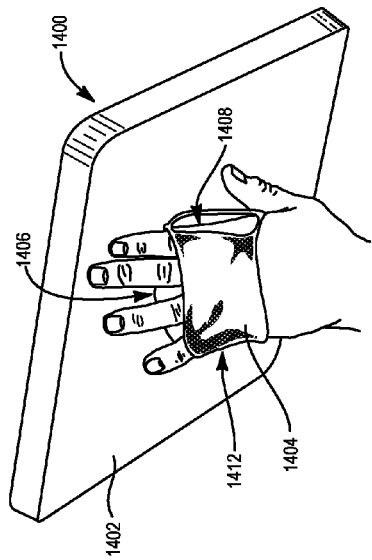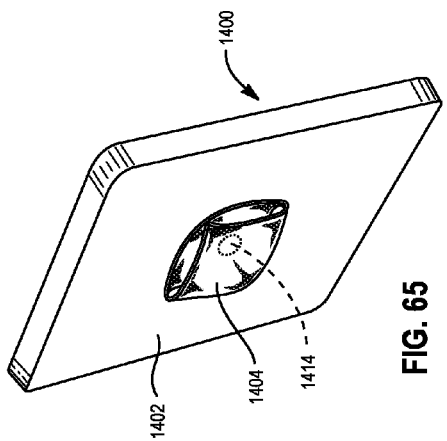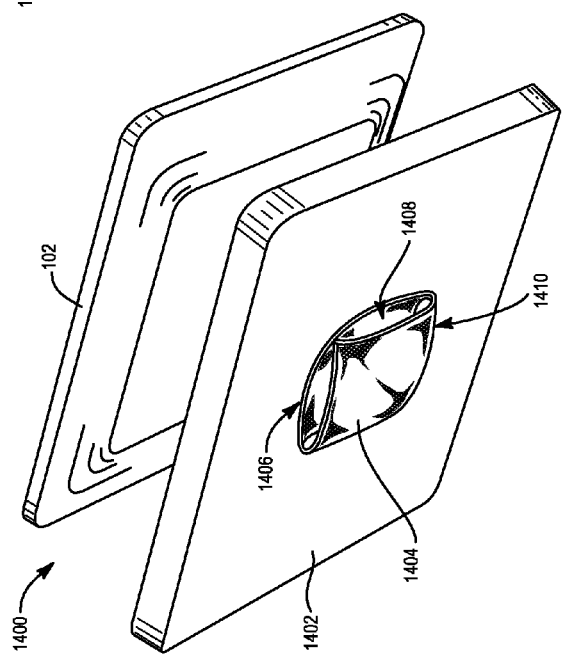

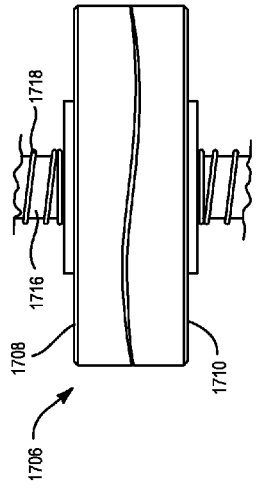
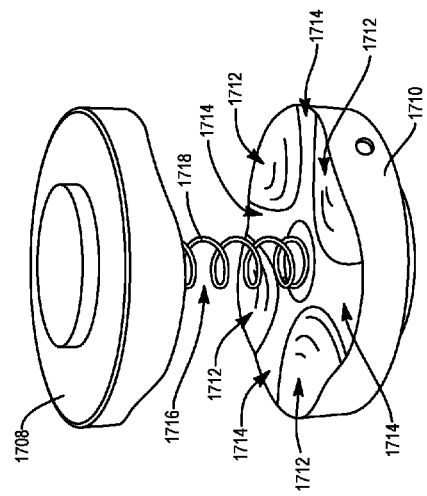
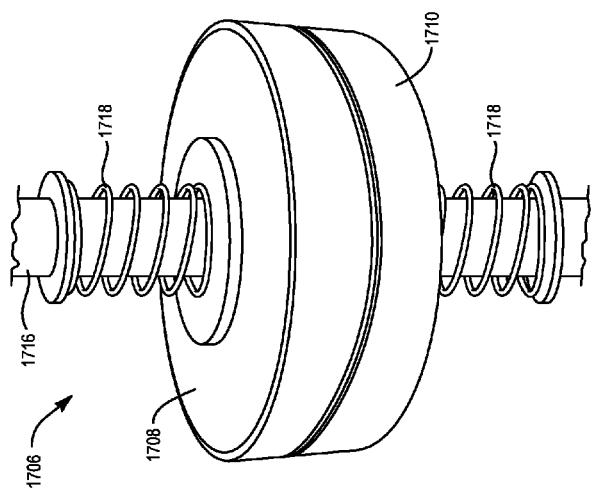

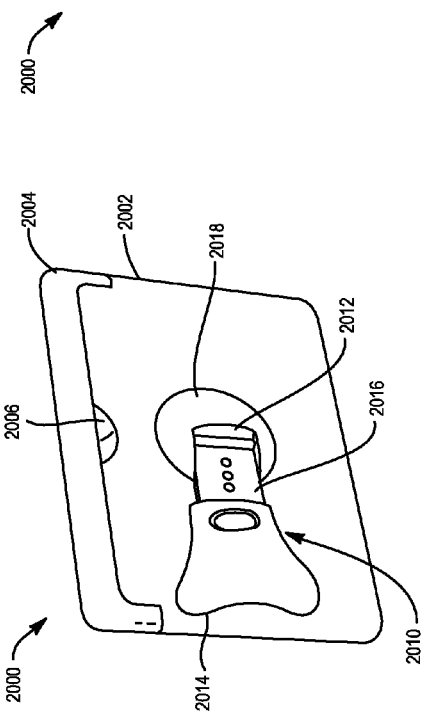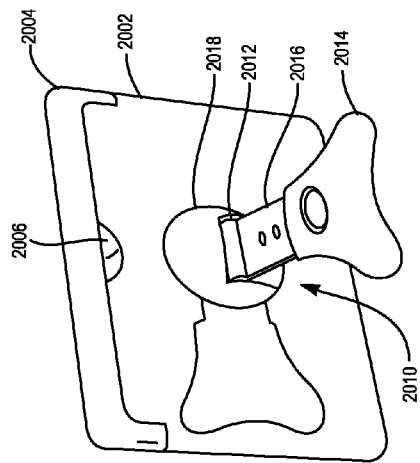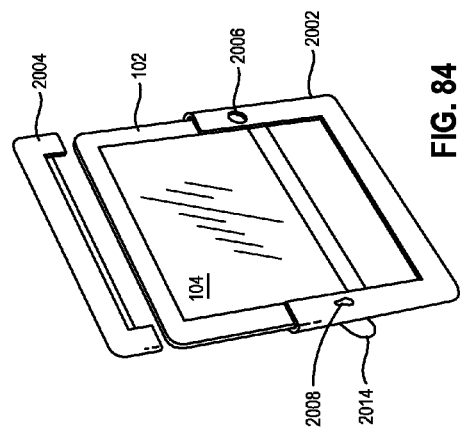

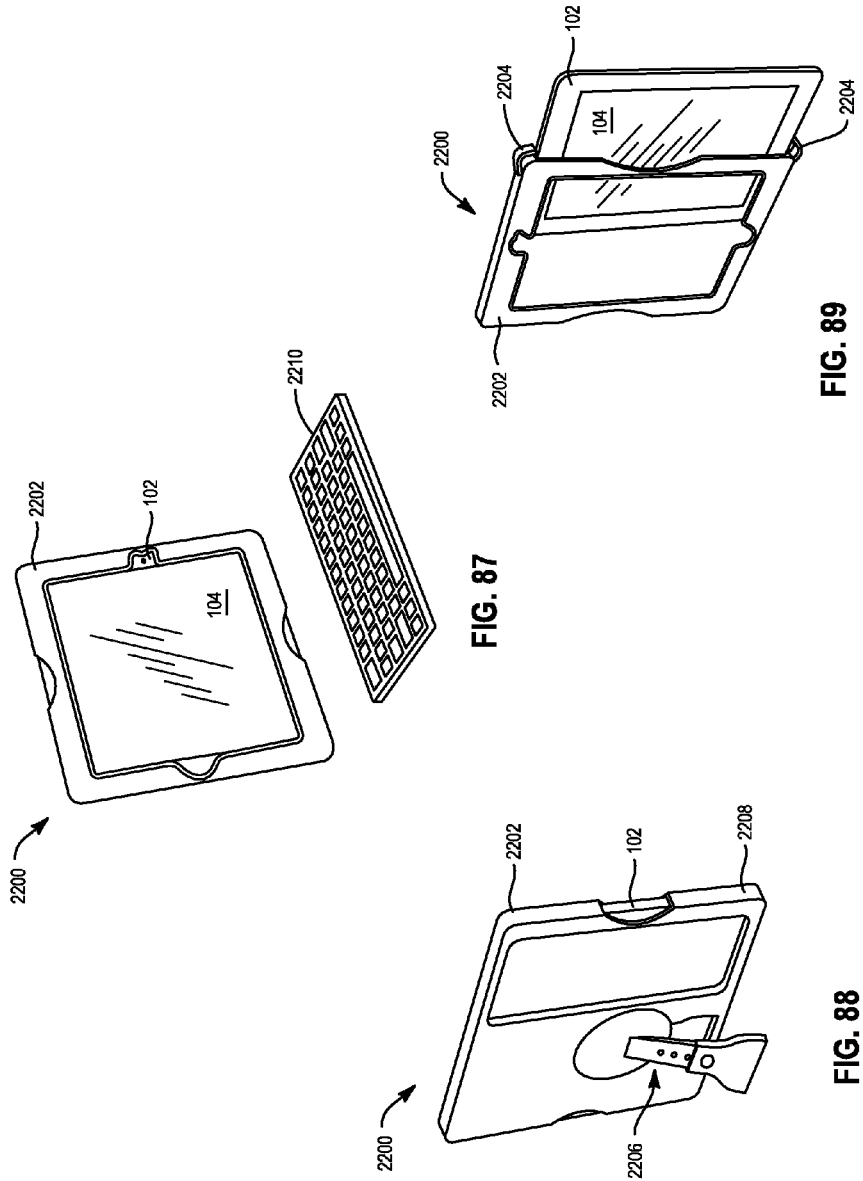

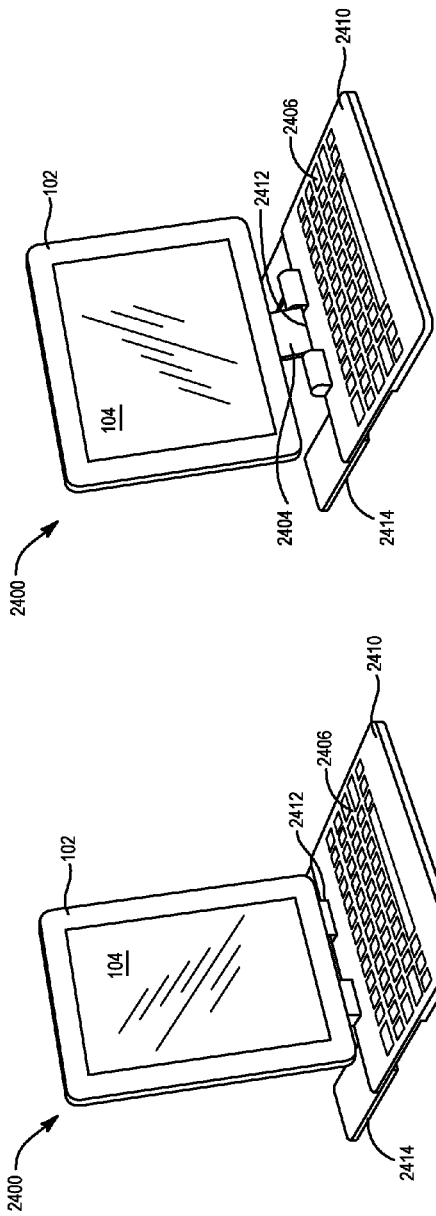

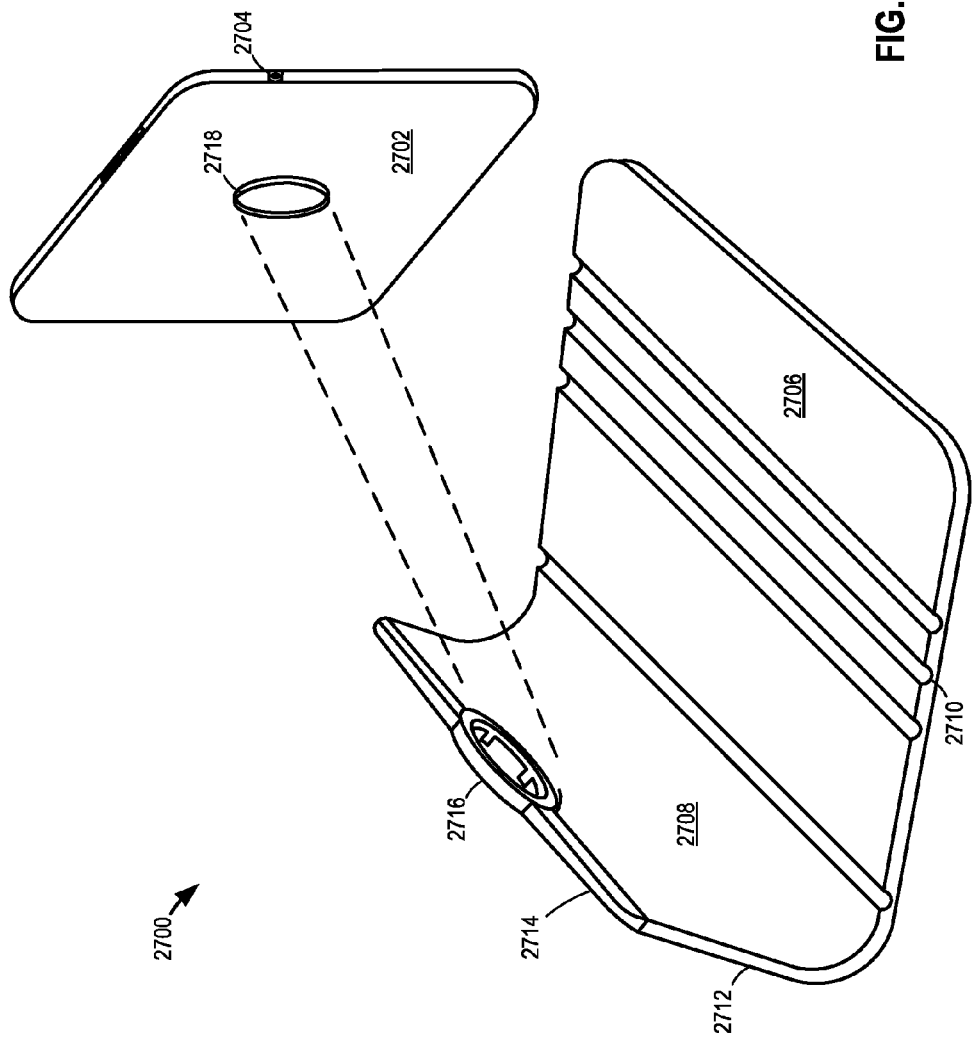

PORTABLE ELECTRONIC DEVICE CASE ACCESSORIES AND RELATED SYSTEMS AND METHODS

RELATED APPLICATIONS

This application is a continuation of and claims priority to U.S. patent application Ser. No. 13/791,445, filed Mar. 8, 2013, and entitled "PORTABLE ELECTRONIC DEVICE CASE ACCESSORIES AND RELATED SYSTEMS AND METHODS," and which in turn is a continuation of and claims priority to U.S. patent application Ser. No. 13/155,266, filed Jun. 7, 2011, and entitled "PORTABLE ELECTRONIC DEVICE CASE ACCESSORIES AND RELATED SYSTEMS AND METHODS," and which in turn claims priority to U.S. Provisional Patent Application No. 61/352,286, filed Jun. 7, 2010, and entitled "ELECTRONIC READER CASES AND RELATED SYSTEMS AND METHODS," U.S. Provisional Patent Application No. 61/368,047, filed Jul. 27, 2010, and entitled "HOLDER FOR AN ELECTRONIC DEVICE," and U.S. Provisional Patent Application No. 61/421,431, filed Dec. 9, 2010, and entitled "ROTATABLE CASE FOR PORTABLE ELECTRONIC DEVICE," all of which are herein incorporated by reference in their entireties.

TECHNICAL FIELD

The present disclosure relates generally to portable electronic devices and, more specifically, to case accessories for portable electronic devices.

BRIEF DESCRIPTION OF THE DRAWINGS

The written disclosure herein describes illustrative embodiments that are non-limiting and non-exhaustive. Reference is made to certain of such illustrative embodiments that are depicted in the figures, in which:

FIG. 43 illustrates a multi-pivot stand including a case configured to vertically pivot about an upper connection member consistent with embodiments of the present disclosure;

FIG. 44 illustrates another view of the multi-pivot stand illustrated in FIG. 43 consistent with embodiments of the present disclosure;

FIG. 45 illustrates a multi-pivot stand including a case configured to horizontally pivot about an upper connection member consistent with embodiments of the present disclosure;

FIG. 46 illustrates another view of the multi-pivot stand illustrated in FIG. 45 consistent with embodiments of the present disclosure;

FIG. 59 illustrates a rotatable holder for a portable electronic device in a handheld configuration consistent with embodiments of the present disclosure;

FIG. 60 illustrates another view of the rotatable holder illustrated in FIG. 59 consistent with embodiments of the present disclosure;

FIG. 61 illustrates a component view of the rotatable holder illustrated in FIG. 59 consistent with embodiments of the present disclosure;

FIG. 62 illustrates another view of the rotatable holder illustrated in FIG. 59 consistent with embodiments of the present disclosure;

FIG. 63 illustrates a handheld holder for a portable electronic device consistent with embodiments of the present disclosure;

FIG. 64 illustrates another view of the handheld holder illustrated in FIG. 63 consistent with embodiments of the present disclosure;

FIG. 65 illustrates another view of the handheld holder illustrated in FIG. 63 consistent with embodiments of the present disclosure;

FIG. 71 illustrates a rotatable coupling mechanism consistent with embodiments of the present disclosure;

FIG. 72 illustrates another view of the rotatable coupling mechanism illustrated in FIG. 71 consistent with embodiments of the present disclosure;

FIG. 73 illustrates another view of the rotatable coupling mechanism illustrated in FIG. 71 consistent with embodiments of the present disclosure;

FIG. 82 illustrates a rotatable support for a portable electronic device consistent with embodiments of the present disclosure;

FIG. 83 illustrates the rotatable support illustrated in FIG. 82 configured in a landscape orientation consistent with embodiments of the present disclosure;

FIG. 84 illustrates another view of the rotatable support illustrated in FIG. 82 consistent with embodiments of the present disclosure;

FIG. 87 illustrates a support for a portable electronic device consistent with embodiments of the present disclosure;

FIG. 88 illustrates a rear perspective view of the support illustrated in FIG. 87 consistent with embodiments of the present disclosure;

FIG. 89 illustrates the support illustrated in FIG. 87 receiving a portable electronic device consistent with embodiments of the present disclosure;

FIG. 92 illustrates a rotatable case for a portable electronic device including an integrated keyboard oriented in a portrait configuration consistent with embodiments of the present disclosure;

FIG. 93 illustrates the rotatable case illustrated in FIG. 92 oriented in a landscape configuration consistent with embodiments of the present disclosure;

FIG. 94 illustrates the rotatable case illustrated in FIG. 92 configured in a stowage mode consistent with embodiments of the present disclosure;

FIG. 95 illustrates a rear perspective view of the rotatable case illustrated in FIG. 92 consistent with embodiments of the present disclosure;

FIG. 103 illustrates an interaction between a support panel of a rotatable case for a portable electronic device and a securing panel via a selectively detachable rotational mechanism consistent with embodiments of the present disclosure;

DETAILED DESCRIPTION

Figure 1:
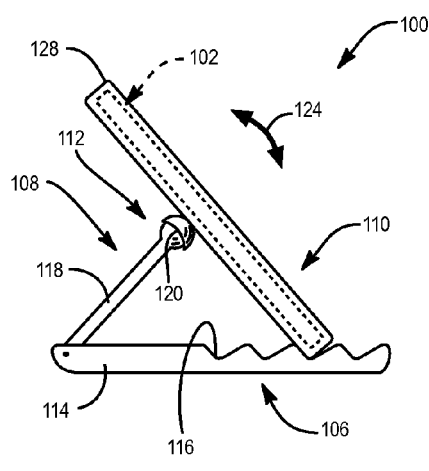
FIG. 1 illustrates a case for a portable electronic device oriented in a portrait viewing mode consistent with embodiments of the present disclosure.

The proliferation of portable electronic devices (PEDs), including notebook and tablet computers (e.g., the Apple® iPad™), portable digital assistants (PDAs), and smartphones, has placed more computing power into the hands of users than the computing power of early computers that occupied an entire room. This portable computing power has enhanced both personal and business mobile productivity. Due to their portability, however, PEDs may be susceptible to damage. In addition, PEDs may allow for viewing in a variety of orientations (e.g., portrait and/or landscape), but may not be configured to be easily used in multiple orientations.

Embodiments of the present disclosure provide an accessory case for a PED configured to protect the PED from damage. In some embodiments, the accessory case may be configured to enclose the PED and rotatably support the PED in at least two orientations. In various embodiments, the case may be configured to enclose and protect the PED in a closed position and support the PED upright and/or elevated (i.e., propped up) in an open position.

Embodiments may be best understood by reference to the drawings. In certain instances, like features may be designated with like reference numerals. It will be readily understood that the components of the present disclosure, as generally described and illustrated in the drawings herein, could be arranged and designed in a wide variety of different configurations. Thus, the following more detailed description of the embodiments of the apparatus is not intended to limit the scope of the disclosure, but is merely representative of possible embodiments of the disclosure. In some cases, well-known structures, materials, or operations are not shown or described in detail.

FIGS. 1-4 illustrate a case 100 for a PED 102 that can be used to assist in viewing the PED 102. The illustrated case 100 may be referred to as a holder, sleeve, mount, and the like and, as used herein, does not necessarily imply an encasing or retaining functionality, although some embodiments of the case 100 may have such functionalities. The PED 102 may be any portable electronic device including, for example, a notebook computer, an electronic book reader (e.g., the Amazon® Kindle™), a smartphone (e.g., the Apple® iPhone™, the Motorola® Droid®, and the BlackBerry® Storm™), and/or a tablet computer (e.g., the Apple® iPad™, the HP® Slate, and the Samsung® Galaxy™ Tablet).

The case 100 can be configured to receive a PED 102, and may further function to retain, carry, and protect the PED 102. The PED 102 can include on the front and/or the back face of the PED 102 a display 104 that is viewable in either a portrait orientation or a landscape orientation, a user input (not shown), and a data input/output port (not shown). In some embodiments, the case 100 may be configured such that the display 104, user input, and data input/output port are accessible by a user of the PED 102 while the PED 102 is disposed in the case 100. Further, in some embodiments, the case 100 may include a protective display disposed over the display 104.

The case 100 can assist a user in viewing the PED 102 when the display 104 is functioning in either the portrait or landscape orientation. This can be particularly advantageous, as users of a PED 102 may desire to alternate between using the PED 102 in the portrait and landscape orientations. Moreover, some users may prefer to use a PED 102 exclusively in either the portrait mode or the landscape mode. Since either group of users could use the case 100 effectively, the case 100 can advantageously serve to reduce sellers' inventories.

The case 100 may include a base 106, a support member 108, and a holder 110. The support member 108 and the holder 110 may be attached to each other at a rotatable connector 112. In the illustrated embodiment, the base 106 includes a platform 114 that can rest on a planar or substantially planar working surface, such as a floor or table top. The base 106 may define a series of channels 116 at a front end thereof. The support member 108 may include a post 118 that is fixedly secured to the platform 114. For example, the post 118 and the platform 114 may be integrally molded from a single piece of material (e.g., plastic), or they may be fixedly secured to each other in any other suitable manner. The illustrated post 118 thus may not be rotatable relative to the platform 114.

The rotatable connector 112 or rotational mechanism may be located at an upper end of the post 118. The connector may include a ball-and-socket joint 120, which permits rotation about three mutually perpendicular axes. Stated otherwise, the ball-and-socket joint 120 may permit the holder 110 to rotate about an axis defined by the post 118 (as indicated at the double-headed arrow 122), and also permit the holder 110 to rotate about two mutually orthogonal axes that are each perpendicular to the axis defined by the post 118 (as indicated at the double-headed arrows 122 and 124).

The holder 110 may be configured to grip or otherwise secure the PED 102. In certain embodiments, the holder 110 may include a sleeve 128, which may also be referred to as a pocket or a pouch, that is configured to retain therein the PED 102. For example, the sleeve 128 may comprise a resilient material that can selectively expand so as to receive the PED 102 through a front opening and resiliently close about an outer edge of the PED 102. The holder 110 and/or sleeve 128 may also be configured to substantially cover the entirety of a back face of the PED 102. In some embodiments, the holder 110 and/or sleeve 128 may comprise a rubber or other elastomeric material (e.g., silicone) configured to provide a secure friction fit around the perimeter of the PED 102 to secure the holder 110 and/or sleeve 128 around the PED 102. The holder 110 and/or sleeve 128 may also comprise rigid materials (e.g., plastic, metal, and the like) and include a rigid frame. In some embodiments, the holder 110 and/or sleeve 128 may comprise releasable clips, straps, or other locking features that allow for the PED 102 to be selectively locked into the holder 110 and selectively released from the holder 110.

Figure 2:
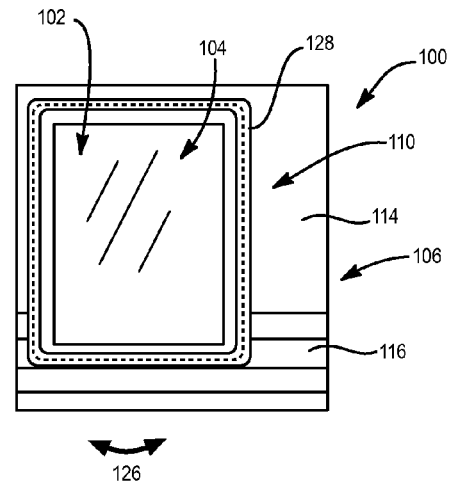
FIG. 2 illustrates a top perspective view of the case illustrated in FIG. 1 consistent with embodiments of the present disclosure.
Figure 3:
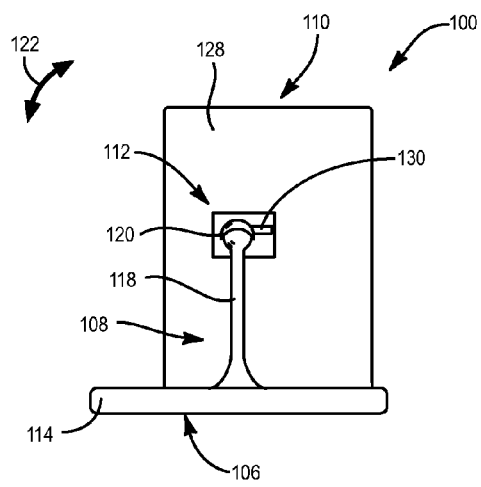
FIG. 3 illustrates a rear elevation view of the case illustrated in FIG. 1 consistent with embodiments of the present disclosure.

FIGS. 1-3 illustrate the case 100 in a portrait orientation which can assist a user in viewing a PED 102 when the display 104 is oriented in a landscape mode. The holder 110 can be rotated about one axis (shown by the arrow 124) so as to adjust a pitch of the PED 102. A bottom edge of the holder 110 thus can be situated in any of the channels 116. As shown in FIG. 2, the channels 116 may be substantially linear, such that rotation about another axis (shown by the arrow 126) may be restricted when the bottom edge of the holder 110 is situated within a channel 116.

Figure 4:
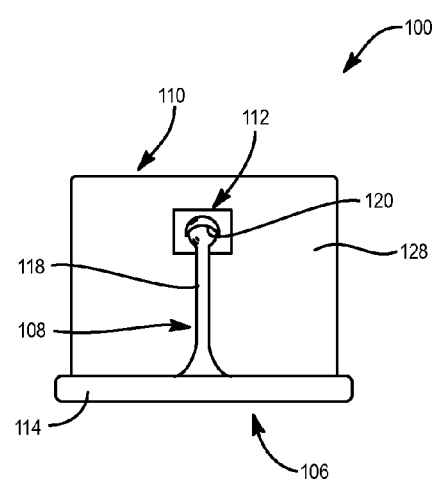
FIG. 4 illustrates a rear elevation view of the case illustrated in FIG. 1 wherein the case is oriented in a landscape viewing mode consistent with embodiments of the present disclosure.

As illustrated in FIGS. 3-4, the holder 110 can be rotated in another direction (shown by the arrow 122) so as to transition the case 100 from a portrait orientation to a landscape orientation. In the illustrated embodiment, the ball-and-socket joint 120 may be off-center relative to a width of the holder 110 and centered relative to a height of the holder 110 ("width" and "height" referring to the portrait orientation) such that a height of that portion of the holder 100 which is below the ball-and-socket joint 120 is the same or substantially similar when the holder 110 is in either of the portrait and landscape orientations. As a result, a bottom edge of the holder 110 can seat equally well in any of the channels 116 in either orientation. In such an arrangement, the holder 110 may be off-center relative to the base 106 when it is in the portrait orientation and centered relative to the base 106 in the landscape orientation.

In other embodiments, the ball-and-socket joint 120 may be centered relative to both the width and height of the holder 110. As the support member 108 may be fixed relative to the base 106, this may result in a different interaction between the bottom edge of the holder 110 and the channels 116 when the PED 102 is in the portrait and landscape orientations. For example, some channels 116 may be accessible in one orientation, but inaccessible in another. In some embodiments, the connector 112 can include a slide 130 or other suitable feature in addition to the ball-and-socket joint 120 so as to permit centering of the holder 110.

Other arrangements than those specifically described with respect to the embodiments illustrated in FIGS. 1-4 are contemplated. For example, in some embodiments, the base 106 may not include a platform 114 that is solid between its outer edges. In other or further embodiments, the support member 108 may be substantially wider than the post 118. In other or further embodiments, the holder 110 may not secure the PED 102 therein, but the PED 102 may rest on the holder 110. Moreover, for embodiments in which the PED 102 is secured to the holder 110, any suitable connectors, straps, holders, or other devices may be used to secure the PED 102 to the holder 110. In some embodiments, the holder 110 may include a clear protective sheet (e.g., a sheet of plastic) that covers a display 104 of the PED 110. The holder 110 may include an opening at a side or top edge thereof through which the PED 102 may be introduced into the holder 110. In still other or further embodiments, the rotatable connector 112 may not include a ball-and-socket joint 120, but instead may include another suitable connection system that permits rotation about at least two mutually orthogonal axes. In some embodiments, the ball-and-socket joint 120 may be self-tensioning, and in further embodiments, the channels 116 are not used. In embodiments where the channels 116 are not used, the bottom edge of the holder 110 may be secured to the base 106 using alternative suitable connectors including, for example, straps, snaps, hook and loop fasteners, and the like.

FIGS. 5-10 illustrate another case 200 for a PED 102 that can be used to assist in viewing a PED 102. In certain embodiments, case 200 may include similar features to case 100 illustrated in FIGS. 1-4. Accordingly, like features may be designated in certain instances, but not all, with like reference numerals. Relevant disclosure set forth above regarding similarly identified features also may not be repeated hereafter. Moreover, specific features of the case 100 illustrated in FIGS. 1-4 may not be shown or identified by reference numerals in the drawings or specifically discussed in the written description that follows. However, such features may clearly be the same, or substantially the same, as features depicted in other embodiments and/or described with respect to such embodiments. Accordingly, the relevant descriptions of such features apply equally to the features of the case 200. Any suitable combination of the features and variations of the same described with respect to the case 100 can be employed with the case 200, and vice versa. This pattern of disclosure applies equally to further embodiments depicted in subsequent figures and described hereafter.

Figure 5:
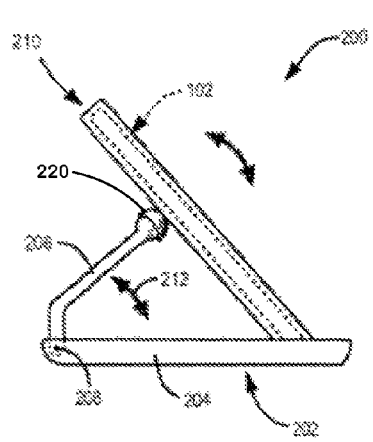
FIG. 5 illustrates another case for a portable electronic device configured in an open position and oriented in a portrait viewing mode consistent with embodiments of the present disclosure.
Figure 7:
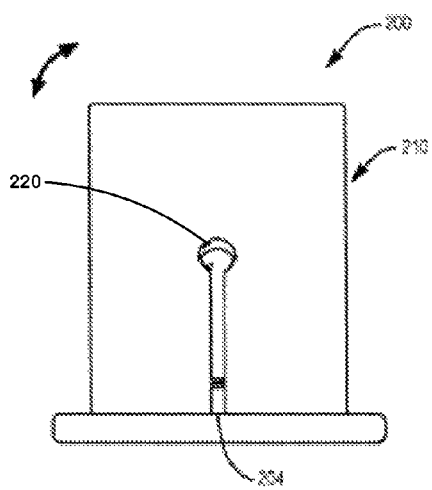
FIG. 7 illustrates a rear elevation view of the case illustrated in FIG. 5 consistent with embodiments of the present disclosure.
Figure 8:
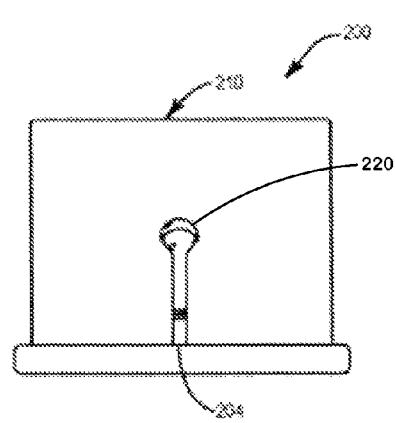
FIG. 8 illustrates a rear elevation view of the case illustrated in FIG. 5 configured in an open position and oriented in a landscape viewing mode consistent with embodiments of the present disclosure.

As illustrated in FIG. 5, the case 200 may include a base 202 that comprises a display cover 204 that in certain configurations, may function as a platform. The case 200 may further include a post 206 that is attached to the display cover 204 at a hinge 208. The hinge 208 can provide the base 202 with one or more additional degrees of freedom in adjusting a viewing position of a holder 210, as indicated by the double arrow 212. This may also facilitate centering of the holder 210 in either a portrait or landscape orientation, as shown in FIG. 7 and FIG. 8. Similar to the case 100, the case 200 includes a rotational mechanism 220, such as a ball-and-socket joint 220, to provide rotational movement of the holder 210.

Figure 6:
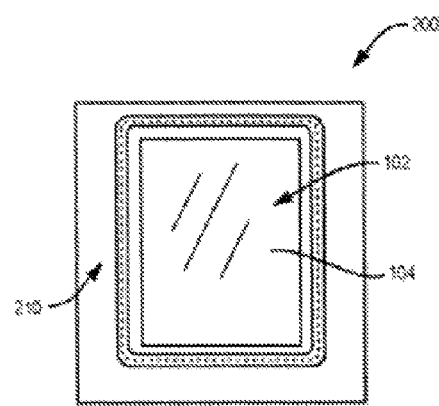
FIG. 6 illustrates a top perspective view of the case illustrated in FIG. 5 consistent with embodiments of the present disclosure.
Figure 9:
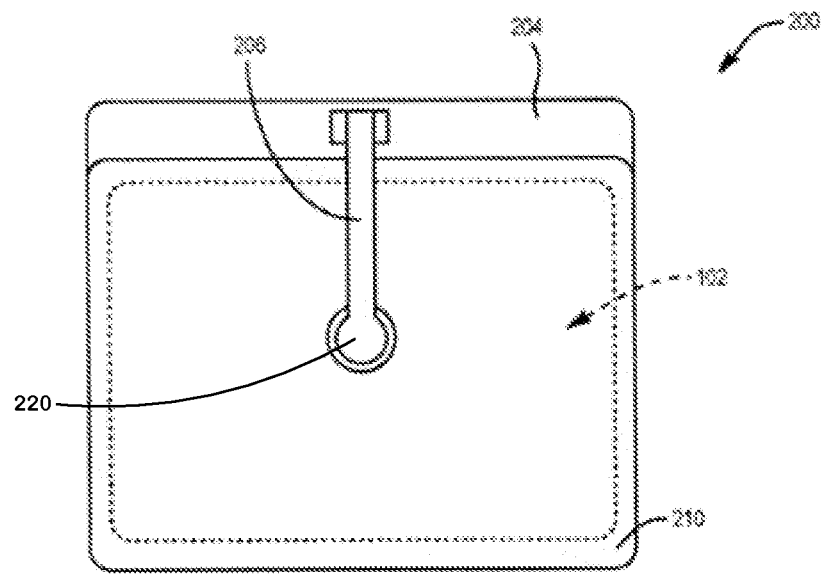
FIG. 9 illustrates a top perspective view of the case illustrated in FIG. 5 configured in a closed position consistent with embodiments of the present disclosure.
Figure 10:
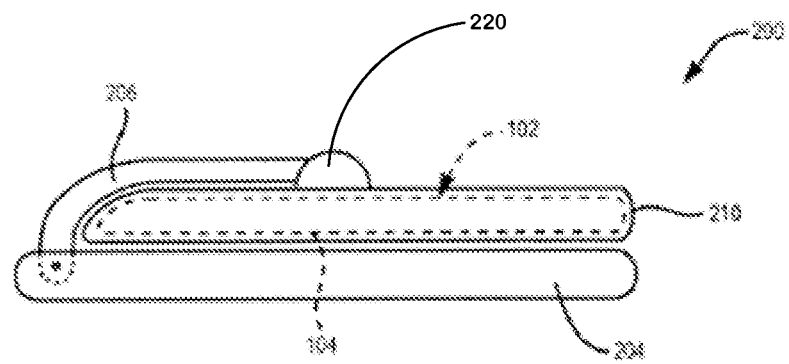
FIG. 10 illustrates a side elevation view of the case illustrated in FIG. 5 configured in a closed position consistent with embodiments of the present disclosure.

In certain embodiments, the case 200 can transition between various open orientations, as shown in FIGS. 5-7 (i.e., open, portrait) and FIG. 8 (i.e., open, landscape), and a closed orientation, as shown in FIGS. 9-10. In the illustrated embodiment, the case 200 is in the landscape orientation when it is closed. When the case 200 is closed, the holder 210 can encase a periphery and back face of the PED 102, and the display cover 204 can cover a front face of the PED 102, which include a display 104. The post 206 may be bent to facilitate alignment of the holder 210 and the display cover 204.

Figure 11:
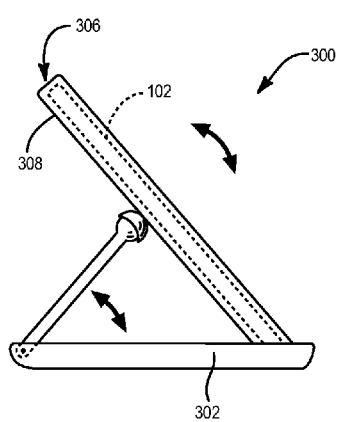
FIG. 11 illustrates another case for a portable electronic device oriented in a portrait viewing mode consistent with embodiments of the present disclosure.
Figure 12:
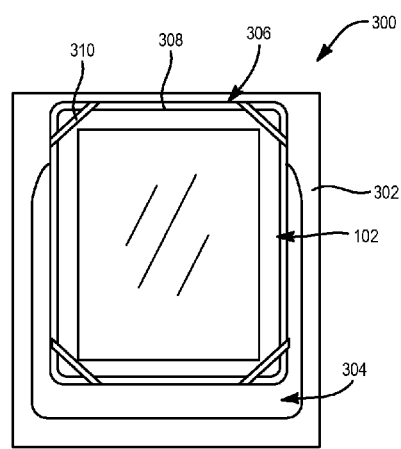
FIG. 12 illustrates a top perspective view of the case illustrated in FIG. 11 consistent with embodiments of the present disclosure.

FIGS. 11-12 illustrate another case 300 for a PED 102 that can be used to assist in viewing the PED 102. In certain embodiments, the case 300 can include a platform 302 that defines an opening 304. In some embodiments, the opening 304 may be sufficiently large to receive a lower edge of a holder 306 therein in either a landscape or portrait orientation. The holder 306 can include a support wall 308 and one or more connectors 310, such as resilient straps, that may be configured to hold the PED 102 against the support wall 308.

Figure 13:
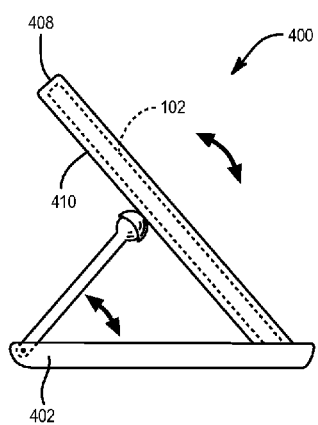
FIG. 13 illustrates another case for a portable electronic device oriented in a portrait viewing mode consistent with embodiments of the present disclosure.
Figure 14:
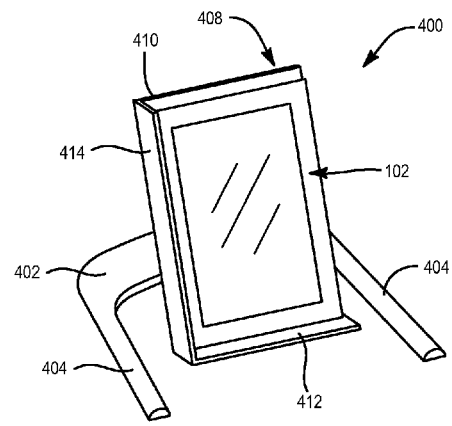
FIG. 14 illustrates a perspective view of the case illustrated in FIG. 13 consistent with embodiments of the present disclosure.

FIGS. 13-14 illustrate another case 400 for a PED 102 that can be used to assist in viewing the PED 102. In certain embodiments, the case 400 can include a platform 402 that defines two support legs 404 and a holder 408. The holder 408 can include a support wall 410 and two or more rests 412, 414 that extend from the support wall 410. The PED 102 can rest against the support wall 410 and rest 412 when the holder 408 is configured for portrait orientation viewing, and can rest against the support wall 410 and rest 414 when the holder 408 is configured for landscape orientation viewing. In some embodiments, the PED 102 may not be physically secured to the holder 408.

Figure 15:
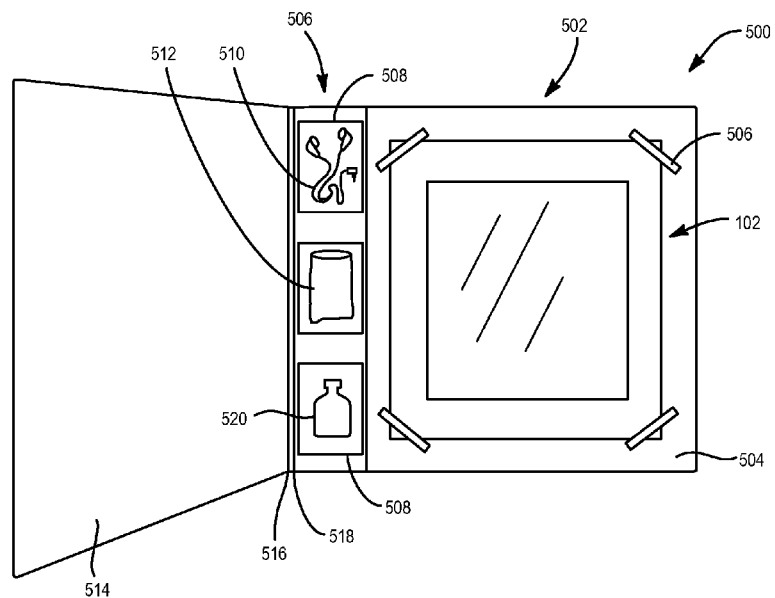
FIG. 15 illustrates another case for a portable electronic device configured in an open position consistent with embodiments of the present disclosure.
Figure 16:
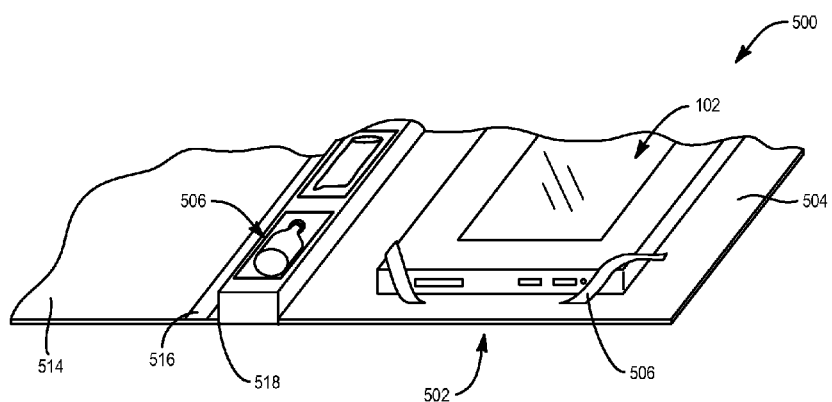
FIG. 16 illustrates an isometric view of a portion of the case illustrated in FIG. 15 consistent with embodiments of the present disclosure.

FIGS. 15-16 illustrate a case 500 configured to store items in addition to a PED 102. The case 500 may include a holder 502 such as the holders described above. The holder 502 can comprise a back cover 504 and one or more connectors 506, which can resemble the connectors described above. Other methods and devices for securing the PED 102 to the back cover 504 are also possible, including those discussed herein with respect to other embodiments. The back cover 504 can cover at least a portion of a rear face of the PED 102.

In some embodiments, the back cover 504 may include a storage region 506, which can be configured to store one or more accessories. For example, the storage region 506 can include one or more storage compartments 508, which can receive one or more accessories therein. The accessories may be associated with the PED 102, such as earphones (e.g., earbuds) 510, a cleaning cloth 512, cleaning solution 520, cords (e.g., power cords), styluses, or the like. More or fewer compartments 508 than those shown in FIG. 15 may be used, and the compartments 508 may be of larger or smaller dimensions. Further, one or more accessories may be secured to the back cover 504 using other mechanical connection mechanisms including, for example, elastic straps.

As illustrated in FIGS. 15-16, the compartments 508 can be box-shaped, and may function as bins. The compartments 508 may have hinged or removable covers for ready access to the contents thereof. The illustrated compartments 508 can define a depth that is about the same or slightly greater than a thickness of the PED 102. Accordingly, in the illustrated embodiment, a front cover 514 can be oriented substantially parallel to the back cover 504 when the case 500 is closed. In other embodiments, one or more of the compartments 508 may be shaped as sleeves or pouches. The sleeves may be sealable, such as via snaps, buttons, hook and pile fastener, or the like. In still other embodiments, one or more of the compartments 508 may be shaped as loops or elongated sleeves, which may be particularly suitable for receiving writing implements (e.g., pens, pencils, styluses) therein.

The front cover 514 may be connected to the back cover 504 in any suitable manner, such as via one or more hinges 516, 518. In the illustrated embodiment, two hinges 516, 518 are present. A first hinge 518 may be positioned adjacent to a base of the storage region 506, and a second hinge 516 may be spaced from the first hinge 518 such that when the case 500 is closed, the second hinge 516 is positioned adjacent to an upper face of the storage region 506. Such an arrangement can aid in aligning the front and back covers 514, 504 in a parallel configuration. In other embodiments, a single hinge can instead be used, which may be positioned at the upper face of the storage region 506.

Other arrangements than those specifically described with respect to the embodiments illustrated in FIGS. 15-16 are contemplated. For example, in some embodiments, the storage region 506 is positioned on the front cover 514, or portions thereof are positioned on each of the front and back covers 514, 504. In some embodiments, the storage region 506 may be positioned at an outer side edge of one or more of the covers 504, 514, and in still other or further embodiments, the storage region 506 may be positioned along a top and/or bottom edge of one or more of the covers 504, 514.

Figure 17:
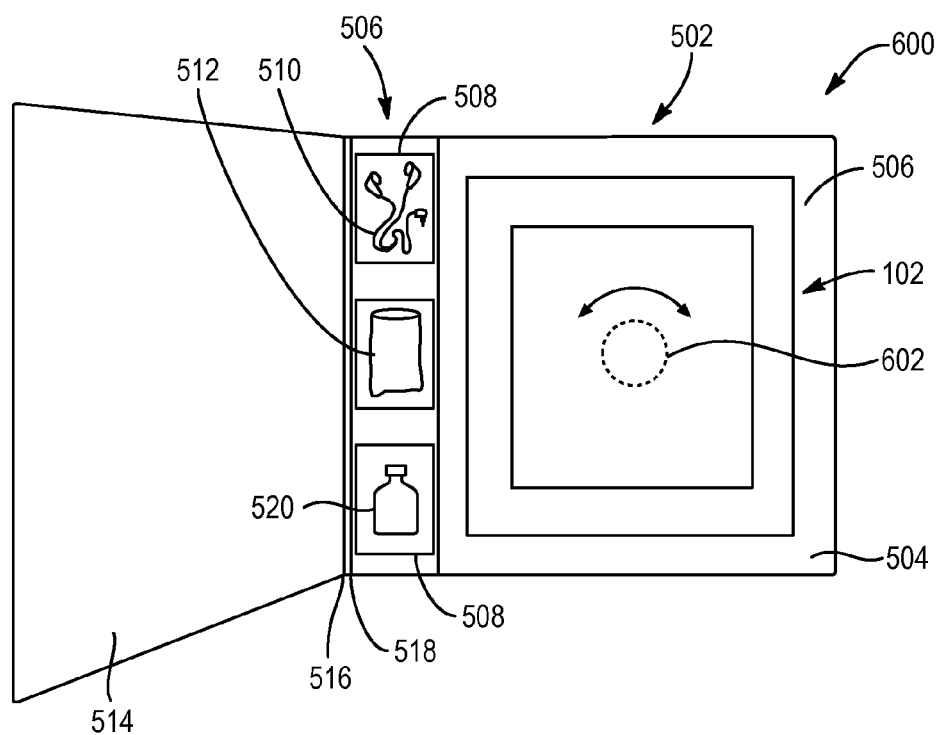
FIG. 17 illustrates a rotatable case for a portable electronic device configured in an open position consistent with embodiments of the present disclosure.

FIG. 17 illustrates a rotatable case 600 for a PED 102 configured in an open position. In certain embodiments, the rotatable case 600 may include similar features to the case 500 illustrated in FIGS. 15-16 and/or any combination of the various features and embodiments described in any of the cases and/or holders described herein.

In certain embodiments, the rotatable case 600 may include a rotational mechanism 602 coupling the PED 102 to the holder 502, the back cover 504, and/or via another PED securement mechanism allowing for variable rotation of the PED 102 relative to the rotatable case 600. For example, as illustrated in FIG. 17, the rotational mechanism 602 may include a rotational grommet coupling the PED 102 to the holder 502, the back cover 504, and/or via another PED securement mechanism allowing for variable rotation of the PED 102 relative to the rotatable case 600. In other embodiments, the rotational mechanism 602 may include a ratcheting swivel or pivot, a ball and socket mechanism, a temporary adhesive, a releasable latch, a clip, one or more buttons, a suction cup, and/or one or more straps allowing for rotational securement. In certain embodiments, the rotational mechanism 602 may snap into certain specific rotational orientations (e.g., portrait orientation and/or landscape orientation) and require rotational force to move to a different specific orientation. In alternative embodiments, the rotation mechanism 602 may not snap into specific orientations but may allow for rotational articulation in any number of orientations.

FIGS. 18-21 illustrate another case 700 for a PED 102 that can be used to assist in viewing a PED 102. In certain embodiments, case 700 may include similar features to case 100 illustrated in FIGS. 1-4, case 200 illustrated in FIGS. 5-10, and/or any combination of the various features and embodiments described in any of the cases and/or holders described herein.

Figure 18:
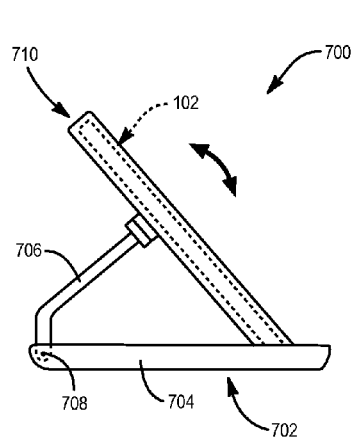
FIG. 18 illustrates another case for a portable electronic device configured in an open position and oriented in a portrait viewing mode consistent with embodiments of the present disclosure.
Figure 19:
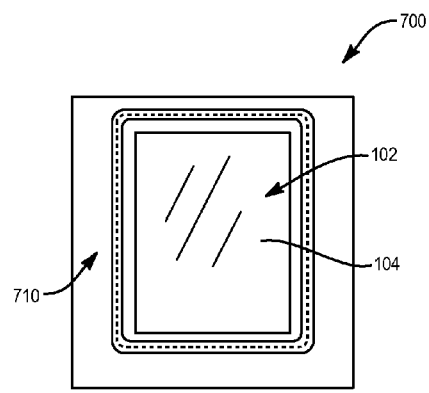
FIG. 19 illustrates a top perspective view of the case illustrated in FIG. 18 consistent with embodiments of the present disclosure.
Figure 20:
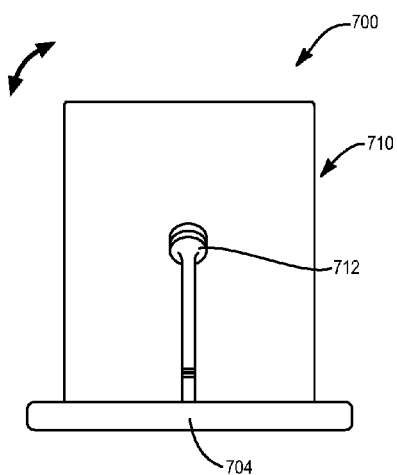
FIG. 20 illustrates a rear elevation view of the case illustrated in FIG. 18 consistent with embodiments of the present disclosure.
Figure 21:
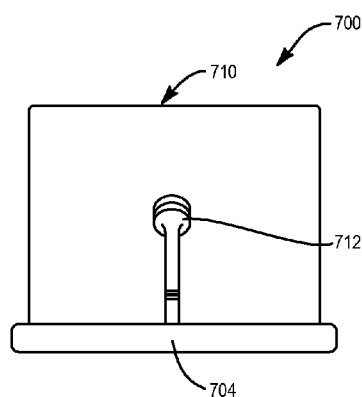
FIG. 21 illustrates a rear elevation view of the case illustrated in FIG. 18 configured in an open position and oriented in a landscape viewing mode consistent with embodiments of the present disclosure.

As illustrated in FIG. 18, the case 700 may include a base 702 that comprises a display cover 704 that in certain configurations, may function as a platform. The case 700 may further include a post 706 that is attached to the display cover 704 at a hinge 708. The hinge 708 can provide the base 702 with one or more additional degrees of freedom in adjusting a viewing position of a holder 710. This may also facilitate centering of the holder 710 in either a portrait or landscape orientation, as shown respectively in FIG. 20 and FIG. 21.

In certain embodiments, the case 700 may include a rotational grommet 712 coupling the PED 102 and/or the holder 710 to the post 706 allowing for variable rotation of the PED 102 and/or the holder 710 relative to the post 706 in one or more directions. In certain embodiments, the rotational grommet 712 may snap into certain specific rotational orientations (e.g., portrait orientation and/or landscape orientation) and require rotational force to move to a different specific orientation. In alternative embodiments, the rotational grommet 712 may not snap into specific orientations but may allow for rotational articulation in any number of orientations.

Figure 22:
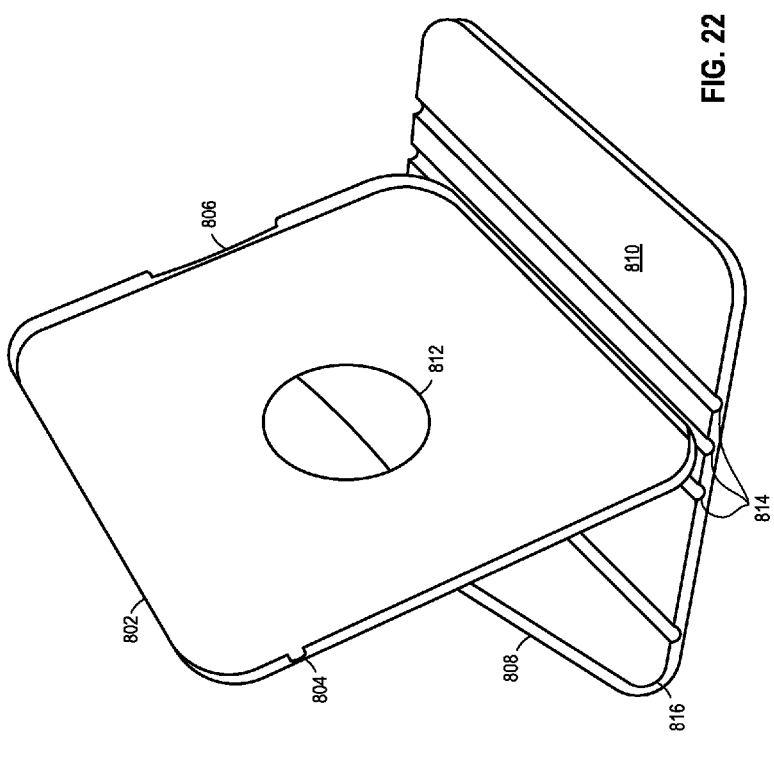
FIG. 22 illustrates a rotatable case in a landscape orientation consistent with embodiments of the present disclosure.

FIG. 22 illustrates a rotatable case 800 in a landscape orientation. As illustrated, the rotatable case 800 includes a securing panel 802 configured to secure a PED (not shown). According to various embodiments, the rotatable case 800 may include various access ports (such as 804 and 806) to facilitate interfacing a PED disposed within the case 800 with connector plugs, cables, headphones, speakers, and/or power adaptors. In certain embodiments, the rotatable case 800 may include built-in cords to route power, connectivity, and/or headphone cables from a PED to an external device. Moreover, according to various embodiments, a battery may be built into a panel or pocket of rotatable case 800.

In certain embodiments, the rotatable case 800 may have the ability to rotate securing panel 802 with respect to a supporting panel 808 and a base panel 810. Any of a wide variety of rotatable securing devices may be employed to rotatably secure securing panel 802 to supporting panel 808. For example, bushings, flanged bushings, grommets, rivets, eyelets, plain bearings, bearings, and/or any combination thereof may be employed to rotatably secure securing panel 802 to supporting panel 808. For example, as illustrated, a grommet 812 may be configured to rotatably secure the securing panel 802 to the supporting panel 808. In some embodiments, the grommet 812 may comprise a ring that may allow a logo to show through the hole in the middle of grommet 812. In certain embodiments, one or more interchangable accessories and/or inserts may "snap" into the hole in the middle of grommet 812 including, for example, a logo insert, a proximity alarm or other loss prevention accessory, and the like. Alternatively, the hold in the middle of grommet 812 may define an opening and/or aperture that may allow viewing of the interior of the rotatable case 800 and/or a portion of a PED (not shown) disposed therein (e.g., a portion of the PED including a logo).

The base panel 812 may be configured with channels or groves 814 to secure the bottom edge of securing panel 802 when the securing panel 802 is in an upright and/or elevated position. According to various alternative embodiments, in place of channels 814 a frictional surface (e.g., rubberized surface or the like) or frictional contact patches may be utilized to secure the bottom edge of the securing panel 802 in an upright and/or elevated position.

The supporting panel 808 may be configured to provide a counterforce to the securing panel 802 in order to support securing panel 802 in an upright and/or elevated position. As illustrated, the supporting panel 808 and the base panel 810 may comprise a single panel folded or bent at 816. According to various embodiments, the relative proportions of the base panel 810 and the supporting panel 808 may be adapted for a particular application. Further, in certain embodiments, the rotatable case 800 may be configured to support a PED at one or more angles relative to the base panel 810 and in a plurality of orientations, including portrait and landscape.

Figure 23:
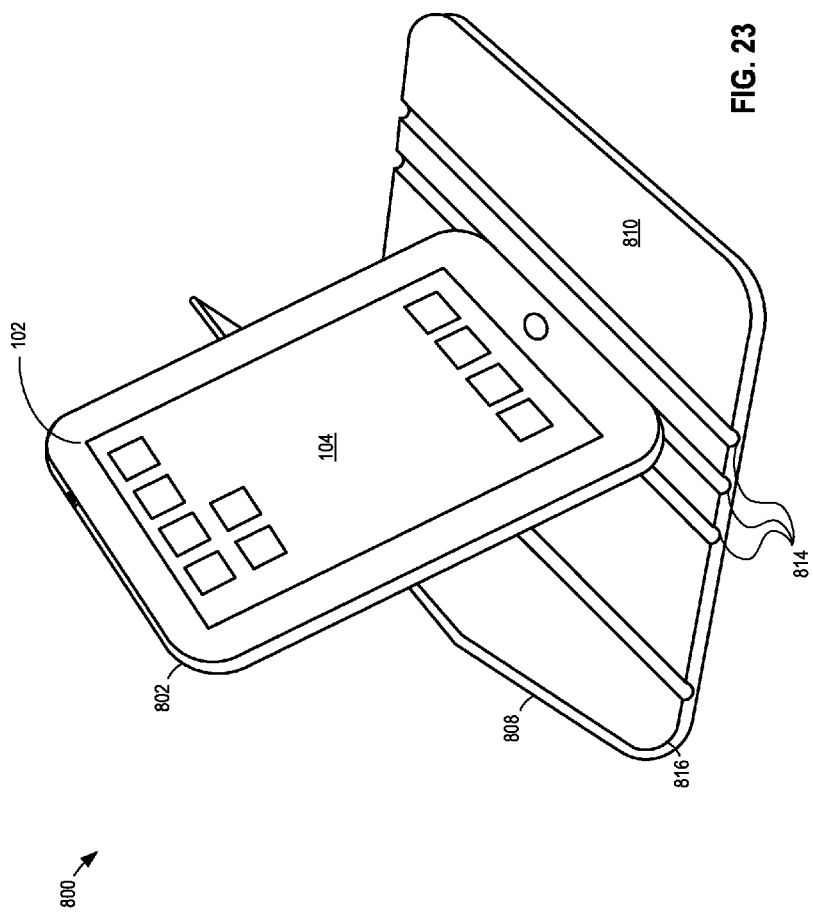
FIG. 23 illustrates a rotatable case for a portable electronic device rotated into a portrait orientation consistent with embodiments of the present disclosure.

FIG. 23 illustrates a rotatable case 800 for a PED 102 rotated into a portrait orientation. Similar to the embodiments illustrated in FIG. 1, the base panel 810 may include one or more channels 814 configured to secure the bottom edge of a PED 102 and/or the bottom edge of a securing panel 802. The rotatable case may further include a supporting panel 808 configured to fold at 816 with respect to the base panel 810.

A comparison of FIG. 22 and FIG. 23 illustrates the ability to rotate the securing panel 802 with respect to supporting panel 808 consistent with embodiments disclosed herein. According to various embodiments, the grommet 812 may allow a PED 102 to be rotated from a landscape orientation, as illustrated in FIG. 22, to the portrait orientation illustrated in FIG. 23.

In certain embodiments, the securing panel 802, base panel 810, and/or supporting panel 808 may provide protection to an enclosed PED 102. For example, the securing panel 802, base panel 810, and/or supporting panel 808 may be configured to protect the PED 102 from scratches, from damage as a result of a fall, from extreme temperatures, and/or other conditions that may result in damage to the PED 102. Accordingly, any portion of the rotating case 800 may be reinforced with padding, metal, plastic, cardboard, rubber, and/or other material or combination thereof.

In certain embodiments, the reinforcing material may utilize various folds, bends, and/or curvatures to obtain desirable resistance and/or resilience characteristics. For example, fold 816 may be configured to function as a bi-stable, tri-stable, or N-stable fold, allowing a user to selectively fold the support panel 808 with respect to the base panel 810 into one or more predetermined angles. In some embodiments, by providing an N-stable fold 816, the support panel 808 may effectively "snap" into one or more predetermined positions in order to support the PED 102 at predetermined angles with respect to the base panel 810.

Figure 24:
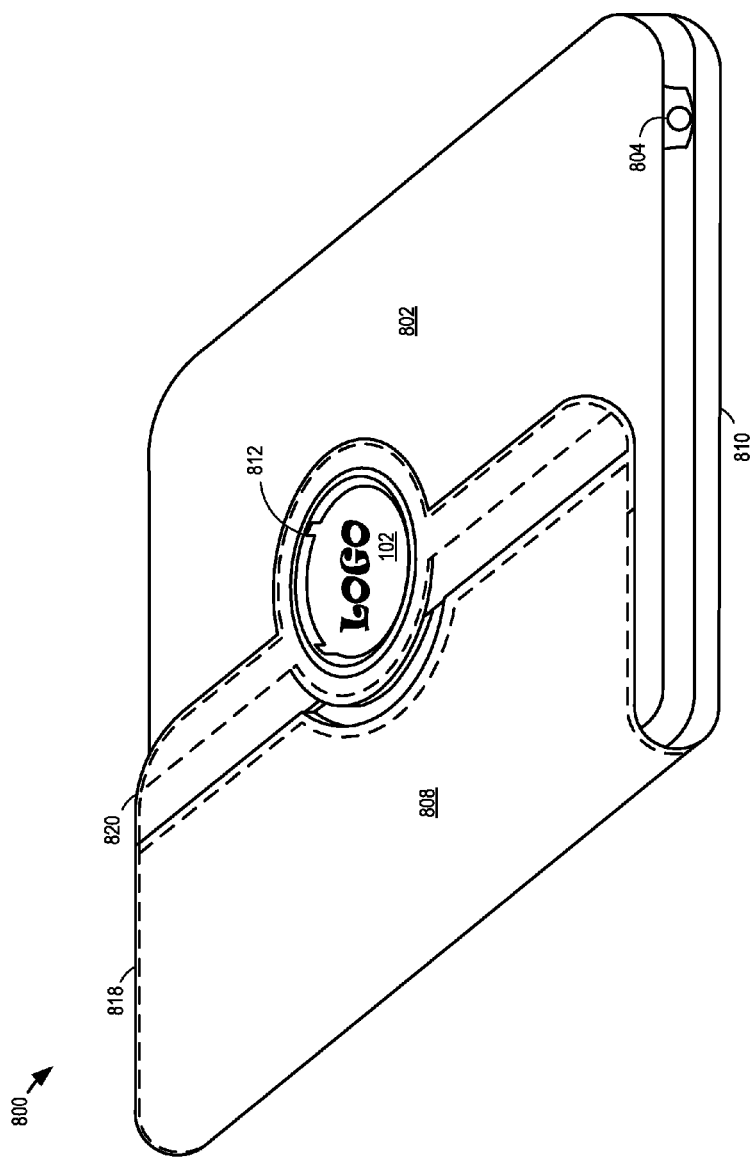
FIG. 24 illustrates a rotatable case in a closed position securing a portable electronic device consistent with embodiments of the present disclosure.

FIG. 24 illustrates a rotatable case 800 in a closed position securing a PED 102 therein. As illustrated, the securing panel 802 may include one or more access ports 804. A grommet 812 may serve to rotatably secure the support panel 808 to securing panel 802. In certain embodiments, the grommet 812 may include a see-through center circle making a portion of the PED 102 visible even when rotatable case 802 is in a closed position. In some embodiments, a transparent material may cover the center of the circle made by grommet 812. According to other embodiments, the center circle of grommet 812 may be filled with any type of material, including the same type of material used for the support panel 808 and/or the securing panel 802.

The support panel 808 may comprise a lower portion 818 and a pivot flap 820. The pivot flap 820 may be configured to fold or pivot with respect to the lower portion 818 of the support panel 808. As illustrated, the grommet 812 may be secured to the pivot flap 820, allowing the grommet 812 and the securing panel 802 to pivot with respect to the lower portion 818 of the supporting panel 808.

Any of a variety of fasteners (not shown) may be employed to selectively maintain the rotatable case 800 in the closed position. For example, a fastener may be configured to selectively maintain the securing panel 802 parallel to base panel 810. The fastener may comprise any of a variety of fasteners commonly employed in cases, bags, and luggage. Examples of possible closure mechanisms include, but are not limited to, straps, buttons, flaps, snaps, Velcro, hooks, clasps, clips, and combinations thereof. In certain embodiments, the ends of an elastic strap may be secured to the base panel 810 and the strap may be selectively wrapped around the securing panel 802. Accordingly, the securing panel 802 may be elastically maintained in a closed position. Additionally, though not illustrated, the rotatable case 800 may include any of a wide variety of straps, handles, harnesses, and/or the like configured to enable a user to easily transport the rotatable case 800.

Figure 25:
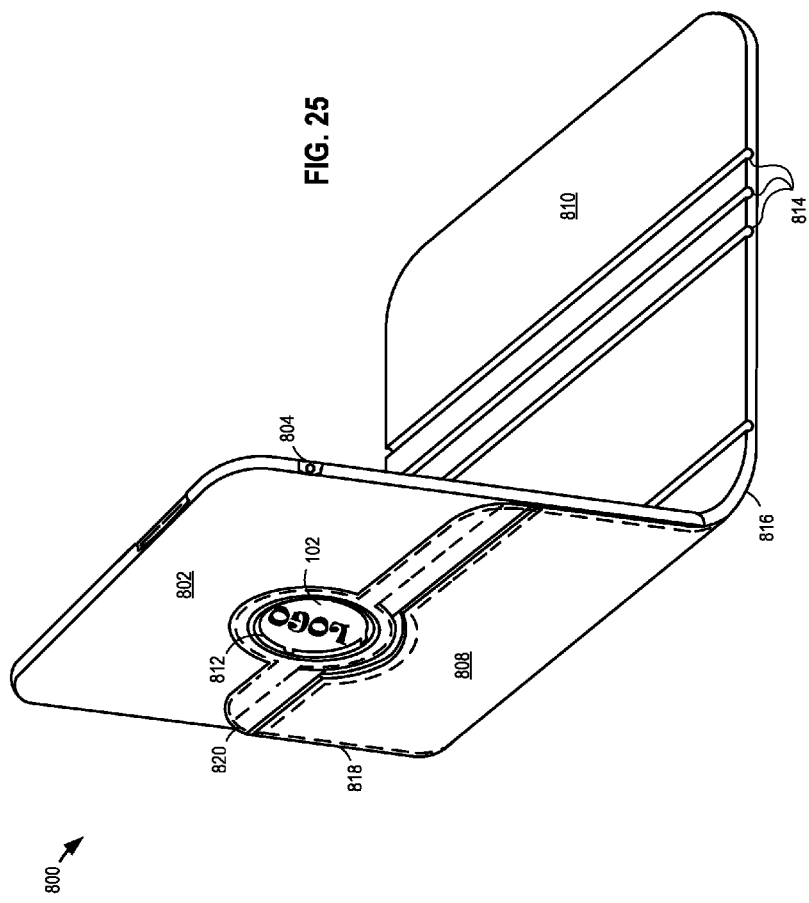
FIG. 25 illustrates a rotatable case securing a portable electronic device in a landscape orientation and a first opened position consistent with embodiments of the present disclosure.

FIG. 25 illustrates a rotatable case 800 securing a PED 102 in a landscape orientation and a first opened position. As illustrated, the support panel 808 may be folded at 816 with respect to the base panel 810. The grommet 812 may be configured to rotatably secure the securing panel 802 with respect to the support panel 808. In certain embodiments, the grommet 812 may rotatably secure a pivot flap 820 of the support panel 808 to the securing panel 802, thereby allowing the securing panel 802 to be pivoted with respect to a lower portion 818 of the support panel 808. In some embodiments, the grommet 812 may allow a portion of the PED 102 to be seen through the center ring. For example, a logo included on the PED 102 may be visible.

As previously described, the base panel 810 may include one or more channels 814 configured to prevent a bottom edge of the securing panel 802 from slipping when in an upright and/or elevated supported position. Alternative features may be utilized in place of the one or more channels 814 including, for example, frictional contact patches, catches, magnets, protrusions, and/or other features configured to prevent a bottom edge of the securing panel 802 from slipping. In certain embodiments, the securing panel 802 may include one or more access ports, such as a headphone access port 804.

Figure 26:
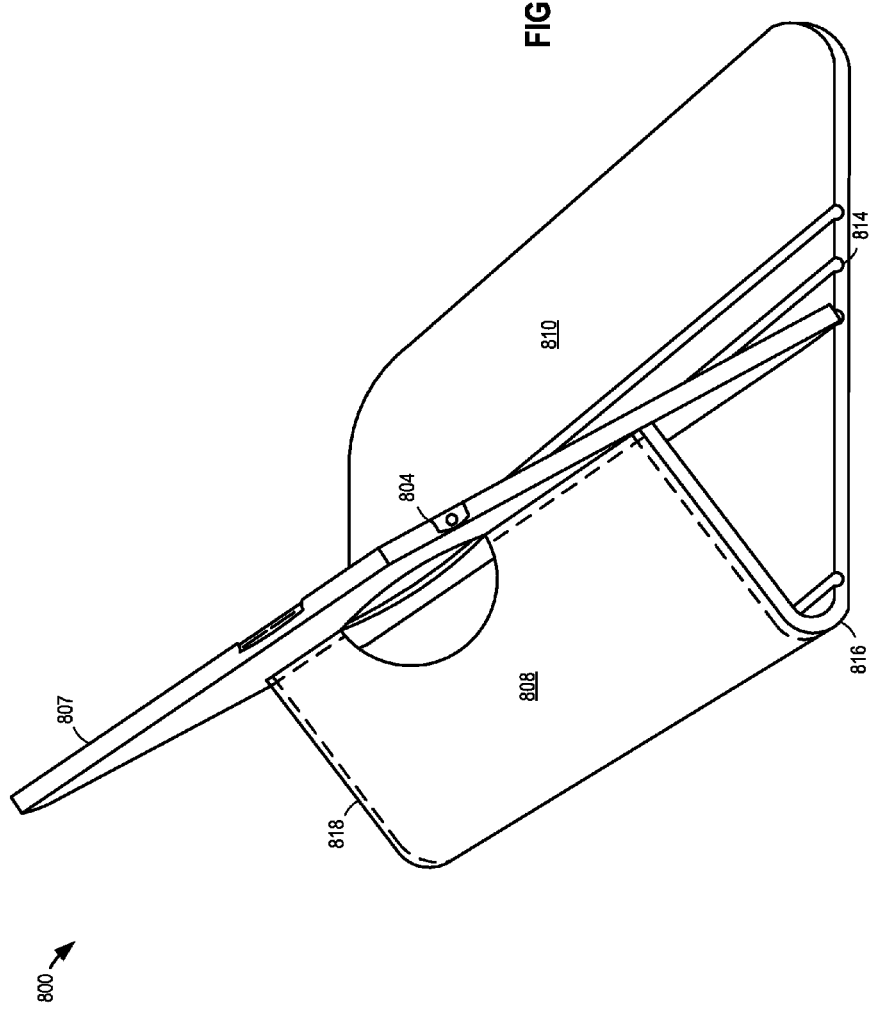
FIG. 26 illustrates a rotatable case supporting a portable electronic device at an angle in a landscape orientation and in a second opened position consistent with embodiments of the present disclosure.

FIG. 26 illustrates a rotatable case 800 supporting a PED (not shown) at an angle in a landscape orientation and in a second opened position. Particularly, FIG. 26 illustrates the functionality of the pivot flap 820 (not visible) included in rotatable case 800. As previously described, by folding a pivot flap 820 with respect to lower portion 818 of the support panel 808, the securing panel 802 may be pivoted with respect to the supporting panel 808. In the illustrated position, the support panel 808 supports the securing panel 802 at an angle with respect to the base panel 810. A first channel of channels 814 prevents a bottom edge of the securing panel 802 from slipping along the base panel 810. In certain embodiments, additional folding of the pivot flap 820 and/or the support panel 808 at 816 may allow the PED 102 to be supported at various angles of inclination by placing the bottom edge of the securing panel 802 in a different channel of channels 814. In certain embodiments, the securing panel 802 may include one or more access ports, such as a headphone access port 804.

Figure 27:
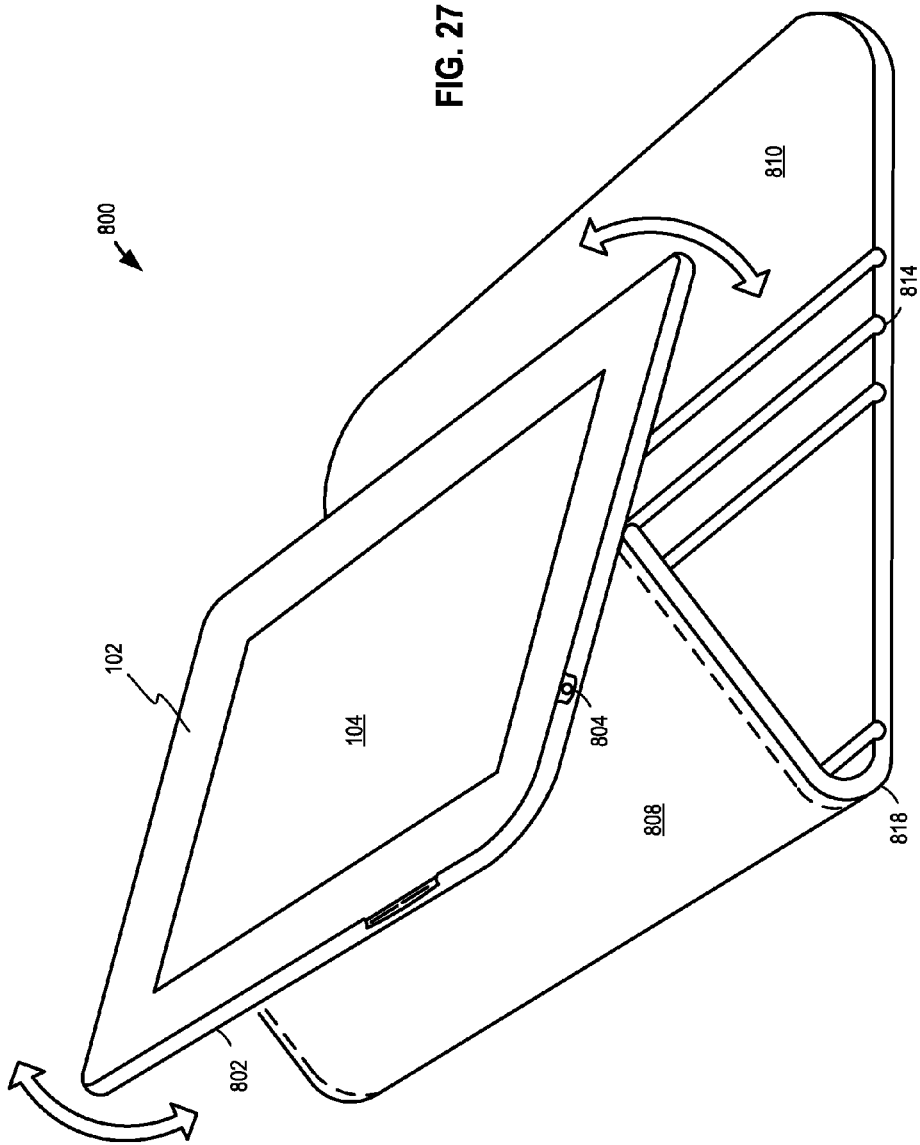
FIG. 27 illustrates a portable electronic device secured by a rotatable case including a pivot flap configured to allow the portable electronic device to be pivoted to a desired angle of inclination consistent with embodiments of the present disclosure.

FIG. 27 illustrates a PED 102 secured by a rotatable case 800 including a pivot flap 820 (not visible) configured to allow the PED 102 to be pivoted to a desired angle of inclination. The pivot flap 820 (not visible) may allow the PED 102 to be secured within the securing panel 802 to pivot with respect to the support panel 808. As illustrated, the PED 102 may be pivoted into a desired angle of inclination. In certain embodiments, the PED 102 may be pivoted from the closed position illustrated in FIG. 24, in which the PED 102 is parallel to base panel 810, to any angle of inclination between with respect to the base panel 810. Accordingly, the PED 102 may be pivoted until the securing panel 802 is again parallel with the base panel 810 and with the display 104 of the PED 102 facing up.

In certain embodiments, the PED 102 secured by the securing panel 802 may be pivoted to a desired angle of inclination. The support panel 808 may provide sufficient support to maintain the PED 102 at the desired angle of inclination. One or more channels 814 may prevent a bottom edge of the securing panel 810 from slipping along the base panel 810.

Figure 28:
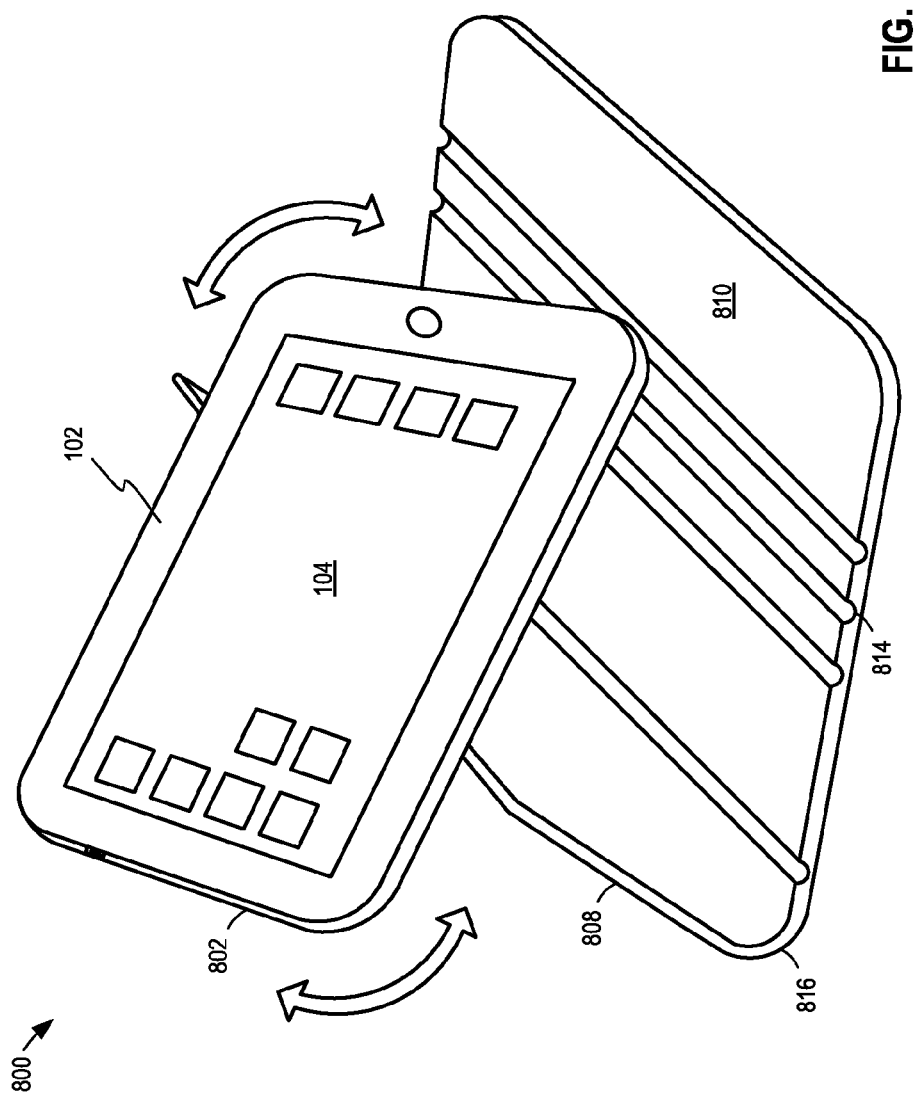
FIG. 28 illustrates a portable electronic device secured by a rotatable case including a grommet configured to allow the portable electronic device to be rotated from a portrait orientation to a landscape orientation and vice versa consistent with embodiments of the present disclosure.

FIG. 28 illustrates a PED 102 secured by a rotatable case 800 including a grommet 812 (not visible) configured to allow the PED 102 to be rotated from a portrait orientation to a landscape orientation and vice versa. As illustrated, a rotatable grommet 812 (not visible) may be configured to allow a PED 102 disposed in a securing panel 802 to be rotated from a portrait orientation to a landscape orientation and vice versa. In certain embodiments, the PED 102 may be configured to rotate from a first landscape position, as illustrated in FIG. 22 to a second portrait position, as illustrated in FIG. 23. In certain embodiments, the PED 102 may be rotated 360 degrees into any desired orientation.

In some embodiments, the PED 102 may be configured to rotate only into specific orientations. For example, at 0 degrees the PED 102 may be in a first landscape orientation; the PED 102 may be rotated 90 degrees to a first portrait orientation, rotated an additional 90 degrees to a second landscape orientation, and rotated a final 90 degrees to a second portrait position. In the second portrait position it may reach a stop and may be rotated in the opposite direction to return the PED 102 to prior orientations. In certain embodiments, the rotational mechanism (e.g., grommet 812) of the case 800 may snap into certain specific orientations and require rotational force to move to a different specific orientation.

Figure 29:
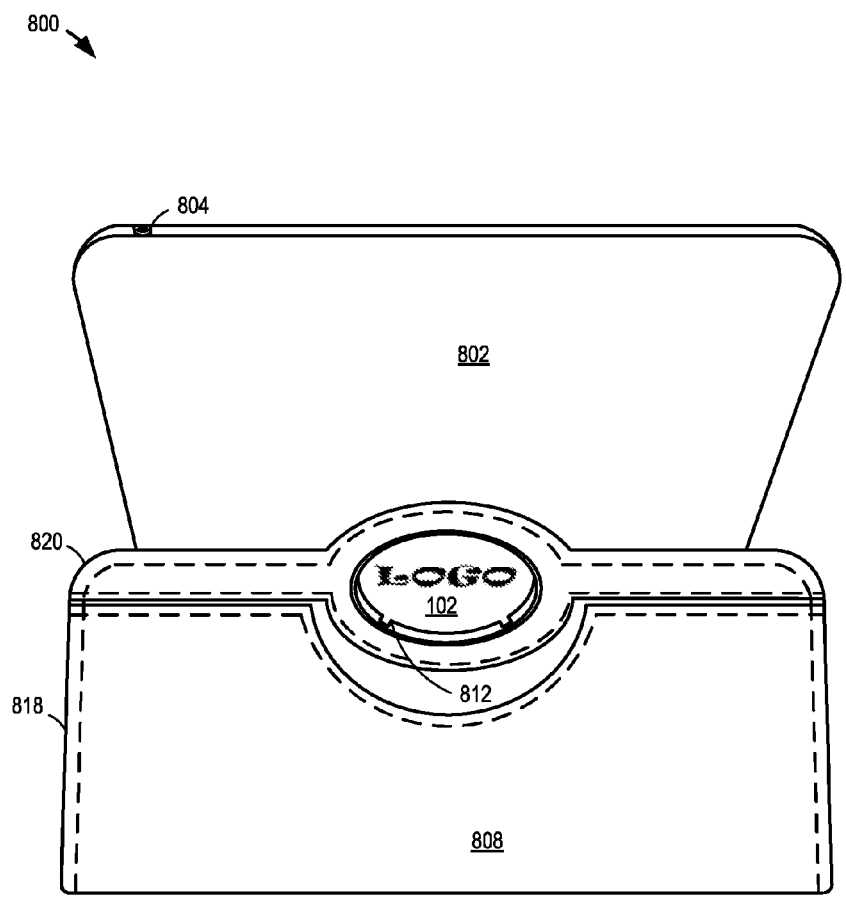
FIG. 29 illustrates a rear view of a rotatable case securing a portable electronic device in a portrait orientation consistent with embodiments of the present disclosure.

FIG. 29 illustrates a rear view of a rotatable case 800 securing a PED 102 in a portrait orientation. As illustrated, a pivot flap 820 may be folded with respect to a lower portion 818 of the support panel 808. Accordingly, a PED 102 secured by the securing panel 802 may be supported at one or more specific angles with respect to the support panel 808 and the base panel 810 (not visible). A grommet 812 or other rotational mechanism may rotatably secure the securing panel 802 to the pivot flap 820. As previously described, the grommet 812 may allow the PED 102 and the securing panel 802 to be rotated with respect to the support panel 808, including, for example, in a portrait and/or landscape orientation.

Figure 30:
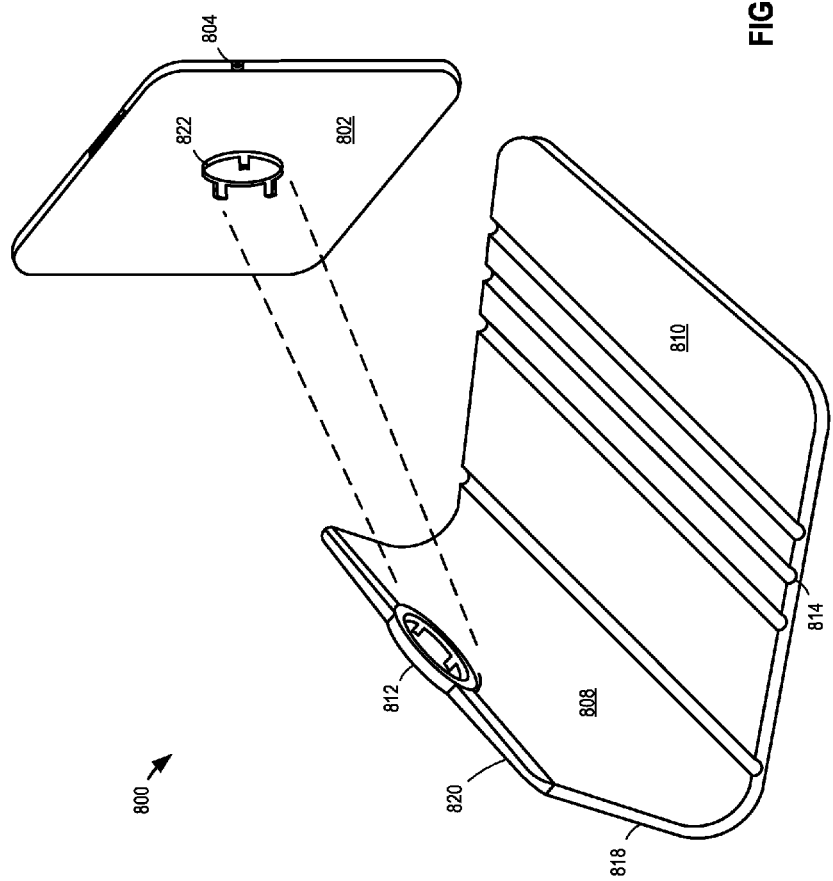
FIG. 30 illustrates an interaction between a support panel of a rotatable case and a securing panel via a grommet consistent with embodiments of the present disclosure.

FIG. 30 illustrates an interaction between a support panel 808 of a rotatable case 800 and a securing panel 802 via a grommet 812. In certain embodiments, the grommet 812 may comprise a rear portion 812 and a front portion 822. The rotatable case 800 may include a base panel 810 with one or more channels 814, a supporting panel 808 comprising a lower portion 818, and a pivot flap 820, and a rear portion 812 of the grommet. A securing panel 802, including one or more access ports 804, may be mounted to a front portion 822 of the grommet. According to various embodiments, the front portion 822 of the grommet may be mated with the rear portion 812 of the grommet in order to rotatably secure the securing panel 802 to the pivot flap 820. In this manner, the securing panel 802 may be free to rotate 360 degrees relative to the support panel 808.

In certain embodiments, the front portion 822 of the grommet and the rear portion 812 of the grommet may be joined together during manufacturing or assembly and are not configured to be selectively separated by a user. Alternatively, a user may selectively separate the front portion 822 of the grommet from the rear portion 812 in order to remove the securing panel 802 from the pivot flap 820. In other embodiments, the front portion 822 and the rear portion 812 of the grommet are inseparable and the grommet may be selectively detachable from the pivot flap 820 and/or the securing panel 102.

Figure 31:
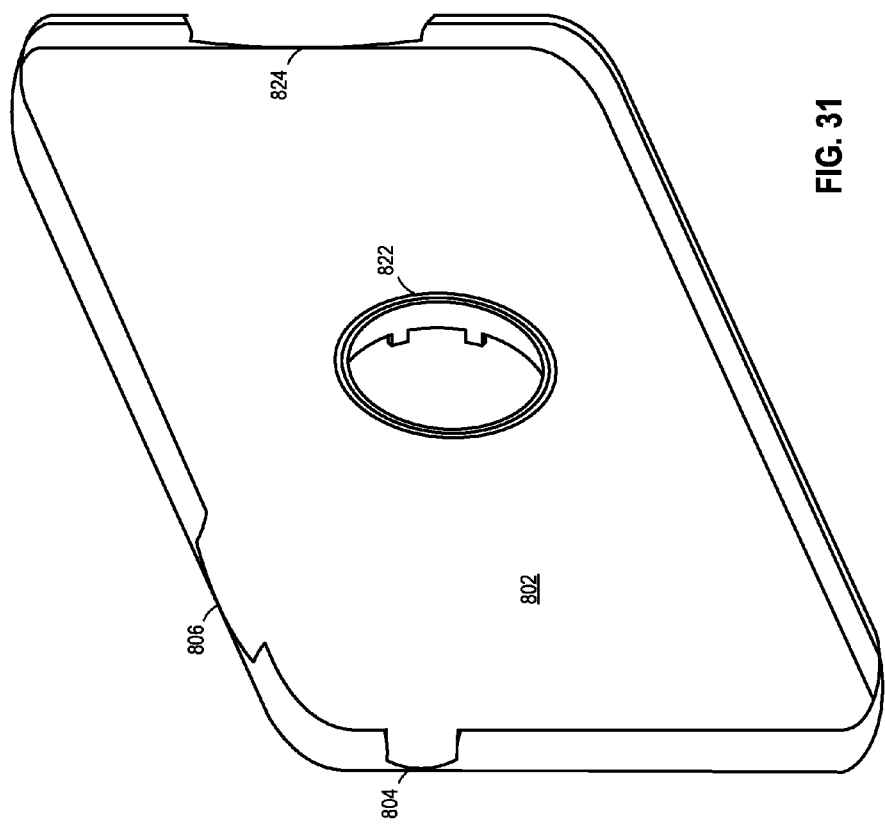
FIG. 31 illustrates a securing panel of a rotatable case and a first portion of a grommet consistent with embodiments of the present disclosure.

FIG. 31 illustrates a securing panel 802 of a rotatable case 800 and a front portion of a grommet 822. The securing panel 802 may include sidewalls to protect and/or secure the edges of a PED 102 (not shown). According to various embodiments, a PED 102 may effectively snap into place within the securing panel 802. Alternatively, a PED 102 may be secured within the securing panel 802 utilizing one or more straps, buckles, clips, adhesives, and/or similar features. The securing panel 802 may further utilize neoprene or rubber to selectively secure the PED 102. Additionally, the sidewalls, or a portion thereof, of the securing panel 802 may wrap around the front of a secured PED 102. In certain embodiments, the securing panel 802 may comprise a holder similar to the holders described herein.

The securing panel 802 may further include one or more access ports 804, 806, 824. For example, a headphone access port 804, a volume rocker access port 806, and/or a power or connection access port 824 may be available. As previously described, a grommet portion 822 may be configured to rotatably secure the securing panel 802 to a pivot flap 820 of a support panel 808. The securing panel 802 may comprise various materials such as plastic, rubber, metal, leather, faux leather, vinyl, nylon, and/or any of a wide variety of alternative decorative or useful materials utilized in cases, bags, luggage, and the like.

Figure 32:
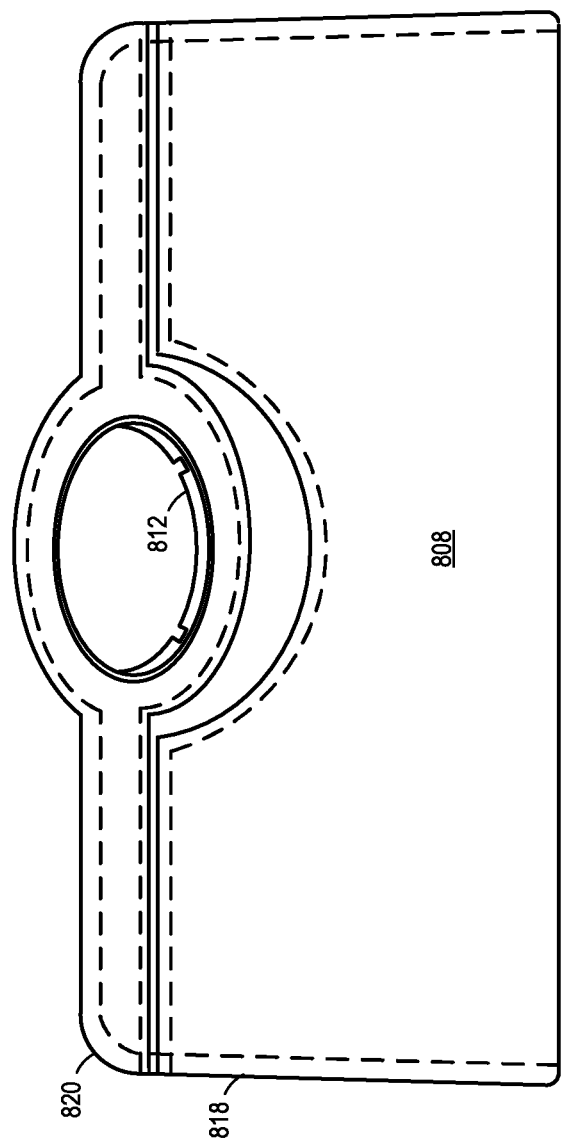
FIG. 32 illustrates a support panel of a rotatable case including a pivot flap and a grommet consistent with embodiments of the present disclosure.

FIG. 32 illustrates a support panel 808 of a rotatable case 800 including a pivot flap 820 and a grommet 812. As illustrated, the pivot flap 820 may include a grommet 812 and be configured to fold with respect to a lower portion 818 of the support panel 808. Accordingly, the pivot flap 820 and grommet 812 may pivot with respect to the lower portion 818 of the support panel 808 to a desired angle of inclination. According to various embodiments, the pivot flap 820 may be configured to resiliently return to its original, unfolded, position when the pivoting force is removed. Alternatively, the pivot flap 820 may be configured to pivot with respect to a lower portion 818 of the support panel 808 and thereafter maintain the pivoted position until forced to a new angle of inclination.

The pivot flap 820 may be connected to a lower portion 818 of the support panel 808 utilizing any of a variety of known pivotable connectors. In some embodiments, the support panel 808, including both the lower portion 818 and the pivot flap 820 may be manufactured using a material or fabric, such as leather, faux leather, and/or vinyl. In such embodiments, the pivotable connection between the pivot flap 820 and the lower portion 818 of the support panel 808 may be a sewn section of a similar or identical material.

Figure 33:
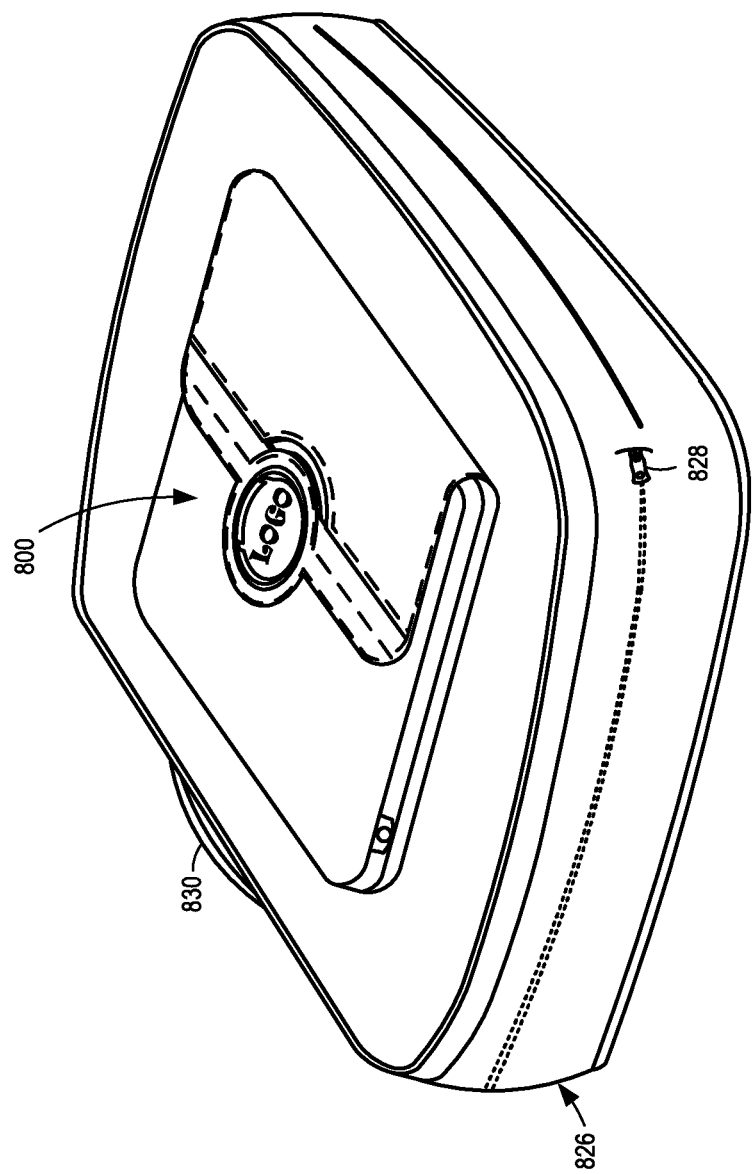
FIG. 33 illustrates a rotatable case integrated into a larger case consistent with embodiments of the present disclosure.

FIG. 33 illustrates a rotatable case 800 integrated into a larger case 826. As illustrated, the rotatable case 800 may be integrated as an additional side pocket on a larger case 826. According to various embodiments, the rotatable case 800 may alternatively be integrated within an internal compartment of larger case 826. Additionally, in certain embodiments, a base panel 810 may be a shared panel or wall of the larger case 826; and thus only include the remaining portions of the rotatable case 800. That is, a wall of larger case 826 may share a common wall with the base panel 810 of rotatable case 800.

In certain embodiments, the rotatable case 800 may include any combination of the various features and embodiments described in any of the cases described herein. Moreover, the larger case 826 may be configured with a handle 830 and a zipper 828. The larger case 826 may be any of a wide variety of cases, including a brief case, luggage, a laptop case, a case for a PED 102, and the like.

Figure 34:
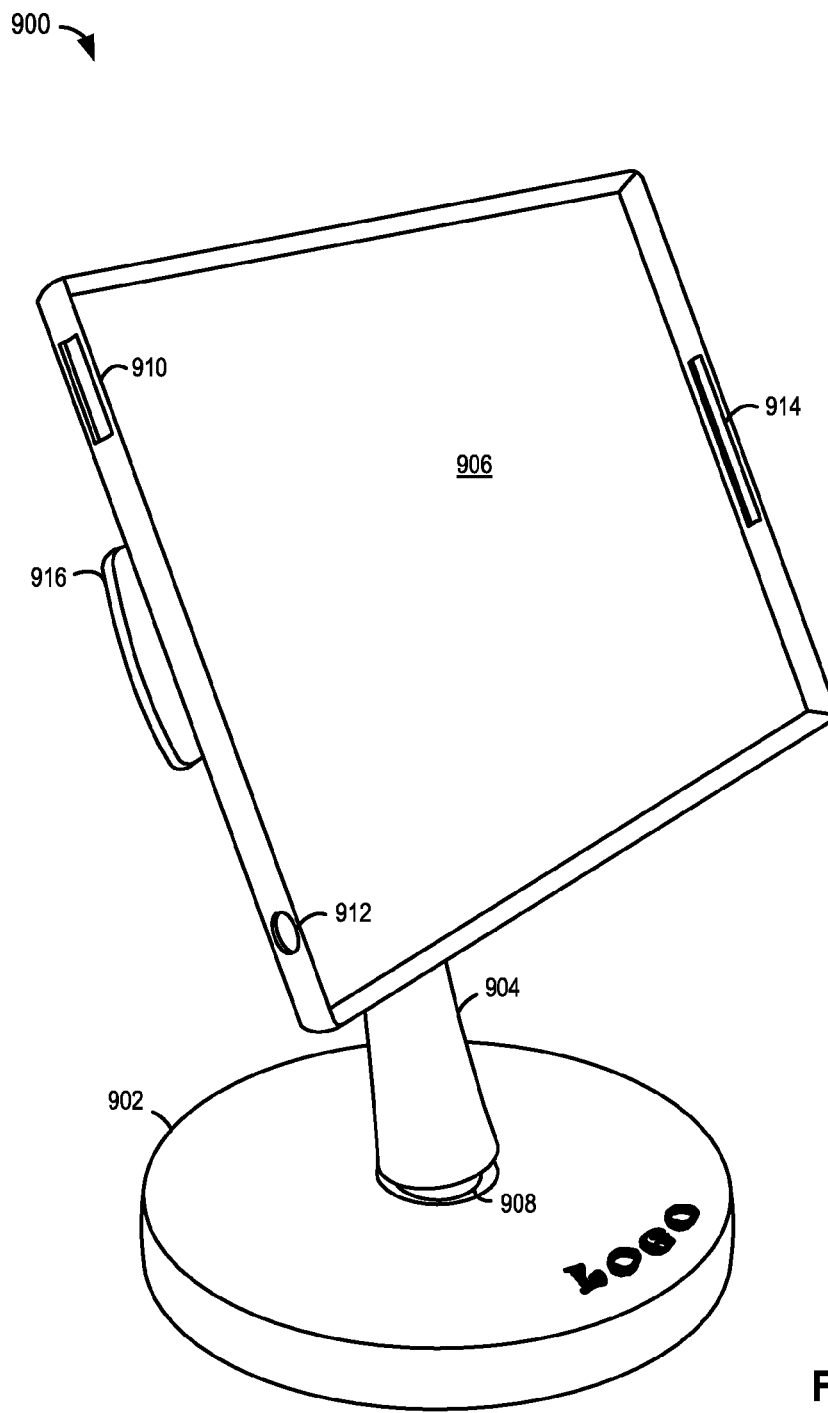
FIG. 34 illustrates a multi-pivot stand for a portable electronic device including a base, a vertical support, and a case configured in a landscape orientation consistent with embodiments of the present disclosure.

FIG. 34 illustrates a multi-pivot stand 900 for a PED (not shown) including a base 902, a vertical support 904, and a case 906 configured in a landscape orientation. In certain embodiments, the base 902 may be constructed of any shape and/or size suitable to adequately support a PED secured within the case 906. In some embodiments, the base 902 may be weighted, include adjustable feet, have a no-slip bottom and/or top surface, and/or include a logo disposed thereon.

A vertical support 904 may be coupled to the base 902 via a lower connection member 908. In certain embodiments, the lower connection member 908 may comprise a swivel joint configured to allow the vertical support 904 to be rotated and pivoted in a variety of angles and directions with respect to the base 902. In some embodiments, the lower connection member 908 may comprise a swivel joint configured to allow the vertical support 904 to be rotated but not pivoted, pivoted but not rotated, or rotated and pivoted. The lower connection member may further comprise any variety of known rotatable and/or pivotable connections, including ball joints, ball and socket connections, bearings, pivot rods, slip rings, swivel joints, swing joints, and the like.

In certain embodiments, the lower connection member 908 may comprise a fixed connection member securing a vertical support 904 relative to the base 902. The vertical support 904 and the base 902 may also be manufactured as a single piece, thereby limiting relative movement between the vertical support 904 and the base 902.

The case 906 may be configured to securing a PED (not shown). In certain embodiments, the case 906 may comprise components and designs similar to the other cases and holders disclosed herein. The design of the case 906, including its dimensions and positions of any access ports 910-914 may be adapted for a specific PED. In some embodiments, a PED may be configured to snap into the case 906 or be secured therein using one or more corner securement members (e.g., resilient straps). In certain embodiments, the case 906 may include flexible sidewalls configured to secure a PED. In some embodiments, the flexible sidewalls may be configured to secure a PED by wrapping around the sides and/or a portion of the front of a PED.

As is described in more detail below, the case 906 may be coupled to the vertical support 904 via an upper connection member (not visible) configured to allow the case 906 to be rotated and/or pivoted with respect to the vertical support 904. In certain embodiments, the stand 900 may include a lever 916 configured to selectively lock and release the lower connection member 908 and or the upper connection member. The stand 900 may further include a plurality of levers configured, for example, to control one or more of the connection members separately.

Figure 35:
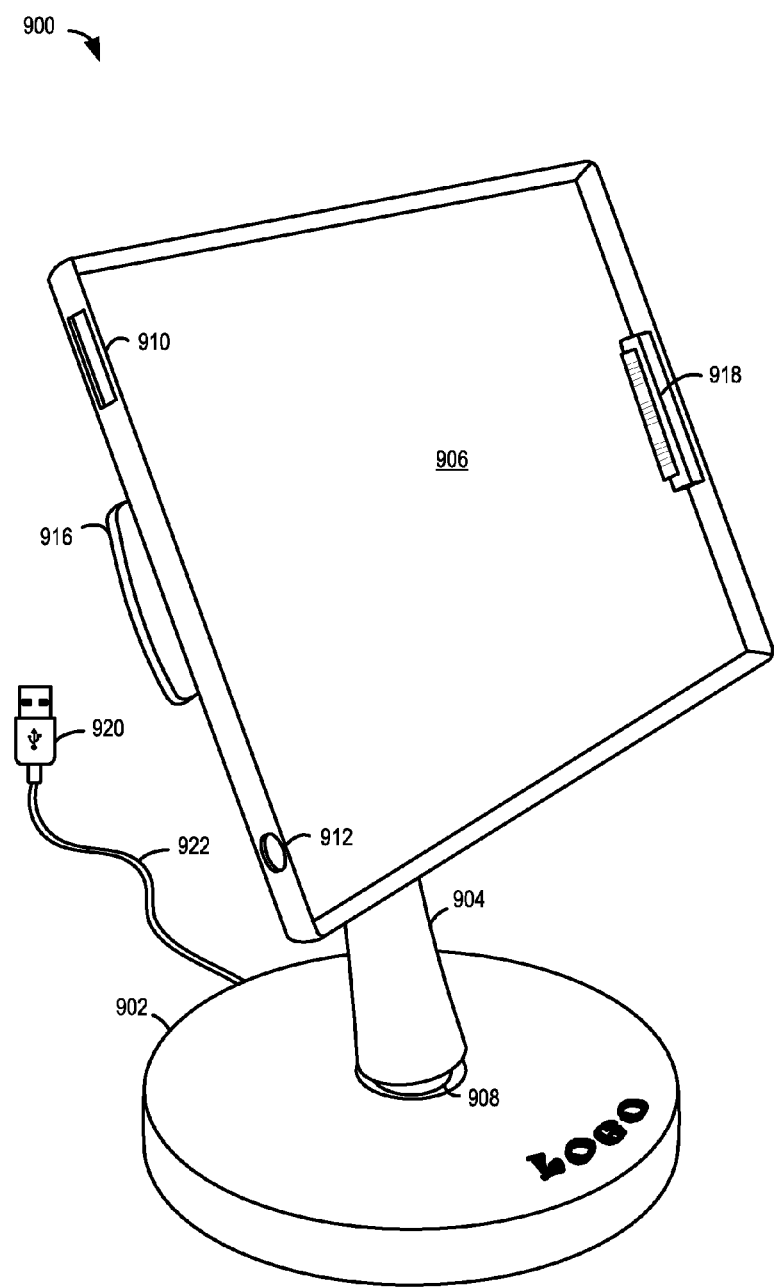
FIG. 35 illustrates a multi-pivot stand for a portable electronic device including a data dock consistent with embodiments of the present disclosure.

FIG. 35 illustrates a multi-pivot stand 900 for a PED (not shown) including a data dock 918. In certain embodiments, the data dock 918 may be configured to provide power and/or a data connection to a PED secured by a case 906. In various embodiments, the data dock 918 may be communicatively coupled to an external connector 920 such as, for example, a USB connector and/or power connector, via a cable 922. In some embodiments, the type, shape, size and number of data dockets 918 may be adapted for a specific PED. In certain embodiments, the data dock 918 and the external connector 920 may be interchangeable with each other and/or other various alternative connectors.

Figure 36:
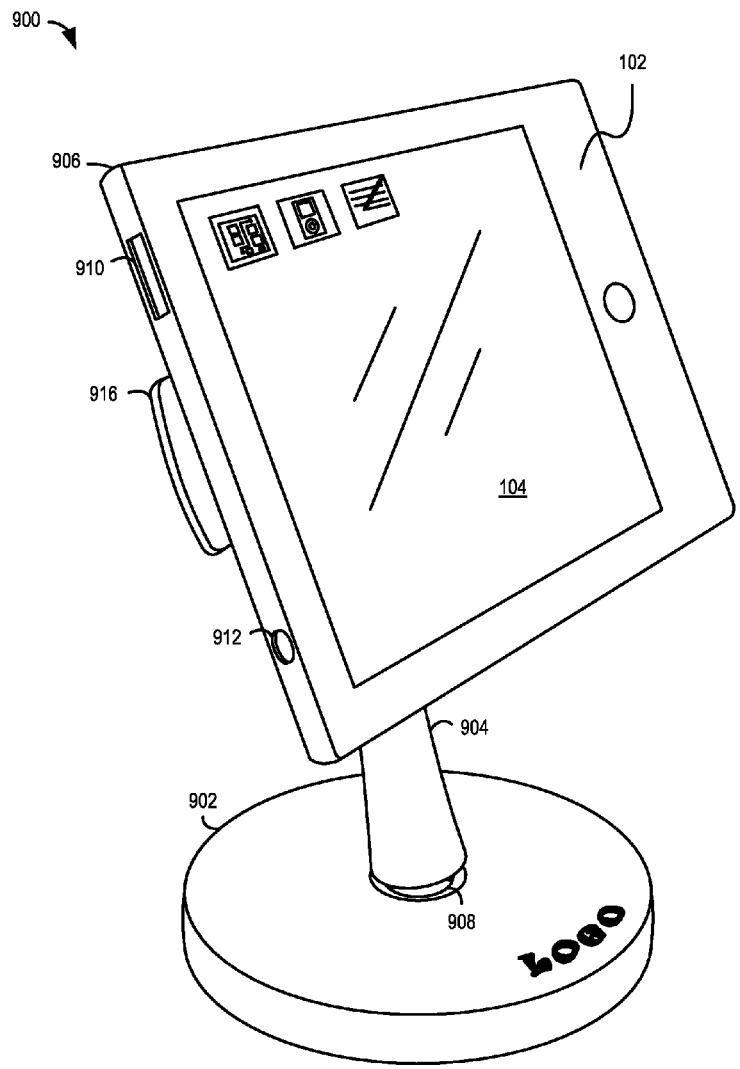
FIG. 36 illustrates a multi-pivot stand securing a portable electronic device in a landscape orientation consistent with embodiments of the present disclosure.

FIG. 36 illustrates a multi-pivot stand 900 securing a PED 102 in a landscape orientation. As illustrated, the case portion 906 of the stand 900 may be configured to secure the PED 102 therein. In some embodiments, the PED 102 may be configured to snap into the case 906 using one or more corner securement members (e.g., resilient straps). In certain embodiments, the case 906 may include flexible sidewalls configured to secure the PED 906. In some embodiments, the flexible sidewalls may be configured to secure the PED 906 by wrapping around the sides and/or a portion of the front of a PED 906 while still allowing a user to view the display 104.

Figure 37:
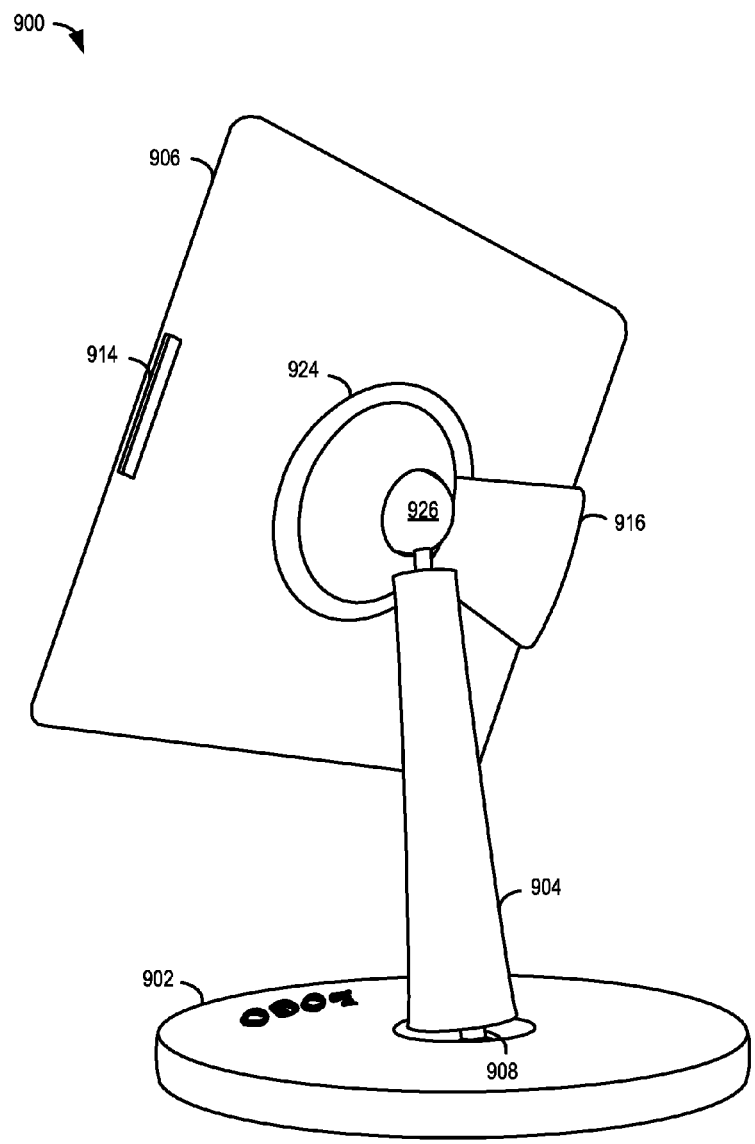
FIG. 37 illustrates a rear elevation view of a multi-pivot stand consistent with embodiments of the present disclosure.

FIG. 37 illustrates a rear elevation view of a multi-pivot stand 900. As illustrated, the stand 900 may include a case 906 coupled to a vertical support 904 via an upper connection member 926. Additionally, the vertical support 904 may be coupled to a base 902 via a lower connection member 908 such that the vertical support 904 may be rotated and/or pivoted in one or more directions with respect to the base 902. In certain embodiments, the upper connection member 926 may be a ball-and-socket type connection allowing the case 906 to be rotated and pivoted in one or more directions with respect to the vertical support 904. In certain embodiments, the upper connection member 926 may be generally described as a rotational mechanism. In various embodiments, the case may include one or more access ports 914 (e.g., power and/or data access ports).

A release lever 916 may be configured to selectively lock and release the upper connection member 926 and/or the lower connection member 908. For example, when locked, the release lever 916 may be configured to selectively prevent the case 906 from pivoting and/or rotating in one or more directions relative to the vertical support 904, the case 906, and/or the base 902. In certain embodiments, the release lever 916 may be specifically configured to selectively lock and/or release the vertical and horizontal pivoting of the case 906 relative to the vertical support 904. In some embodiments, the case 906 may be configured to rotate from a portrait to a landscape orientation regardless of the state of the release lever 916.

The case 906 may be secured to the upper connection member 926 via a mount 924. In certain embodiments, the case 906 and/or upper connection member 926 may be selectively detached and/or attached from the mount 924.

Figure 38:
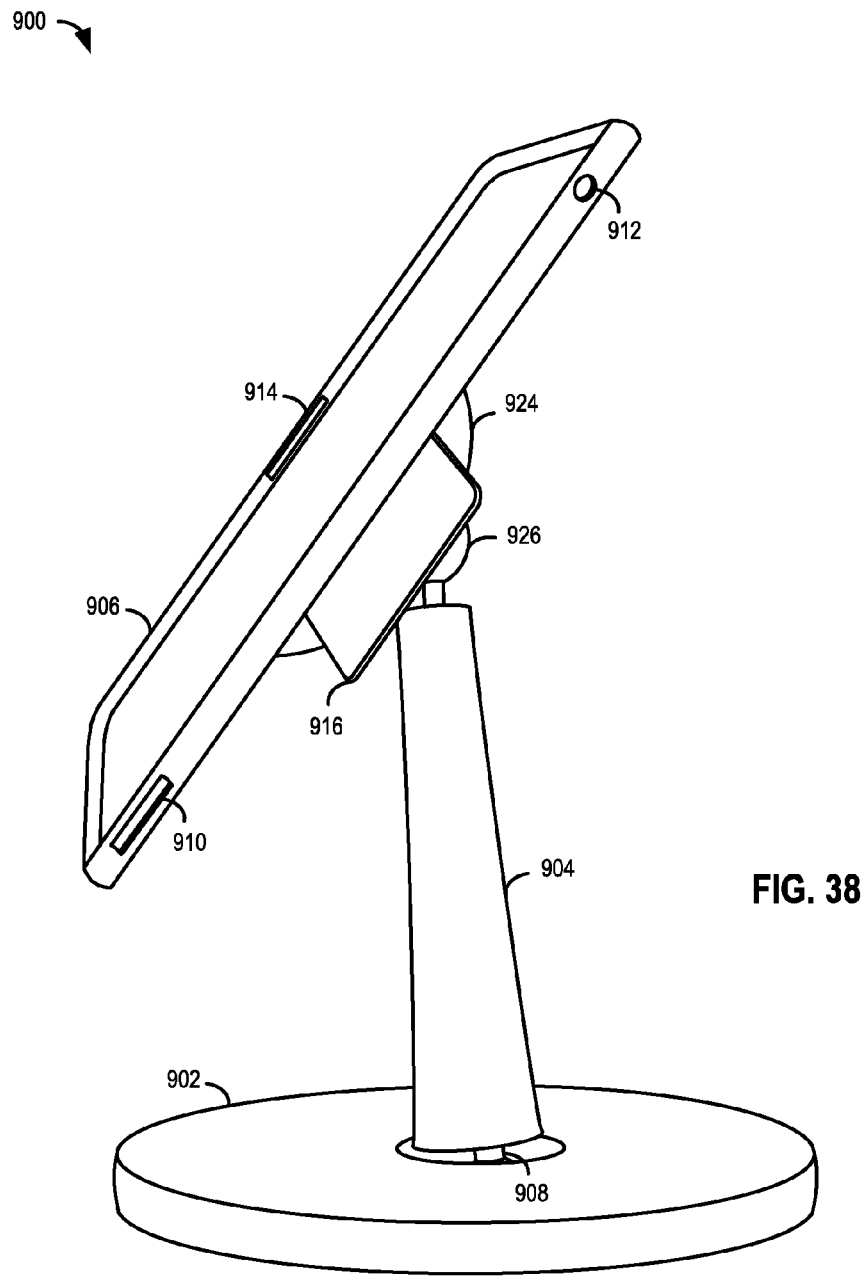
FIG. 38 illustrates a side elevation view of a multi-pivot stand consistent with embodiments of the present disclosure.

FIG. 38 illustrates a side elevation view of a multi-pivot stand 900. The multi-pivot stand may include a vertical support 904 rotatably coupled to a base 902 via a lower connection member 908. In certain embodiments, the lower connection member 908 may allow the vertical support 904 to be rotated and/or pivoted in one or more directions relative to the base 902.

A case 906 configured to secure a PED (not shown) may be coupled to an upper connection member 926 via a mount 924. Alternatively, the case 906 may be directly coupled to the upper connection member 926. In certain embodiments, the upper connection member 926 may be configured to rotatably couple the case 906 to the vertical support 904 such that the case 906 may be pivoted and/or rotated in one or more directions relative to the vertical support 904. A release lever 916 may be configured to selectively lock and release the movement of the upper connection member 926.

Figure 39:
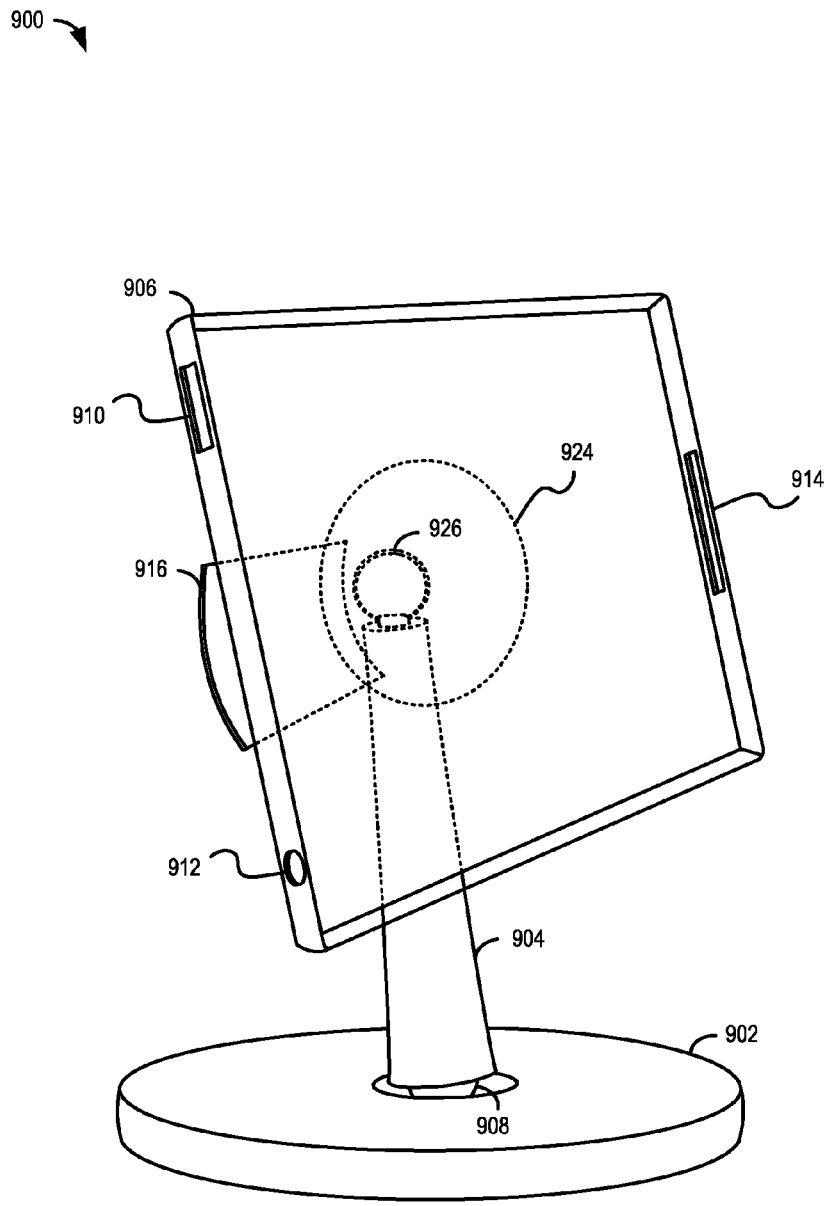
FIG. 39 illustrates a multi-pivot stand including a case coupled to a vertical support consistent with embodiments of the present disclosure.

FIG. 39 illustrates a multi-pivot stand 900 including a case 906 coupled to a vertical support 904. In certain embodiments, the case 906 may be coupled to the vertical support 904 via an upper connection member 916 (shown in dashed lines). In some embodiments, the upper connection member 916 may be coupled to the case 906 via a mount 924 (shown in dashed lines).

The case 906 may be configured to pivot and/or rotate in one or more directions relative to the vertical support 904. The vertical support 904 may be coupled to the base 902 via a lower connection member 908 and may be configured to pivot and/or rotate in one or more directions relative to the base 902. A release lever 916 may be configured to selectively lock and release the upper connection member 926 and/or the lower connection member 908.

In certain embodiments, the upper connection member 926 and/or the lower connection member 908 may be configured to frictionally maintain their positions when the PED (not shown) is secured within the case 906. For example, in certain embodiments, even with the release lever 916 set to a position where the upper connection member 926 and the lower connection member 908 are free to rotate and/or pivot in one or more directions, friction may enable both connection members 926, 908 to maintain their positions until acted on by an external force (e.g., from a user repositioning the stand 900).

Figure 40:
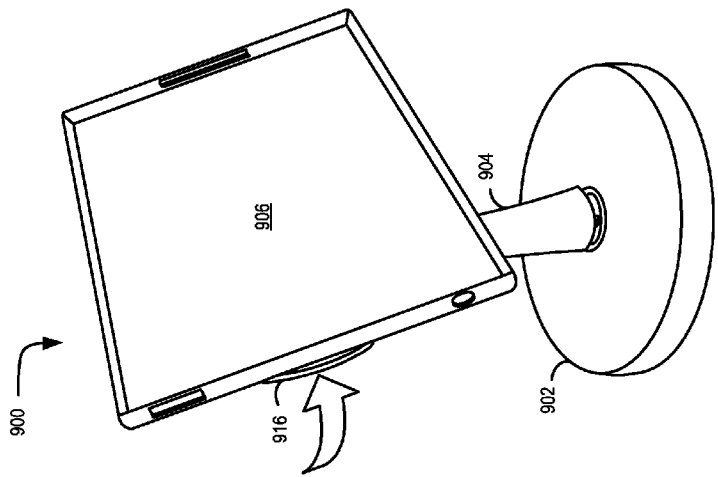
FIG. 40 illustrates a release lever configured to selectively release an upper connection member of a multi-pivot stand in order to rotate a case from a landscape orientation to a portrait orientation consistent with embodiments of the present disclosure.

FIG. 40 illustrates a release lever 916 configured to selectively release an upper connection member (not visible) of a multi-pivot stand 900 in order to rotate a case 906 from a landscape orientation to a portrait orientation. As illustrated, the release lever 916 may be actuated by, for example, pulling it towards the case 906. Alternatively, the release lever 916 may be actuated by movement in another direction, by rotation in a particular direction, by pulling the lever 916 outward, and/or by pushing the lever 916 inward. In certain other embodiments, the release lever 916 may be a release button or other mechanical device configured to selectively actuate the configuration of the upper connection member 926 and/or the lower connection member 908.

Figure 41:
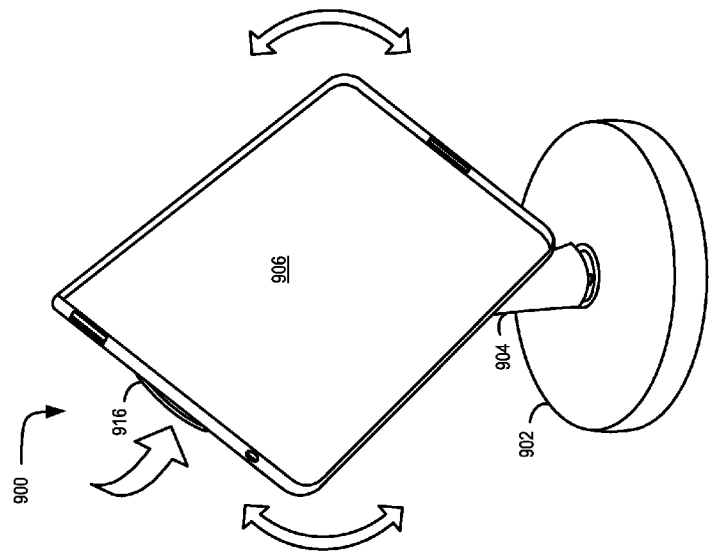
FIG. 41 illustrates another view of the release lever illustrated in FIG. 40 consistent with embodiments of the present disclosure.

FIG. 41 illustrates another view of the release lever 916 illustrated in FIG. 40. As illustrated, when the release lever 916 is actuated, the case 906 may be freely rotated from a portrait orientation to a landscape orientation. In certain embodiments, the release lever 916 is actuated, the case 906 may be rotated in one or more directions to a plurality of orientations. Alternatively, the case 906 may be configured to lock (e.g., via a snapping mechanism or the like) into one or more locations and/or orientations corresponding to one or more pre-set orientations.

Figure 42:
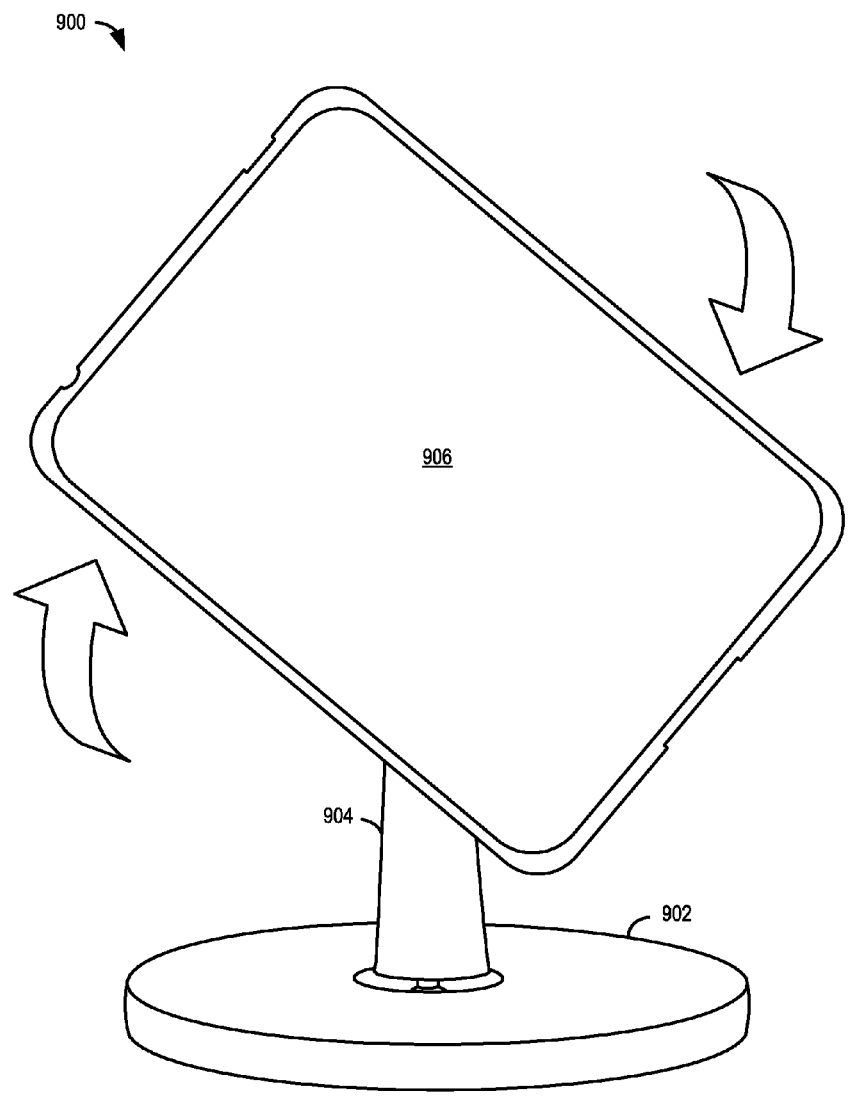
FIG. 42 illustrates another multi-pivot stand including a case configured to secure a portable electronic device capable of rotating from a landscape orientation to a portrait orientation consistent with embodiments of the present disclosure.

FIG. 42 illustrates another multi-pivot stand 900 including a case 906 configured to secure a PED (not shown) capable of rotating from a landscape orientation to a portrait orientation. In certain embodiments, a release lever (not shown) may need to be actuated prior to rotating the case 906 between orientations. Alternatively, the case 906 may be free to rotate independent of the release lever. In certain embodiments, the release lever may be configured to selectively prevent the case 906 from vertically and horizontally pivoting but not prevent it from rotating. In some embodiments, the case 906 may be figured to lock (e.g., snap) into one or more desired orientations (e.g., every 90 degrees and/or in portrait/landscape orientations). A vertical support 904 coupled to the case 906 may further be rotated and/or pivoted relative to a base 902.

FIGS. 43-44 illustrate a multi-pivot stand 900 including a case 906 configured to vertically pivot about an upper connection member (not shown). A base 902 may be coupled to a vertical support 904 that, in certain embodiments, may be rotatable and/or pivotable in one or more directions relative to the base 902. The vertical support 904 may be rotatably and/or pivotally coupled to the case 906 via an upper connection member (not visible). A release lever 916 may be configured to selectively lock and release the upper connection member and control the rotation and/or pivoting of the case 906 relative to the vertical support 904 and/or the vertical support 904 relative to the base 902.

FIGS. 45-46 illustrate a multi-pivot stand 900 including a case 906 configured to horizontally pivot about an upper connection member (not shown). A base 902 may be coupled to a vertical support 904 that, in certain embodiments, may be rotatable and/or pivotable in one or more directions relative to the base 902. The vertical support 904 may be rotatably and/or pivotally coupled to the case 906 via an upper connection member (not visible). The vertical support 904 may be further rotatably and/or pivotally coupled to the base 902 via a lower connection member 908. A release lever 916 may be configured to selectively lock and release the upper connection member and/or the lower connection member 908 and control the rotation and/or pivoting of the case 906 relative to the vertical support 904 and/or the vertical support 904 relative to the base 902. Using the upper connection member and/or lower connection member 908, the case 906 may be horizontally rotated and/or pivoted with respect to the base 902 as illustrated. In certain embodiments, rotating and/or pivoting the case 906 may require that a release lever 916 be actuated.

Figure 47:
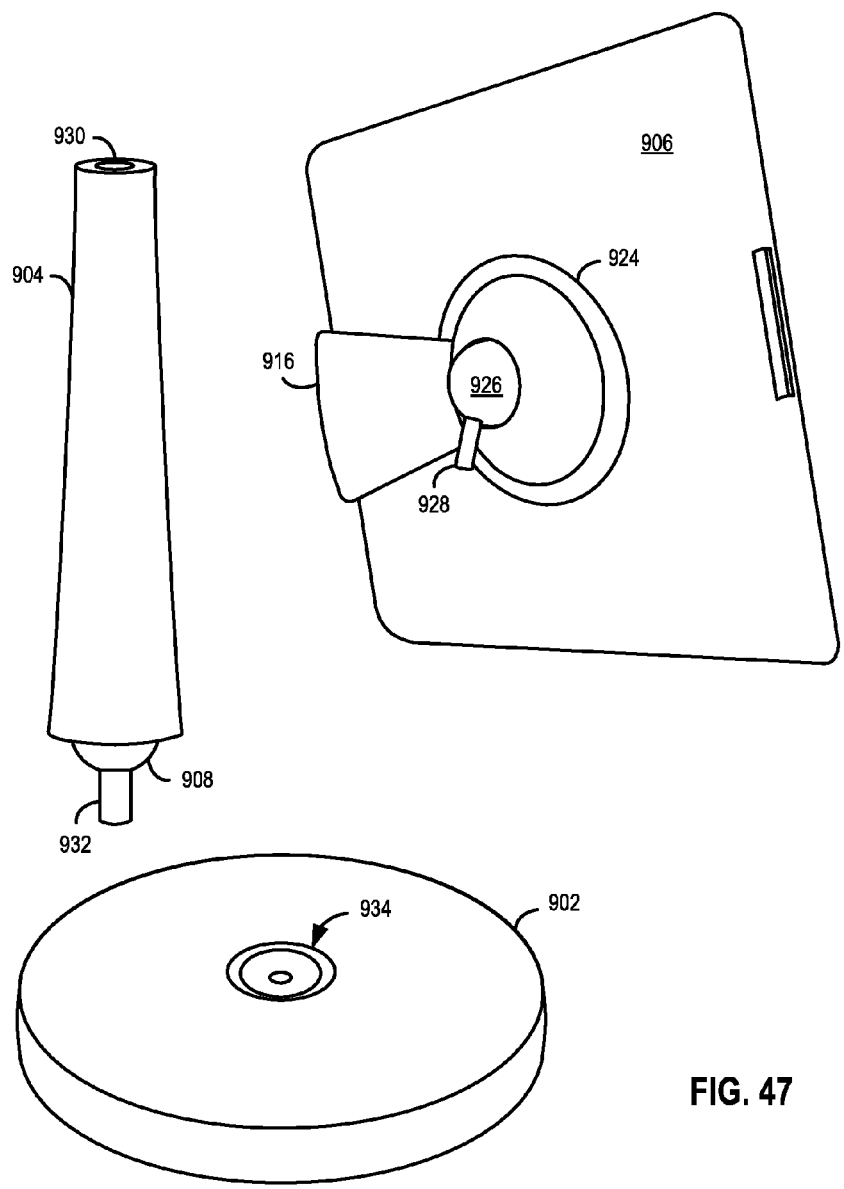
FIG. 47 illustrates a component view of a multi-pivot stand including a base, a lower connection member, a vertical support, and upper connection member, and a case configured to secure a portable electronic device consistent with embodiments of the present disclosure.

FIG. 47 illustrates a component view of a multi-pivot stand including a base 902, a lower connection member 908, a vertical support 904, an upper connection member 926, and a case 906 configured to secure a PED. The stand may further include a release lever 916 and a mount 924 coupled to the case 906.

The vertical support 904 may be rotatably and/or pivotally coupled to the base 902. In certain embodiments, a lower connection member 908 may comprise a ball joint that is rigidly or rotatably coupled to the vertical support 904. The lower connection member 908 may include a lower coupling pin 932 disposed thereon configured to be received by a lower coupling pin receptor 934 disposed in the base 902. In certain embodiments, the lower coupling pin 932 may be securely received by the lower coupling pin receptor 934 using a compression and/or friction fit. In other embodiments, the lower coupling pin 932 may be securely received by the lower coupling pin receptor 934 using a threaded mechanism incorporated into the lower coupling pin 932 and/or the lower coupling pin receptor 934. In further embodiments, the lower coupling pin 932 may be securely received by the lower coupling pin receptor 934 using a mechanical latching mechanism incorporated into the lower coupling pin 932 and/or the lower coupling pin receptor 934.

The vertical support 904 may be rotatably and/or pivotally coupled to the case 906. In certain embodiments, an upper connection member 926 may comprise a ball joint that is rigidly or rotatably coupled to the case 906 via, in certain embodiments, a mount 924. In some embodiments, the case 906 and/or upper connection member 926 may be selectively detached and/or attached from the mount 924.

The upper connection member 926 may include an upper coupling pin 928 disposed thereon configured to be received by an upper coupling pin receptor 930 disposed in the vertical support 904. In certain embodiments, the upper coupling pin 928 may be securely received by the upper coupling pin receptor 930 using a compression and/or friction fit. In other embodiments, the upper coupling pin 928 may be securely received by the upper coupling pin receptor 930 using a threaded mechanism incorporated into the upper coupling pin 928 and/or the upper coupling pin receptor 930. In further embodiments, the upper coupling pin 928 may be securely received by the upper coupling pin receptor 930 using a mechanical latching mechanism incorporated into the upper coupling pin 928 and/or the upper coupling pin receptor 930. In certain embodiments, a release lever 916 may be configured to selectively pivotally and/or rotationally lock and release the upper connection member 926 and/or the lower connection member 908.

Figure 48:
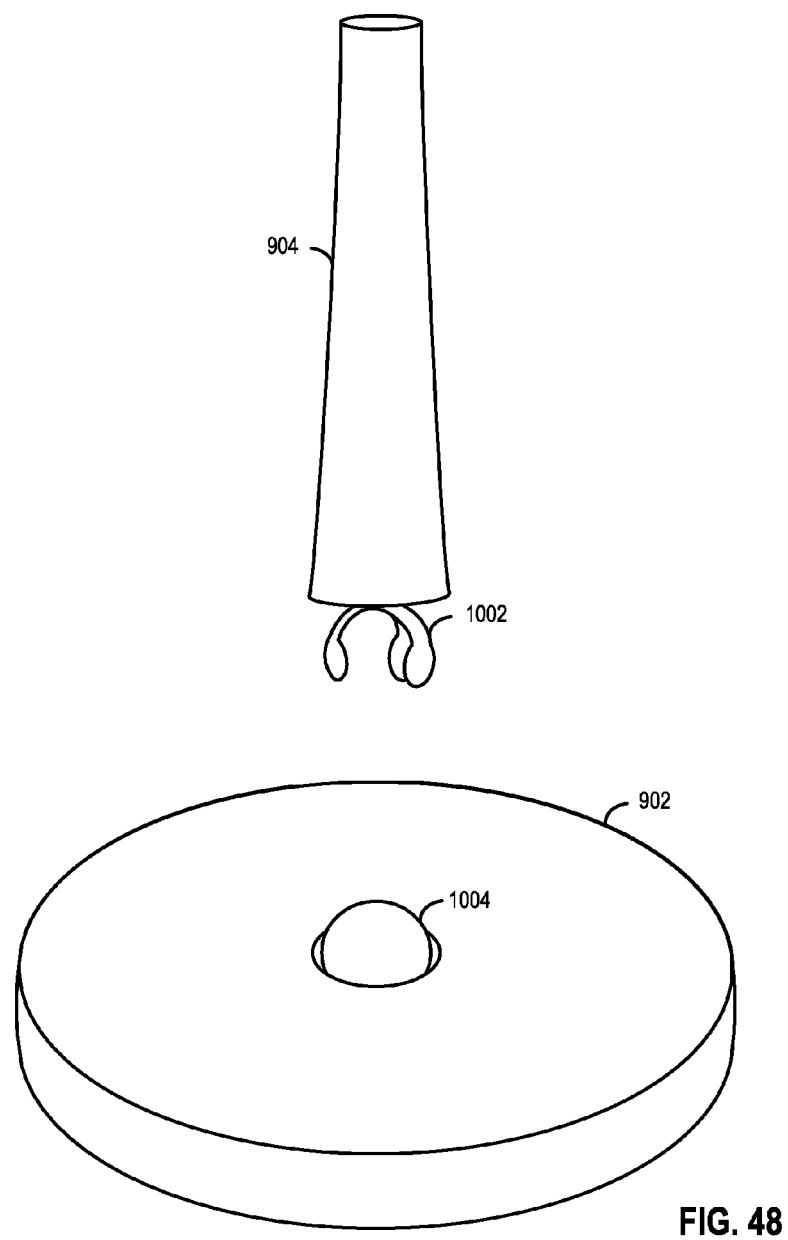
FIG. 48 illustrates a base and a vertical support configured to be pivotably coupled via a lower connection member consistent with embodiments of the present disclosure.

FIG. 48 illustrates a base 902 and a vertical support 904 configured to be pivotably coupled via a lower connection member 1002, 1004. As illustrated, the lower connection member may comprise a base ball 1004 rigidly coupled to the base 902. A vertical support ball receptor 1002 coupled to the vertical support 904 may be configured to mechanically and/or frictionally grasp the base ball 1004. In certain embodiments, the vertical support 904 may be rotated and/or pivoted relative to the base 902 via the lower connection member 1002, 1004 independent of a selective release and locking mechanism such as, for example, a release lever. Alternatively, the vertical support 904 may be rotated and/or pivoted relative to the base 902 via the lower connection member 1002, 1004 at varying degrees of resistance based on the actuation of a selective release and locking mechanism.

Figure 49:
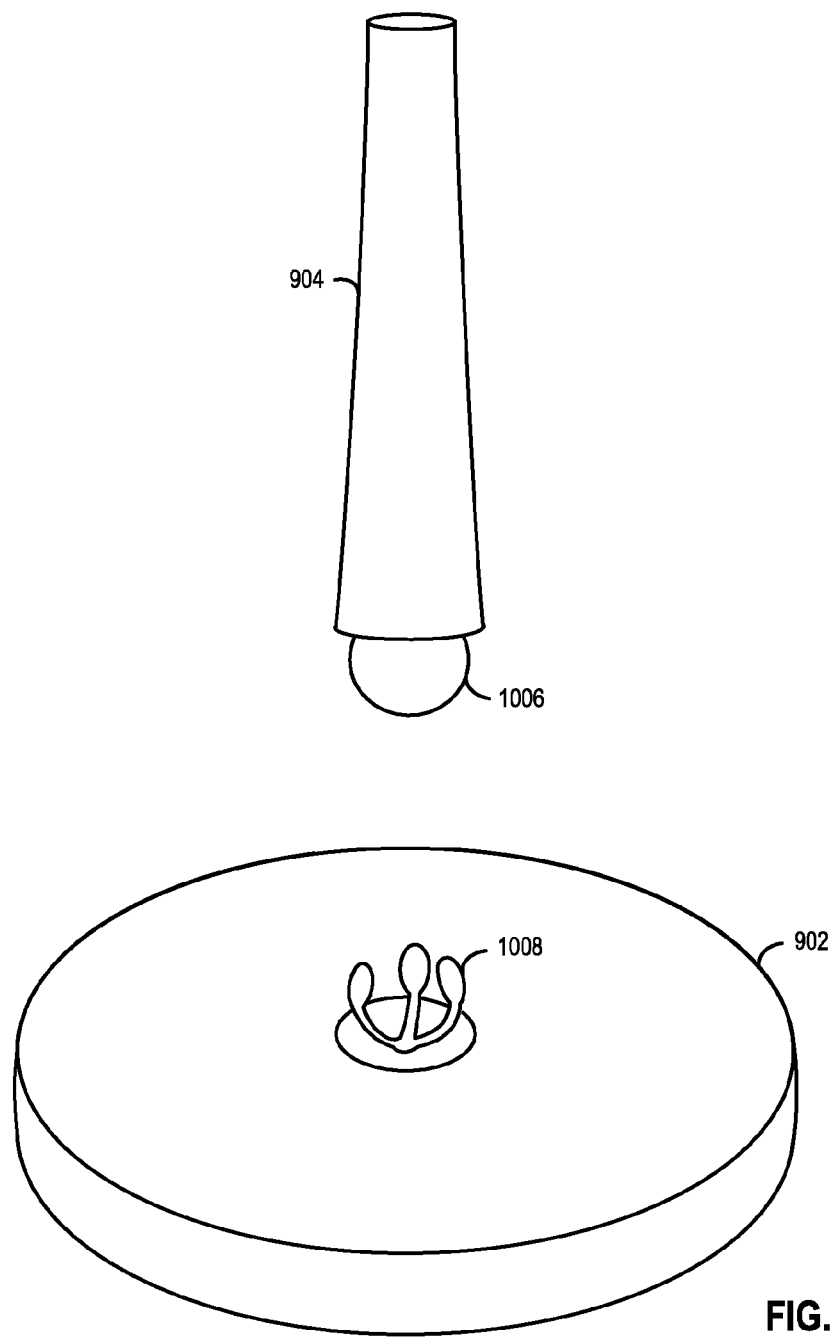
FIG. 49 illustrates a base and a vertical support configured to be pivotably coupled via another lower connection member consistent with embodiments of the present disclosure.

FIG. 49 illustrates a base 902 and a vertical support 904 configured to be pivotably coupled via another lower connection member 1006, 1008. As illustrated, the lower connection member may comprise a vertical support ball 1006 rigidly coupled to the vertical support 904. A base ball receptor 1008 coupled to the base 902 may be configured to mechanically and/or frictionally grasp the vertical support ball 1006. In certain embodiments, the vertical support 904 may be rotated and/or pivoted relative to the base 902 via the lower connection member 1006, 1008 independent of a selective release and locking mechanism such as, for example, a release lever. Alternatively, the vertical support 904 may be rotated and/or pivoted relative to the base 902 via the lower connection member 1006, 1008 at varying degrees of resistance based on the actuation of a selective release and locking mechanism.

Figure 50:
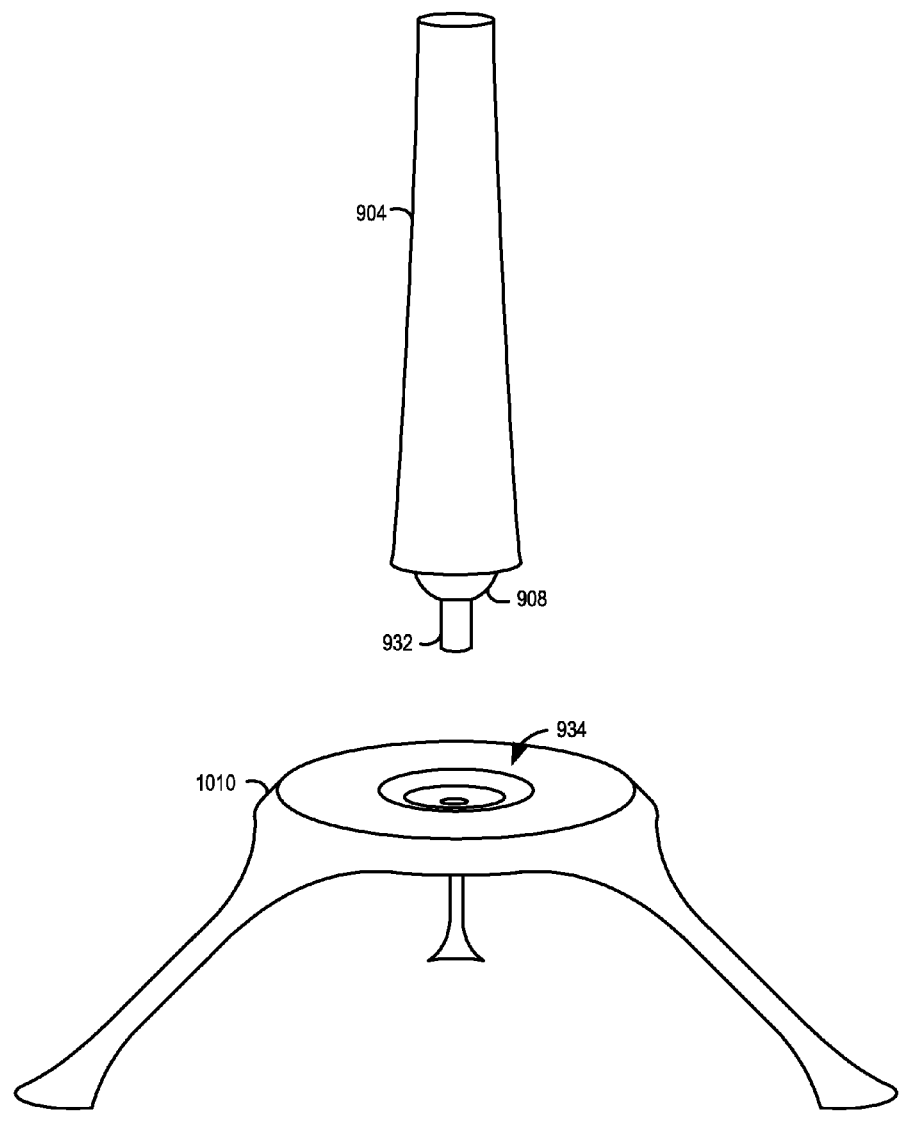
FIG. 50 illustrates an exemplary base and vertical support configured to be pivotably coupled via a lower connection member consistent with embodiments of the present disclosure.

FIG. 50 illustrates an exemplary base 1010 and vertical support 904 configured to be pivotably coupled via a lower connection member 932, 934. As illustrated, the base 1010 may include one or more leg members that may extend onto a surface the base 1010 rests upon. The vertical support 904 may be rotatably and/or pivotally coupled to the base 1010. In certain embodiments, a lower connection member 908 may comprise a ball joint that is rigidly or rotatably coupled to the vertical support 904. The lower connection member 908 may include a lower coupling pin 932 disposed thereon configured to be received by a lower coupling pin receptor 934 disposed in the base 902. In certain embodiments, the lower coupling pin 932 may be securely received by the lower coupling pin receptor 934 using a compression and/or friction fit. In other embodiments, the lower coupling pin 932 may be securely received by the lower coupling pin receptor 934 using a threaded mechanism incorporated into the lower coupling pin 932 and/or the lower coupling pin receptor 934. In further embodiments, the lower coupling pin 932 may be securely received by the lower coupling pin receptor 934 using a mechanical latching mechanism incorporated into the lower coupling pin 932 and/or the lower coupling pin receptor 934.

Figure 51:
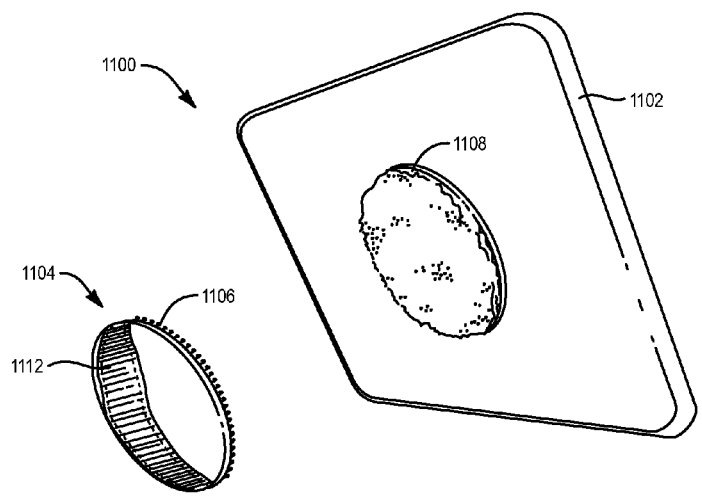
FIG. 51 illustrates a holder for a portable electronic device consistent with embodiments of the present disclosure.
Figure 52:
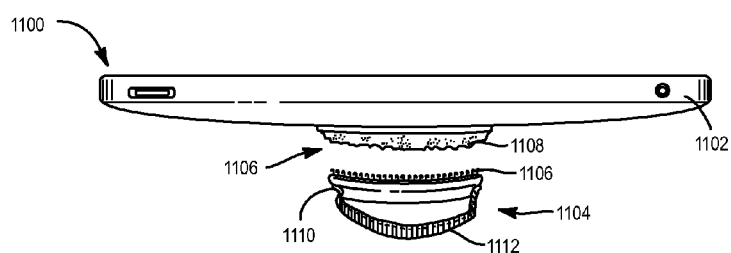
FIG. 52 illustrates another view of the holder illustrated in FIG. 51 consistent with embodiments of the present disclosure.

FIGS. 51-52 illustrate a holder 1100 for a PED. The holder 1100 may include a case 1102, a hand grip 1104, and a coupling mechanism 1106, 1108 configured to securely attach the hand grip 1104 to the case 1102. The case 1102 may be configured to receive, secure, and carry a PED and may incorporate features of other embodiments of cases disclosed herein.

The hand grip 1104 may include a base plate 1110 and a strap 1112 coupled to the base plate 1110. In certain embodiments, a user may be able to slip a part of an appendage (e.g., a hand or forearm) between the base plate 1110 and the strap 1112 to secure the base plate 1110 to the user. In certain embodiments, the strap 1112 may be formed integrally with the base plate 1110. In other embodiments, the strap 1112 may pass through and/or wrap around at least a portion of the base plate 1110.

The inside of the strap 1112 and/or the base plate 1110 may be lined at least in part with a pad and/or soft material (e.g., microfiber) to provide comfortable use. In certain embodiments, the base plate 1110 may be a circular shape, as illustrated, to comfortably conform to the palm of a user's hand. In other embodiments, the base plate 1110 may comprise any suitable and/or ergonomic shape.

The coupling mechanism 1106, 1108 may be configured to detachably secure the base plate 1110 of the hand grip 1104 to the case 1102. In certain embodiments, the coupling mechanism 1106, 1108 may couple the hand grip 1104 to the case in a manner that allows the hand grip 1104 to be rotatable relative to the case 1102. In the illustrated embodiment, the coupling mechanism 1106, 1108 comprises hooks and loops, such as Velcro®, which can easily be separated to allow rotation. For example, a loop portion 1108 may be securely attached to the case 1102, and a hook portion 1106 may be securely attached to the hand grip 1104.

The hand grip 1104 may be secured to the case 1102 when the hook portion 1106 and the loop portion 1108 come into contact. The hand grip 1104 can be rotated relative to the case 1102 by separating the hook portion 1106 and the loop portion 1108 (i.e., by separating the hand grip 1104 from the case 1102), rotating the hand grip 1104 as desired, and recoupling the hook portion 1106 and the loop portion 1108. In certain embodiments, the coupling mechanism 1106, 1108 allows rotation of the case 1102 relative to the hand grip 1104 to any desired degree, including positions less than ninety degrees, thereby allowing the user to find a rotational orientation of the case 1102 that is comfortable. In other embodiments, the coupling mechanism 1106, 1108 may be configured such that only selected orientations are permitted. For example, in one embodiment, the coupling mechanism 1106, 1108 may be configured to only accept a rotational orientation of the case 1102 at 90 degree intervals.

The loop portion 1108 may be attached to the case 1102 with an adhesive. In another embodiment, the loop portion 1108 may be formed integrally with the case 1102. Similarly, the hook portion 1106 may be attached to the base plate 1110 of the hand grip 1104 with an adhesive, or may be integrally formed with the base plate 1110.

The coupling mechanism 1106, 1108 can be any suitable securement device that allows the case 1102 to be rotated relative to the hand grip 1104. For example, the coupling mechanism 1106, 1108 may include a ratcheting swivel or pivot, a rotating grommet mechanism, a ball and socket mechanism, a temporary adhesive, a releasable latch, a clip, one or more buttons, a suction cup, and/or one or more straps allowing for rotational securement.

In certain embodiments, the coupling mechanism 1106, 1108 may couple directly to a PED (not shown). For example, the loop portion 1108 may be constructed and arranged to be attached directly to the back of a PED. An adhesive designed to adhere to the back of the PED may be applied to the back of the loop portion 1108. In other embodiments, the hook portion 1106 may include an adhesive to attach directly to the PED.

FIGS. 53-56 illustrate a holder 1200 for a PED (not shown) in a handheld configuration. The holder 1200 may include a case 1202 configured to receive, secure, and retain a PED, and a sheath 1204. The sheath 1204 may be constructed and arranged to releasably secure to the case 1202. For example, the case 1202 may include one or more cleats 1206, 1208 and the sheath 1204 may include one or more holes 1210 constructed and arranged to releasably attach the sheath 1204 to the cleats 1206, 1208.

Figure 54:
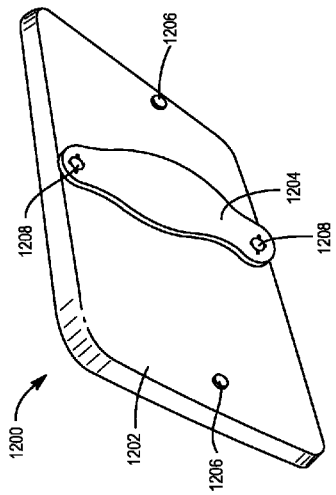
FIG. 54 illustrates another view of the holder illustrated in FIG. 53 consistent with embodiments of the present disclosure.
Figure 53:
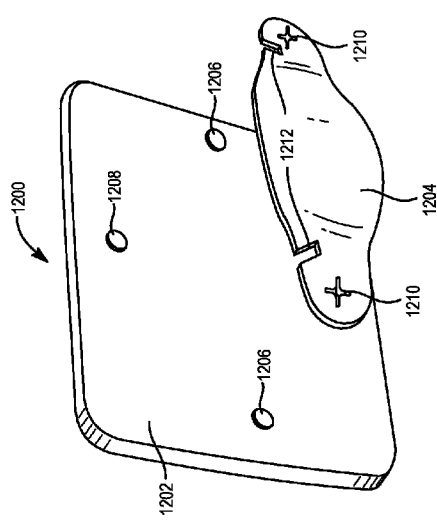
FIG. 53 illustrates a holder for a portable electronic device in a handheld configuration consistent with embodiments of the present disclosure.

FIG. 53 illustrates a back perspective view of the holder 1200 with the sheath 1204 detached from the case 1202. FIG. 54 illustrates a back perspective view of the holder 1200 with the holes 1210 of the sheath 1204 attached to a pair of cleats 1208 in a first orientation. A user can insert a hand or other appendage in between the sheath 1204 and the case 1202 and the sheath 204, such that the holder 1200 can be secured to the user. In FIG. 54, the holder 1200 with the sheath 1204 in the first orientation is configured to be secured such that when the user's hand is positioned with fingers aligned horizontally across the user's body, the PED is oriented in a portrait orientation. Alternatively, if the user's hand is positioned with the fingers aligned vertically, the PED may be oriented in a landscape orientation. In other embodiments, the sheath 1204 can also function as a handle, such that a user can simply grasp the sheath 1204. Accordingly, the sheath 1204, in combination with the grasp of a user, can secure the case 1202 and PED disposed therein to a user.

Figure 56:
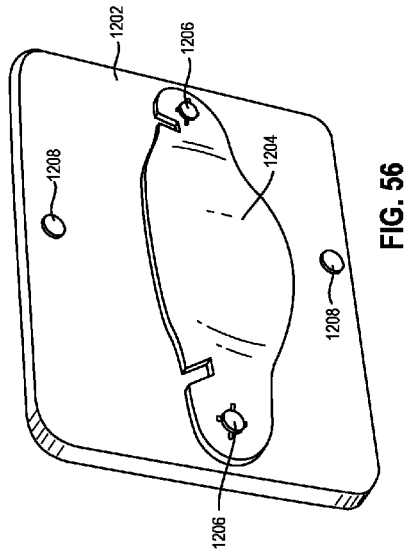
FIG. 56 illustrates another view of the holder illustrated in FIG. 53 consistent with embodiments of the present disclosure.

The sheath 1204 can be detached from the first pair of cleats 1206, as shown in FIG. 56, rotated relative to the case 1202, and attached to a second pair of cleats 1208 on the case 1202, as shown in FIG. 54. In this manner, the sheath 1204 may be rotatable to allow use of the PED in a portrait orientation or a landscape orientation. In certain embodiments, cleats 1206, 1208 may be attached directly to the PED rather than to the case 1202. Further, in certain embodiments, any number of cleats 1206, 1208 may be included allowing for multiple viewing orientations including, or in addition to, a portrait orientation and/or a landscape orientation. Additional holes 1210 can be included on the sheath 1204 to allow for adjustable sizing and/or tension of the sheath 1204 to accommodate varying user hand sizes. Additionally, the inside of the sheath 1204 may be lined with a microfiber material and or a pad to provide comfortable use.

Figure 55:
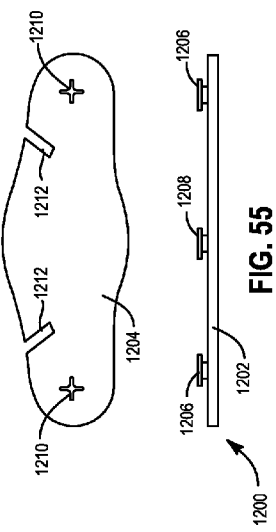
FIG. 55 illustrates a component view of the holder illustrated in FIG. 53 consistent with embodiments of the present disclosure.

FIG. 55 is a top perspective view of the case 1202, and a side view of the sheath 1204. The sheath 1204 may include one or more notches 1212 that, in certain embodiments, may be shaped and configured to receive an end of the case 1202. The sheath 1204 may be formed of a flexible material that can be bent into substantially a "U" shape, such that the end of the case 1202 can be inserted into notches 1212.

Figure 58:
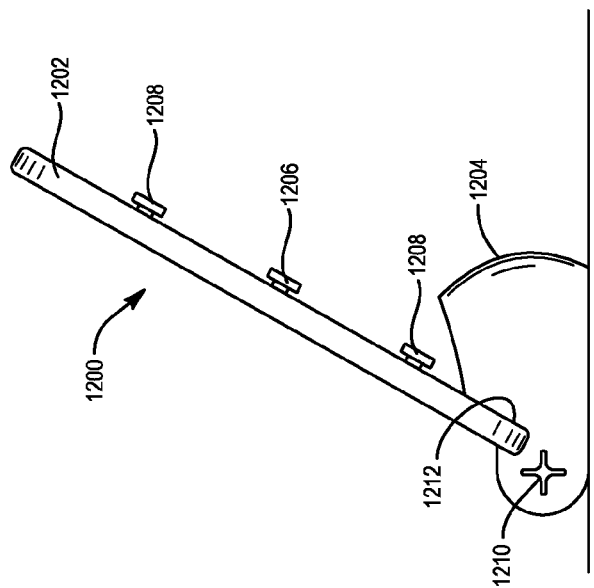
FIG. 58 illustrates another view of the holder illustrated in FIG. 57 consistent with embodiments of the present disclosure.
Figure 57:
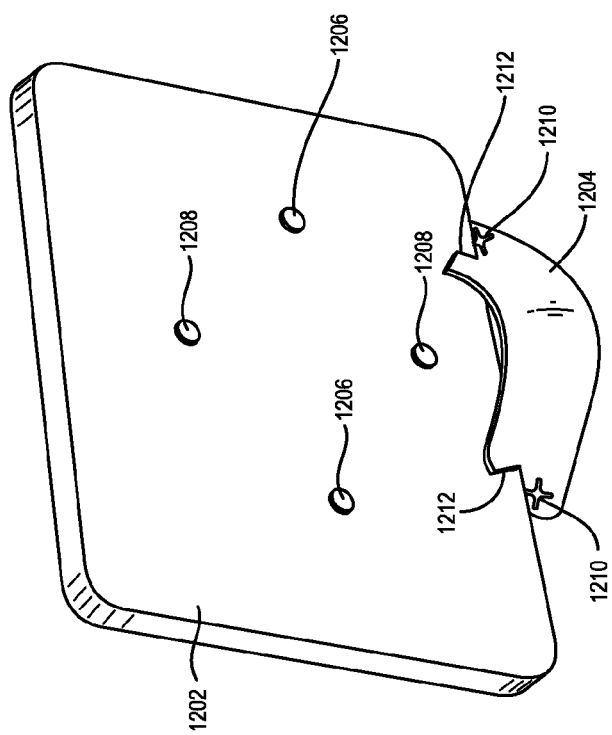
FIG. 57 illustrates the holder illustrated in FIG. 54 in a stand configuration consistent with embodiments of the present disclosure.

FIGS. 57-58 illustrate a holder 1200 for a PED (not shown) in a stand configuration. As illustrated, the bottom edge of the sheath 1204 can be set on a table or other flat surface and can function as a stand for the PED when an end of the case 1202 is disposed in the notches 1212. The sheath 1204 may also be configured to receive the PED at different orientations such that the user can insert the case 1202 and/or the PED 102 therein and view the display from a landscape orientation or, alternatively, a portrait orientation.

In certain embodiments, the sheath 1204 can include a pocket into which the user's hand or other appendage may be inserted. In other embodiments, the sheath 1204 may include an opening through which a user's hand can be inserted. The positioning of the cleats 1206, 1208 may be adjustable (e.g., adjustable via a sliding mechanism), to adjust sizing and/or positioning of the sheath 1204 relative to the case 1202 and/or PED. In other embodiments, the cleats 1206, 1208 may be detachable or configured to be disposed within (i.e., pushed into) the case 1202 when not in use.

FIGS. 59-62 illustrate a rotatable holder 1300 for a PED 102. The holder 1300 may include a case 1302, a hand grip 1304, and a rotatable coupling member 1306 to rotatably attach the hand grip 1304 to the case 1302. The case 1302 may be configured to receive, secure, and carry the PED 102, and may include any combination of the various features and embodiments described in any of the cases described herein.

The case 1302 may further comprise one or more kickstands 1308 that may be constructed and arranged to prop up the case 1302 in a viewing position. In certain embodiments, the kickstands 1308 may be recessed into the case 1302 when not in use, and may rotate out from the case 1302 to prop up the case 1302, as illustrated in FIG. 61 and FIG. 62. In this manner, the kickstands 1308 may allow the case 1302 to operate as a stand to support the PED 102 in a substantially upright and/or elevated position. A first kickstand 1308 may prop the case upright and/or elevated in a landscape orientation, as illustrated in FIG. 61, and a second kickstand 1308 may prop the case upright and/or elevated in a portrait orientation, as illustrated in FIG. 62.

The hand grip 1304 may include a knob or similar structure (e.g., a bulb, a handle, etc) that a user can easily grasp. The hand grip 1304 in combination with a user's grasp may secure the case relative to the user's hand. In the illustrated embodiments, the hand grip 1304 is substantially a half sphere. As can be appreciated, the hand grip 1304 may be formed in any suitable shape that can be easily grasped by a user. Hand grip 1304 may also include finger depressions designed to comfortably receive one or more of a user's fingers. In certain embodiments, the hand grip 1304 can be a mitt and/or similar glove-like or pocket-like structure coupled to the case 1302 by the rotatable coupling member 1306. The mitt can be constructed and arranged with an opening to receive a hand of a user. The mitt may receive the hand of the user with the palm facing toward the back of the case 1302, and may also be configured to receive the hand of the user with the palm facing away from the case 1302. The mitt may further include a mounting plate to provide a rigid surface for attaching the mitt to the rotatable coupling member 1306.

The rotatable coupling member 1306 may be configured to rotatably secure the hand grip 1304 to the case 1302. In the illustrated embodiment, the coupling member 1306 may comprise a ratcheted swivel. The rotatable coupling member 1306 may allow the case 1302 to rotate relative to the hand grip 1304 without decoupling the case 1302 from the hand grip 1304 and without a user releasing the hand grip 1304. The rotation allowed by the rotatable coupling member 1306 may be within a plane substantially parallel to a plane of the back surface of the case 1302 or a plane of the back surface of a PED 102 retained within the case 1302. Accordingly, the rotation of the rotatable coupling member 1306 may facilitate rotation of the PED 102 between a variety of orientations including, for example, a portrait orientation and a landscape orientation. In certain embodiments, the rotatable coupling member 1306 may allow rotation up to at least ninety degrees, from portrait orientation to landscape orientation. The rotatable coupling member 1306 may also allow 360 degree rotation, such that the PED 102 can be rotated to any angle.

A ratcheting mechanism included within the rotatable coupling member 1306 may substantially secure the case 1302 relative to the hand grip 1304 at various increments of rotation. The ratcheting mechanism may be formed by a plurality of female detents interacting with one or more projecting members, such as spheres or half spheres that catch a detent as it passes during rotation. The rotatable coupling member 1306 may allow rotation of the case 1302 relative to the hand grip 1304 to substantially any desired degree, including points less than ninety degrees, thereby allowing the user to find a rotational orientation of the case 1302 that is comfortable. In certain embodiments, the rotatable coupling member 1306 may be configured such that the rotation may only lock into place at 90-degree intervals that correspond with the landscape and portrait orientations of the PED 102.

FIGS. 63-65 illustrate a handheld holder 1400 for a PED 102. The holder 1400 may include a case 1402, and a hand pocket 1404 attached to the case 1402. The case 1402 may be configured to receive, secure, and carry the PED 102, and may include any combination of the various features and embodiments described in any of the cases described herein.

The hand pocket 1404 can be coupled to the back of the case 1402 and be configured to receive a hand of a user. In certain embodiments, the hand pocket 1404 can be constructed and arranged to receive a hand of a user such that a PED 102 inserted into the case 1402 is oriented in a portrait orientation and also constructed and arranged to receive the hand of the user such that the PED 102 is oriented in a landscape orientation. The hand pocket 1404 may be stitched to the back of the case 1402, or otherwise secured using any appropriate securement method or device, including but not limited to an adhesive, hooks and loops, buttons, one or more zippers, and/or clamps. The hand pocket 1404 may also be integrated into the case 1402.

The hand pocket 1404 may include a first opening 1406 to receive a hand of a user and thereby secure the PED 102 relative to the hand of the user. The PED 102 may be secured relative to the hand of the user such that when the user raises the hand substantially near the abdomen or chest, the PED 102 may be oriented in a portrait orientation. In certain embodiments, the user's hand may be received into the hand pocket 1404 with the palm facing toward the back of the PED 102 or, alternatively, with the palm facing away from the PED 102.

The hand pocket 1404 may further include a second opening 1408 to receive the hand of the user and thereby secure the PED 102 relative to the hand of the user such that the PED 102 is oriented in a landscape orientation. In such embodiments, the user may remove a hand from the first opening 1406 and insert the hand into the second opening 1408 to change the orientation of the PED 102. In this manner the case 1402 is rotatable at least ninety degrees and allows operability of the PED 102 in either a portrait or a landscape orientation.

In some embodiments, the holder 1400 may include a pocket 1404 that further includes a third opening 1410 opposite the first opening 1406 and a fourth opening 1412 opposite the second opening 1408. Using these openings 1406, 1408, 1410, and 1412, a hand can be inserted into the hand pocket 1404 from any of four directions separated by ninety degrees, thus allowing orientation of the PED 102 in either of two possible landscape orientations (e.g., a first landscape orientation and then a second landscape orientation at 180 degrees from the first) and in either of two possible portrait orientations (e.g., a first portrait orientation and then a second at 180 degrees from the first). Furthermore, the fingers of a hand inserted into the third opening 1410 may extend partially out of the first opening 1406, as illustrated in FIG. 64. Similarly, the fingers of a hand inserted into the second opening 1408 may extend partially out of the fourth opening 1412.

As illustrated in FIG. 65, the hand pocket 1404 may be connected to the PED 102 and/or case 1402 via a rotatable coupling mechanism 1414, such as a grommet or any other rotatable connection and/or mechanism described herein. In certain embodiments, the pocket 1404 may comprise a slightly rigid or reinforced side configured to be positioned adjacent to the PED 102 and/or the case 1402 and to be coupled to the rotatable coupling mechanism 1414.

Figure 67:
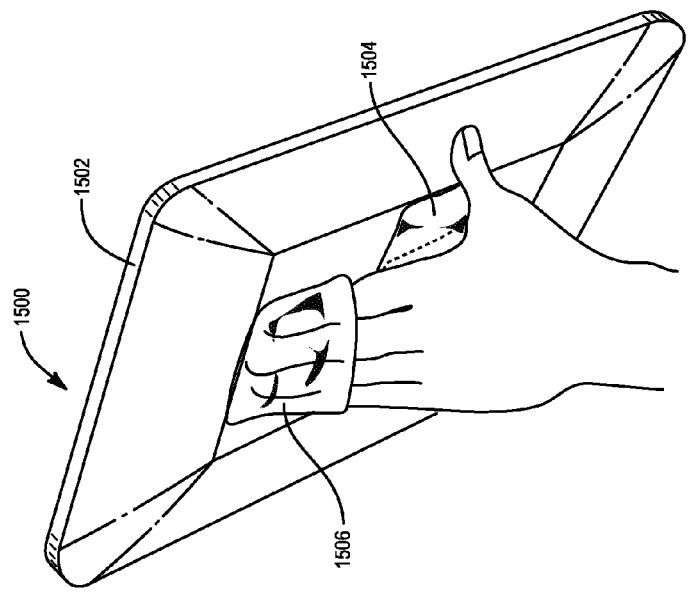
FIG. 67 illustrates another view of the handheld holder illustrated in FIG. 66 consistent with embodiments of the present disclosure.
Figure 66:
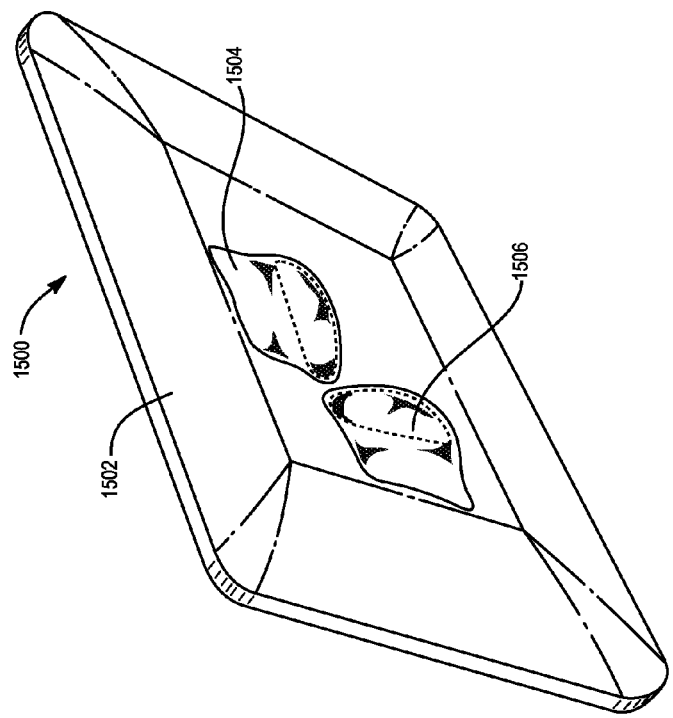
FIG. 66 illustrates a handheld holder for a portable electronic device consistent with embodiments of the present disclosure.

FIGS. 66-67 illustrate a handheld holder 1500 for a PED (not shown). The holder 1500 may include a case 1502 and one or more hand pockets 1504, 1506 coupled to the case 1502. The case 1502 may be configured to receive, secure, and carry the PED, and may include any combination of the various features and embodiments described in any of the cases described herein.

One hand pocket 1506 may be oriented to receive a hand of a user and thereby secure the holder such that a PED secured in the case 1502 is oriented in a portrait orientation. Another hand pocket 1504 may be oriented to receive the hand of the user and thereby secure the holder such that a PED secured in the case 1502 is oriented in a landscape orientation. The user can insert the hand into either of the hand pockets 1504, 1506, depending on the desired orientation of the PED. In this manner, the case 1502 is rotatable at least ninety degrees and allows operability of the PED in either a portrait or a landscape orientation. In another embodiment, the holder 1500 may comprise additional hand pockets 1504, 1506 to allow additional degrees of rotation.

The hand pockets 1504, 1506 may be stitched to the back of the case 1502, or otherwise be secured using any appropriate securement method or device, including but not limited to an adhesive, hook and loop mechanisms, buttons, one or more zippers, and/or clamps. The hand pockets 1504, 1506 may also be integrated into the case 1502. In certain embodiments, the hand pockets 1504, 1506 may be movable to one or more positions on the back of the case 1502. For example, a back side of the case 1502 may include a loop portion of a hook and loop mechanism, and the hand pockets 1504, 1506 may be attached anywhere on the backside of the case 1502 using a hook portion disposed thereon. In this manner, the hand pockets 1504, 1506 may be positioned on the case 1502 to allow for a variety of viewing orientations.

Figure 68:
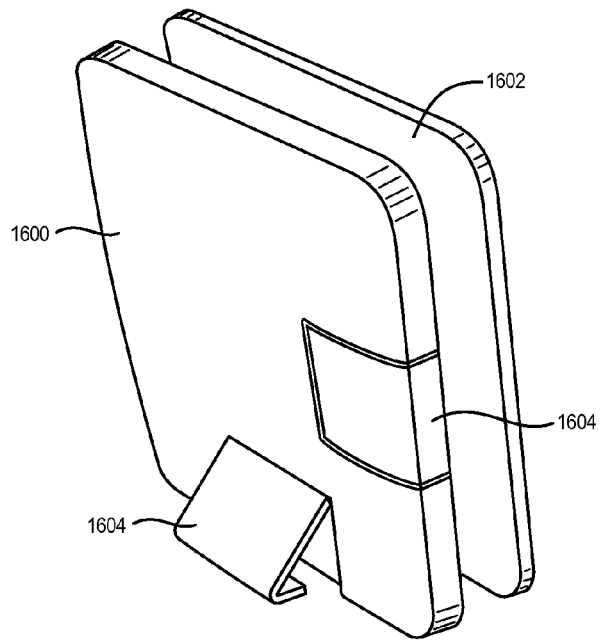
FIG. 68 illustrates a case for a portable electronic device consistent with embodiments of the present disclosure.
Figure 69:
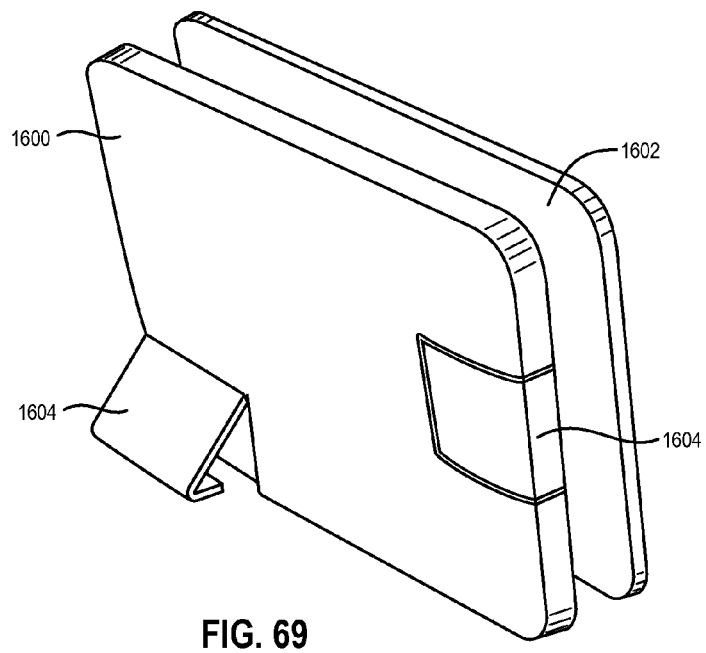
FIG. 69 illustrates another view of the case illustrated in FIG. 68 consistent with embodiments of the present disclosure.

FIGS. 68-69 illustrate a case 1600 for a PED (not shown). The case 1600 may be configured to receive, secure, and carry the PED, and may include any combination of the various features and embodiments described in any of the cases described herein. As illustrated, the case may include one or more kickstands 1604 configure to allow the case 1600 to function as a stand depending on the orientation of the kickstands 1604 (e.g., depending on whether kickstands are deployed). In certain embodiments, the kickstands 1604 may be recessed into the case 1600 when not in use to prop the case 1600 in an upright and/or elevated position, and may rotate out from the case 1600 for use, as illustrated. The kickstands 1604 may allow the case to operate as a stand to support a PED in a substantially upright and/or elevated position. A first kickstand 1604 may prop the case 1600 upright and/or elevated in a landscape orientation, as illustrated in FIG. 68, and a second kickstand 1604 may prop the case 1600 upright and/or elevated in a portrait orientation, as illustrated in FIG. 69.

The case 1600 may also include a cover 1602 configured to be positioned over a PED inserted into the case 1600 and to substantially enclose and/or protect the PED. In certain embodiments, the cover 1602 may snap into the case 1600, thereby enclosing a PED disposed therein. In other embodiments, the cover 1602 may be strapped or fastened using any other mechanical means into the case 1600. In certain embodiments, the cover 1602 can be used to protect a PED disposed within the case 1600 when the PED is not in use. In other embodiments, the cover 1602 may comprise a transparent window through which a user can view and/or manipulate the PED, and thus the cover 1602 can remain positioned over the PED, both during use and when not in use. In certain embodiments, a window included in the cover 1602 may be permanently open or may alternatively be selectively openable.

Figure 70:
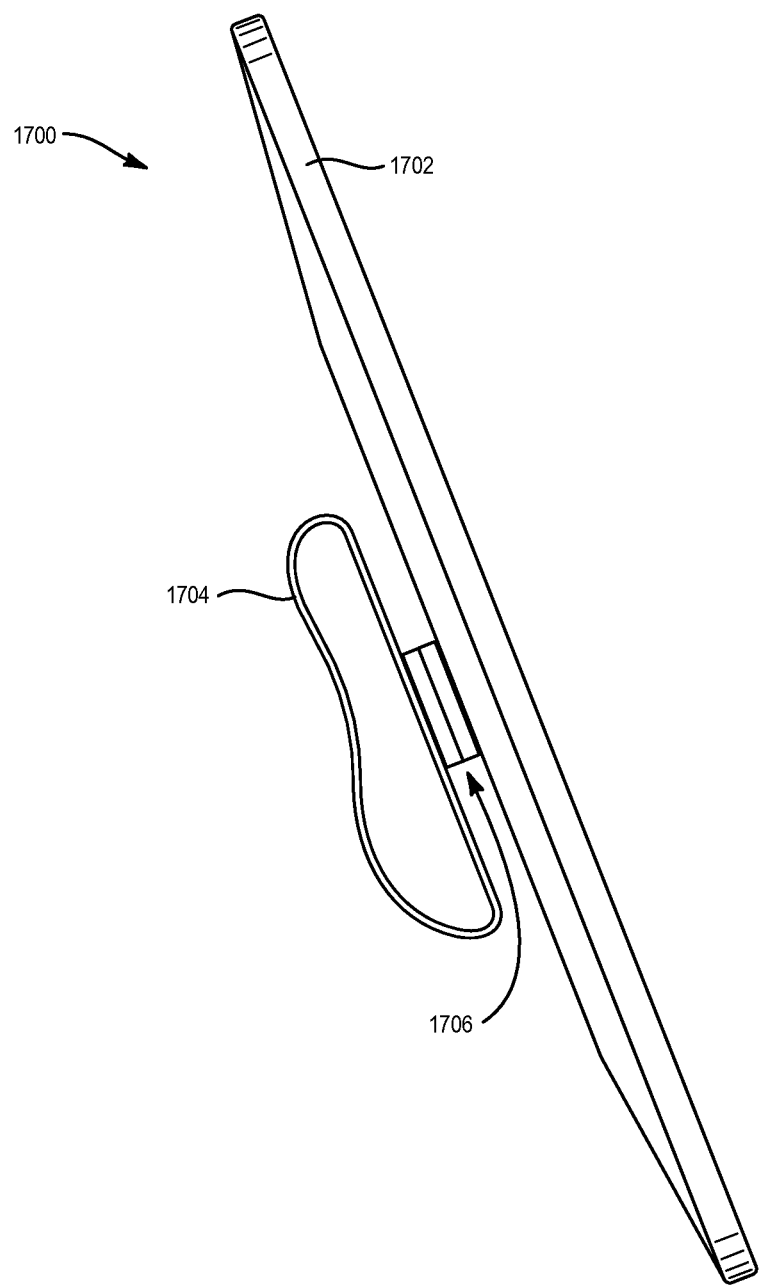
FIG. 70 illustrates a handheld holder for a portable electronic device consistent with embodiments of the present disclosure.

FIG. 70 illustrates a handheld holder 1700 for a PED (not shown). The handheld holder 1700 may comprise a case 1702 and a hand pocket 1704 coupled to the case 1702 via a rotatable coupling mechanism 1706. In certain embodiments, the rotatable coupling mechanism 1706 may be a grommet or any other rotatable connection and/or mechanism described herein, and may be coupled directly to a PED rather than the case 1702. The case 1702 may be configured to receive, secure, and carry the PED, and may include any combination of the various features and embodiments described in any of the cases described herein. Further, the hand pocket 1704 may be a pocket, a strap, a pouch, a knob, a handle, and or any interface allowing a user's hand or other appendage to grasp or otherwise be secured into the hand pocket 1704.

The rotatable coupling mechanism 1706 may allow a PED disposed in the case 1702 to be viewed in a variety of viewing orientations relative to the hand pocket 1704. For example, in certain embodiments, a user may secure the hand pocket 1704 in a particular position (e.g., by securing a hand in the hand pocket 1704 or the like), and rotate the case 1702 in a variety of orientations relative to the hand pocket 1704 using the rotatable coupling mechanism 1706. In certain embodiments, the rotatable coupling mechanism 1706 may be configured to have one or more locking positions where the rotatable coupling mechanism 1706 requires a higher degree of rotational resistance to move the rotatable coupling mechanism from the non-locking positions. For example, the rotatable coupling mechanism 1706 may including locking positions where the case 1702 relative to the hand pocket 1704 is in a portrait orientation and a landscape orientation.

FIGS. 71-73 illustrate a rotatable coupling mechanism 1706. The rotatable coupling mechanism 1706 may be included in any of the case designs detailed herein and be used in such designs to change the orientation of a PED to one or more desired orientations (e.g., landscape and/or portrait). The rotatable coupling mechanism 1706 may be substantially any cylindrical shape (e.g., a long shaft, a short cylinder similar to a hockey puck, etc.) and may comprise two complementary halves 1708, 1710 configured to rotate relative to each other and interact so as to create one or more locking positions. The complementary surfaces of the halves 1708, 1710 may comprise one or more protrusions 1712 and one or more depressions 1714 to implement a locking position. The protrusions 1712 of a first half 1708 may complement and conform to the depressions 1714 of a second half 1710, as illustrated in FIG. 72. Similarly, the protrusions 1712 of the second half 1710 may complement and conform to the depressions 1714 of the first half 1708. As the first half 1708 rotates relative to the second half 1710, the protrusions 1712 of the first half 1708 may rotate between non-locking positions (i.e., where the protrusions 1712 of the first half 1708 abut the protrusions 1712 of the second half 1710) and locking positions (i.e., where the protrusions 1712 of the first half 1708 abut the depressions 1714 of the second half 1710). The protrusions 1712 and depressions 1714 may alternate as illustrated and may be any functionally appropriate shape including, a wave shape, a set of complementary teeth, and the like.

In certain embodiments, the protrusions 1712 may have a rounded shape and be configured such that a first protrusion 1712 on a first half 1708 allows a second protrusion 1712 on the opposing second half 1710 to smoothly rotate over and past the first protrusion as the halves 1708, 1710 rotate relative to one another. Similarly, the depressions 1714 may have a rounded shape. Moreover, the transition from a protrusion 1712 to a depression 1714 may be seamless and continuous to form a gentle rounded surface as illustrated. Accordingly, the halves 1708, 1710 can easily be rotated relative to one another, and thereby transitioned between locking positions, while the halves 1708, 1710 are in abutment to one another and without being separated.

In other embodiments, the protrusions 1712 may be jagged without a rounded shape. For example, the protrusions 1712 may comprise complementary teeth. In some embodiments, the teeth may be triangular in shape, alternating between protrusions 1712 and depressions 1714. In certain embodiments, the halves 1708, 1710 may need to be pulled apart and separated before rotation can occur. In other embodiments, the transition from protrusion 1712 to depression 1714 may be more pronounced and/or non-continuous, such that there is a separation between each protrusion 1712 and depression 1714.

In the illustrated embodiments, each half 1708, 1710 comprises four protrusions 1712 and four depressions 1714. Accordingly, the rotatable coupling mechanism 1706 comprises four locking positions. The four locking positions may each correspond to ninety degrees of rotation. As can be appreciated, additional protrusions 1712 and depressions 1714 may be provided so as to allow additional locking positions at smaller degrees of rotation. Moreover, fewer protrusions 1712 and depressions 1714 may be provided as well to provide fewer locking positions.

The rotatable coupling mechanism 1706 may further comprise a connecting member 1716, such as a rod or elastic piece, configured as an axis about which the halves 1708, 1710 rotate. The connecting member 1716 may also secure the halves 1708, 1710 relative to one another. In some embodiments, the connecting member 1716 may include one or more biasing members configured to urge the first half 1708 and second half 1710 together. For example, the connecting member 1716 may pass through the two halves 1708, 1710 and be spring-loaded with springs 1718 on the outside of the two halves 1708, 1710 to push the two halves 1708, 1710 together. Alternatively, the connecting member 1716 itself may comprise a biasing member, such as a spring 1718 or an elastic material, that may provide a biasing force, as illustrated in FIG. 73. The biasing force may be provided to urge the halves 1708, 1710 toward one another. The biasing force may also urge the rotatable coupling mechanism 1706 toward a locking position (i.e., by urging the protrusions 1712 of the first half 1708 toward a position abutting the depressions 1714 of the second half 1710 and vice versa). In other embodiments, an external force such as, for example, gravity may provide a biasing force to urge the halves 1708, 1710 toward one another.

FIGS. 74-77 illustrate a rotatable case 1800 for a PED 102. The case 1800 may include a holder 1802 configured to receive, secure, retain, and carry the PED 102, and may include any combination of the various features and embodiments described in any of the cases and/or holders described herein. As illustrated, the holder 1802 may be configured to retain the PED 102 by mechanically securing the PED 102 at its corners. In certain embodiments, the holder 1802 may retain the PED 102 using a compression and/or snap fit mechanism.

The case 1800 may further include a cover 1804, 1806 comprising a base portion 1804 and a support portion 1806. The base portion 1804 and the support portion 1806 may be coupled at a fold 1808 allowing for the base portion 1804 to hinge with respect to the support portion 1806. In certain embodiments, the base portion 1804 and the support portion 1806 may be formed integrally and the fold 1808 may be formed as part of the base portion 1804 and the support portion 1806. In other embodiments, the base portion 1804, the support portion 1806, and the fold 1808 may be separate components. In certain embodiments, the holder 1802 and/or the cover 1804 may provide protection to an enclosed PED 102. For example, the holder 1802, the base portion 1804, and/or the support portion 1806 may be reinforced with padding, metal, plastic, cardboard, rubber, and/or other materials or any combination thereof.

In certain embodiments, the fold 1808 may include various folds, bends, and/or curvatures in material to obtain desirable resistance and/or resilience characteristics. For the example, the fold 1808 may be configured to function as a bi-stable, tri-stable, or N-stable fold, allowing a user to selectively vary the relative angle between the base portion 1804 and the support portion 1806 into one or more predetermined angles. In some embodiments utilizing an N-stable fold, the support portion 1806 may effectively "snap" into one or more predetermined positions relative to the base portion 1804.

Figure 74:
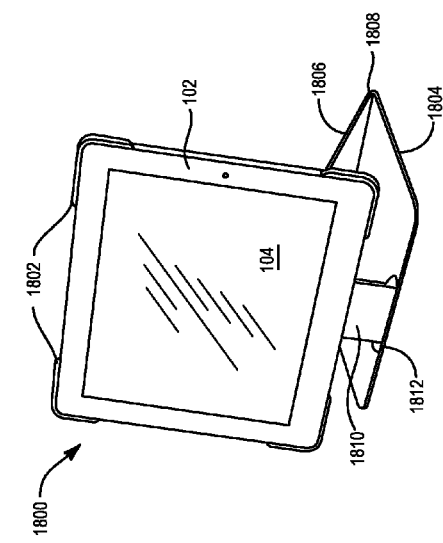
FIG. 74 illustrates a rotatable case for a portable electronic device oriented in a landscape configuration consistent with embodiments of the present disclosure.
Figure 75:
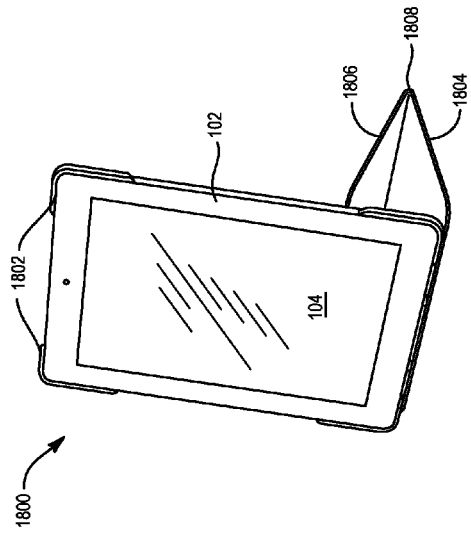
FIG. 75 illustrates the rotatable case illustrated in FIG. 74 oriented in a portrait configuration consistent with embodiments of the present disclosure.
Figure 77:
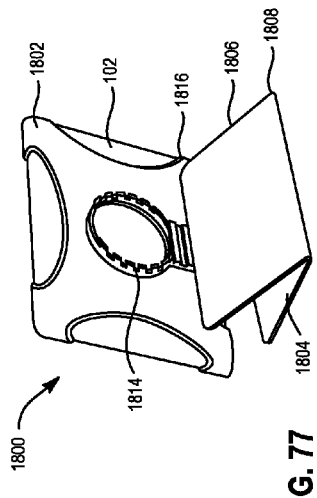
FIG. 77 illustrates a rear perspective view of the rotatable case illustrated in FIG. 74 oriented in a landscape consistent with embodiments of the present disclosure.

The base portion 1804 may be coupled to a vertical support 1810 via a hinge 1812. In certain embodiments, the vertical support 1810 may be configured to support in part the holder 1802 in an upright and/or elevated position allowing for viewing of the display 104 of the PED 102. The vertical support 1810 may be coupled to the holder 1802 via a rotational mechanism 1814 allowing for variable rotation of the holder 1802 relative to the vertical support 1810. For example, as illustrated in FIG. 77, the rotational mechanism 1814 may include a rotational grommet secured to the vertical support 1810 and the holder 1802 allowing for variable rotation of the holder 1802 relative to the vertical support 1810. In other embodiments, the rotational mechanism 1814 may include a ratcheting swivel or pivot, a ball and socket mechanism, a temporary adhesive, a releasable latch, a clip, one or more buttons, a suction cup, and/or one or more straps allowing for rotational securement. In certain embodiments, the rotational mechanism 1814 may snap into certain specific rotational orientations (e.g., portrait orientation, as illustrated in FIG. 75, and/or landscape orientation, as illustrated in FIG. 74) and require rotational force to move to a different specific orientation. In alternative embodiments, the rotation mechanism 1814 may not snap into specific orientations but may allow for rotational articulation in any number of orientations. Further, in certain embodiments, the vertical support 1810 may be coupled to the holder 1802 via a non-rotatable connection including, for example, a fixed and/or hinged mechanism.

The vertical support 1810 may be configured to allow for its length to be adjusted using a sliding track or similar adjustable mechanism. In some embodiments, by adjusting the length of the vertical support 1810, the relative distance between the base portion 1804 and the holder 1802 may be adjusted. In certain embodiments, the length of the vertical support 1810 may be configured to be adjusted to one or more predetermined positions via a selective locking mechanism or the like. In other embodiments, the vertical support 1810 may have a fixed length.

As illustrated in FIG. 77, the back of the vertical support 1810 may include one or more channels 1816. In some embodiments, the channels may be configured to receive an edge of the support portion 1806. To configure the case 1800 to support the PED 102 in an upright and/or elevated position, the base portion 1804 may be rotated relative to the vertical support 1810 about the hinge 1812 and rested on a work surface. The angle of the support portion 1806 may be adjusted relative to the base portion 1804 via the fold 1808, thereby adjusting a viewing angle of the PED 102 included in the holder 1802. When a desired angle is achieved, an end of the support portion 1804 may be positioned in one of the channels 1816, allowing for the desired viewing angle to be sustained by the case 1800. In some embodiments, the end of the support portion 1806 may be secured in the channels 1816 via a compression fit. In other embodiments, a selective securement mechanism may be used to secure the end of the support portion 1806 in the channels 1816 that may include a magnetic connection, a snap, a button, a clip, or the like.

Figure 76:
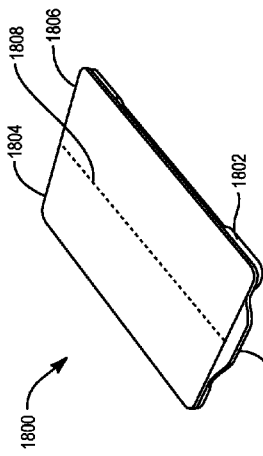
FIG. 76 illustrates the rotatable case illustrated in FIG. 74 configured in a stowage mode consistent with embodiments of the present disclosure.

When the PED 102 is not in use, the case 1800 may be reconfigured by a user into a stowage configuration, as illustrated in FIG. 76. To reconfigure the case 1800 in a stowage configuration, the base portion 1804 and the support portion 1806 may be articulated around the hinge 1812 so as to cover the display 104 of the PED 102. In such a configuration, the fold 1808 may be adjusted to allow the base portion 1804 and the support portion 1806 to be substantially co-planar. In certain embodiments, reconfiguration of the case 1800 in a stowage configured may require that the length of the vertical support 1810 be adjusted using a sliding track mechanism or the like. In some embodiments, the base portion 1804 and the support portion 1806 may be secured to the holder 1802 and/or the PED 102 in the stowage configuration via a magnetic connection, one or more releasable clips, straps, and/or other locking mechanisms allowing for the case 1800 to be selectively locked into a stowage configuration and selectively released from the stowage configuration.

FIGS. 78-81 illustrate a support 1900 for a PED 102. The support 1900 may include a holder 1902, 1904 configured to receive, secure, retain, and carry the PED 102, and may include any combination of the various features and embodiments described in any of the cases and/or holders described herein. As illustrated, the holder 1902, 1904 may be configured to retain the PED 102 by mechanically securing the PED 102 using a compression fit mechanism or the like. In certain embodiments, the holder 1902, 1904 may include a main portion 1902 and a selectively removable top portion 1904. A PED 102 may be disposed within the main portion 1902 when the top portion 1904 is removed and securely locked within the main portion 1902 when the top portion 1904 is securely coupled to the main portion 1902 using a selective latching mechanism 1906 or the like. In some embodiments, the main portion 1902 and the top portion 1904 may be aligned using one or more ribs and/or channels or similar alignment mechanism.

Figure 78:
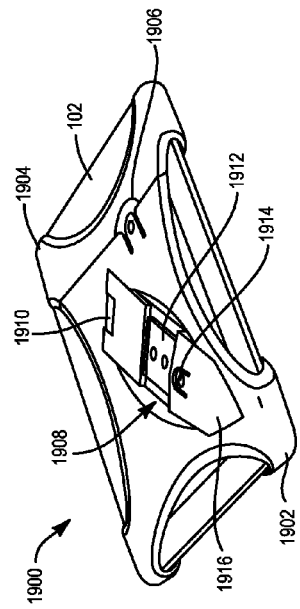
FIG. 78 illustrates a support for a portable electronic device consistent with embodiments of the present disclosure.
Figure 80:
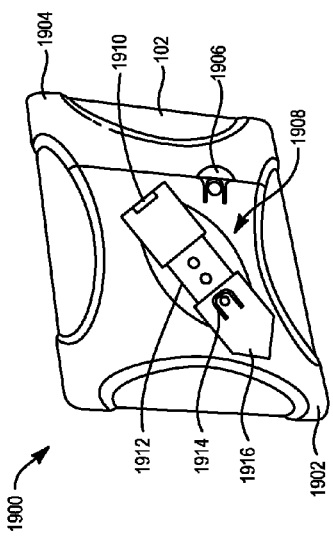
FIG. 80 illustrates the support illustrated in FIG. 78 configured in a portrait orientation consistent with embodiments of the present disclosure.
Figure 79:
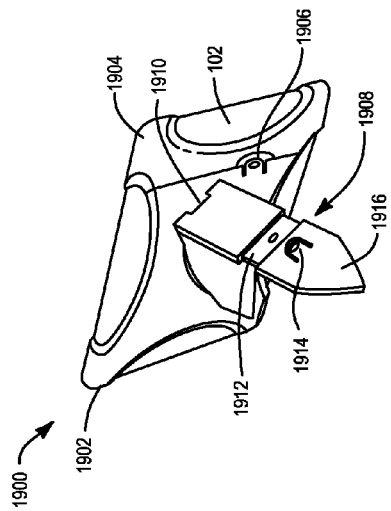
FIG. 79 illustrates the support illustrated in FIG. 78 consistent with embodiments of the present disclosure.
Figure 81:
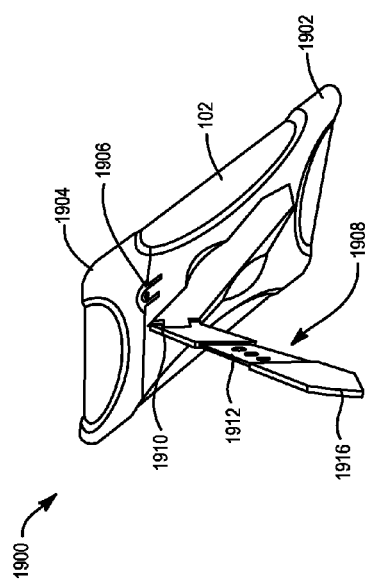
FIG. 81 illustrates the support illustrated in FIG. 78 configured in a landscape orientation consistent with embodiments of the present disclosure.

In certain embodiments, the holder 1902, 1904 may further comprise one or more kickstands 1908 that may be configured and arranged to prop up the holder 1902, 1904 in a viewing position. The kickstand 1908 may be recessed into the holder 1902, 1904 when not in use, as illustrated in FIG. 78 and FIG. 79, and may be rotated out from the holder 1902, 1904 via a hinge 1910 to prop up the holder 1902, 1904, as illustrated in FIG. 80 and FIG. 81. In this manner, the kickstand 1908 may allow the support 1900 to operate as a stand to support the PED 102 disposed in the holder 1902, 1904 in a substantially upright and/or elevated position. In certain embodiments, by adjusting the angle of the kickstand 1908 relative to the holder 1902, 1904, a viewing angle of a PED 102 disposed within the support 1900 may be adjusted. For example, by increasing the degree to which the kickstand 1908 is rotated out from the holder 1902, 1904 via the hinge 1910, the PED 102 may be viewed at a less upright and/or elevated angle. Similarly, by decreasing the degree to which the kickstand 1908 is rotated out from the holder 1902, 1904, the PED 102 may be viewed at a more upright and/or elevated angle. In certain embodiments, the hinge 1910 may be configured to allow the kickstand 1908 to rotate out from the holder 1902, 1904 at one or more predetermined angles using, for example, a ratcheting mechanism or the like.

The length of the kickstand 1908 may be adjusted using a sliding and/or ratcheting mechanism 1912. In certain embodiments, by adjusting the length of the kickstand 1908, the relative viewing angle of the PED 102 disposed within the support 1900 may be adjusted. For example, by lengthening the kickstand 1908, the PED 102 may be viewed at a more upright and/or elevated angle. Similarly, by shortening the kickstand 1908, the PED 102 may be viewed at a less upright and/or elevated angle. In certain embodiments, the length of the kickstand 1908 may be configured to be adjusted to one or more predetermined positions via a selective locking mechanism 1914 or the like. In alternative embodiments, the kickstand 1908 may have a fixed length.

A rest 1916 may be disposed at an end of the kickstand 1908 and be configured to rest on a working surface when the support 1900 is in use. In certain embodiments, the rest 1916 may include one or more edges configured to be positioned parallel to a working surface when the support 1900 is oriented in one or more orientations. For example, as illustrated in FIG. 80, the rest 1916 may include an edge configured to sit parallel to a working surface when the PED 102 is viewed in a portrait configuration. Similarly, as illustrated in FIG. 81, the rest 1916 may include an edge configured to sit parallel to a working surface when the PED 102 is viewed in a landscape orientation. In this manner, by lifting and rotating the support 1900, a PED 102 disposed therein may be viewed in a landscape and/or a portrait orientation. In certain embodiments, the rest 1916 may comprise a material configured to prevent the rest 1916 from easily sliding along the work surface (e.g., rubber or the like).

FIGS. 82-84 illustrate a rotatable support 2000 for a PED 102. The support 2000 may include a holder 2002, 2004 configured to receive, secure, retain, and carry the PED 102, and may include any combination of the various features and embodiments described in any of the cases and/or holders described herein. As illustrated, the holder 2002, 2004 may be configured to retain the PED 102 by mechanically securing the PED 102 using a compression fit mechanism or the like. In certain embodiments, the holder 2002, 2004 may include a main portion 2002 and a selectively removable top portion

2004. A PED 102 may be disposed within the main portion 2002 when the top portion 2004 is removed and securely locked within the main portion 2002 when the top portion 2004 is securely coupled to the main portion 2002 using a selective latching mechanism or the like. In certain embodiments, a depression 2006 integrated into the main portion 2002 and/or the top portion 2004 may be utilized by a user to aid in removing the top portion 2004 from the main portion 2002. In some embodiments, the main portion 2002 and the top portion 2004 may be aligned using one or more ribs and/or channels or a similar alignment mechanism.

The holder 2002, 2004 may define a window allowing for a display 104 of the PED 102 to be viewed by a user. Further, the holder 2002, 2004 may include one or more access windows 2008 allowing for PED 102 accessories (e.g., cameras) and/or interfaces (e.g., buttons, switches, knobs, etc.) to be accessed through the holder 2002, 2004.

The holder 2002, 2004 may further comprise one or more kickstands 2010 that may be configured and arranged to prop up the holder 2002, 2004 in a viewing position. The kickstand 2010 may be recessed into the holder 2002, 2004 when not in use, as illustrated in FIG. 82, and may be rotated out from the holder 2002, 2004 via a hinge 2012 to prop up the holder 2002, 2004, as illustrated in FIG. 83. In this manner, the kickstand 2010 may allow the support 2000 to operate as a stand to support the PED 102 disposed in the holder 2002, 2004 in a substantially upright and/or elevated position. In certain embodiments, by adjusting the relative angle of the kickstand 2010 relative to the holder 2002, 2004, a viewing angle of a PED 102 disposed within the support 2000 may be adjusted. For example, by increasing the degree to which the kickstand 2010 is rotated out from the holder 2002, 2004 via the hinge 2012, the PED 102 may be viewed at a less upright and/or elevated angle when a rest 2014 included on the end of the kickstand 2010 is placed on a working surface. Similarly, by decreasing the degree to which the kickstand 2010 is rotated out from the holder 2002, 2004, the PED 102 may be viewed at a more upright and/or elevated angle when a rest 2014 included on the end of the kickstand 2010 is placed on a working surface. In some embodiments, the hinge 2012 may be configured to allow the kickstand 2010 to rotate out from the holder 2002, 2004 at one or more predetermined angles using, for example, a ratcheting mechanism or the like. In certain embodiments, the rest 2014 may comprise a material configured to prevent the rest 2014 from easily sliding along the work surface (e.g., rubber or the like).

The length of the kickstand 2010 may be adjusted using a sliding and/or ratcheting mechanism 2016. In certain embodiments, by adjusting the length of the kickstand 2010, the relative viewing angle of the PED 102 disposed within the support 2000 may be adjusted. For example, by lengthening the kickstand 2010, the PED 102 may be viewed at a more upright and/or elevated angle. Similarly, by shortening the kickstand 2010, the PED 102 may be viewed at a less upright and/or elevated angle. In certain embodiments, the length of the kickstand 2010 may be configured to be adjusted to one or more predetermined positions via a selective locking mechanism or the like. In alternative embodiments, the kickstand 2010 may have a fixed length.

In certain embodiments, the kickstand 2010 may be coupled to the holder 2002, 2004 via a rotational mechanism 2018. In certain embodiments, the rotational mechanism 2018 may include a rotational grommet secured to the hinge 2012 and the kickstand 2010 allowing for variable rotation of the kickstand 2010 relative to the holder 2002, 2004. In other embodiments, the rotational mechanism 2018 may include a ratcheting swivel or pivot, a ball and socket mechanism, a temporary adhesive, a releasable latch, a clip, one or more buttons, a suction cup, and/or one or more straps allowing for rotational securement. In certain embodiments, the rotational mechanism 2018 may snap into certain specific rotational orientations (e.g., portrait orientation and/or landscape orientation) and require rotational force to move to a different specific orientation. In alternative embodiments, the rotation mechanism 2018 may not snap into specific orientations but may allow for rotational articulation in any number of orientations. Further, in certain embodiments, the kickstand 2010 may be coupled to the holder 2002, 2004 via a non-rotatable connection including, for example, a fixed and/or hinged mechanism.

In some embodiments, the support 2000 may not include a holder 2002, 2004, and the kickstand 2010 may be coupled to the PED 102 directly or via a rotation mechanism 2018. In certain embodiments, the kickstand 2010 and or rotation mechanism 2018 may be coupled to the PED 102 using one or more straps, buckles, clips, adhesives, and/or other mechanical structures integrated into the PED 102 and/or the kickstand 2010 and/or rotation mechanism 2018.

Figure 85:
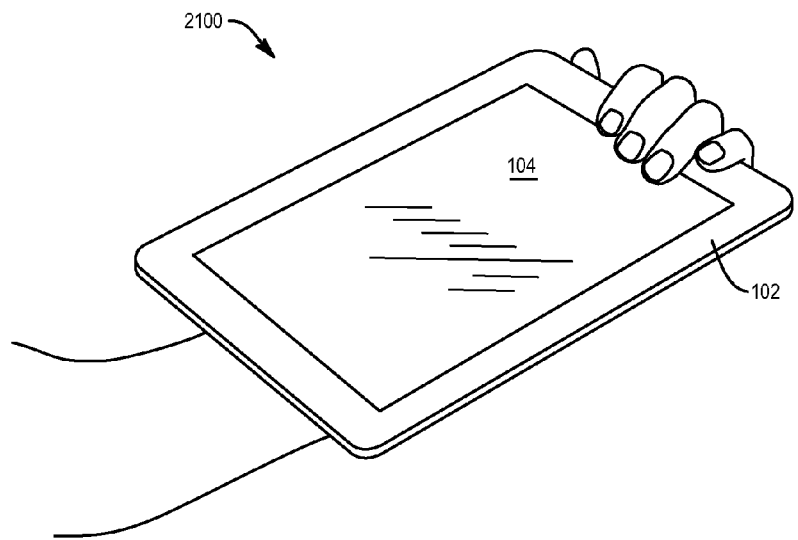
FIG. 85 illustrates a handheld holder for a portable electronic device consistent with embodiments of the present disclosure.
Figure 86:
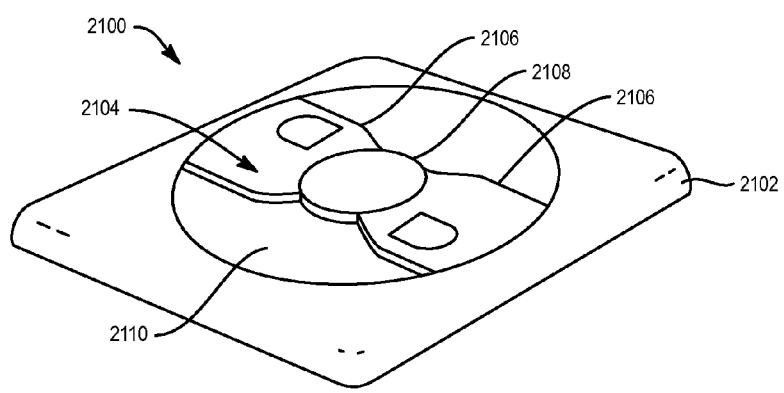
FIG. 86 illustrates a rear perspective view of the handheld holder illustrated in FIG. 85 consistent with embodiments of the present disclosure.

FIGS. 85-86 illustrate a handheld holder 2100 for a PED 102. The handheld holder 2100 may include a case 2102 configured to receive, secure, retain, and carry the PED 102, and may include any combination of the various features and embodiments described in any of the cases and/or holders described herein. As illustrated, the case 2102 may be configured to retain the PED 102 by mechanically securing the PED 102 about an outer periphery thereof. In certain embodiments, the case 2102 may retain the PED 102 using a compression and/or snap fit mechanism.

A hand grip 2104 may be included on a back of the handheld holder 2100. In certain embodiments, the hand grip 2104 may be mounted to a rotational mechanism 2110 coupled to the back of the case 2102. The hand grip 2104 may include a center hub 2108 and one or more straps 2106 extending outward therefrom and coupled to an outer periphery of the rotational mechanism 2110. A user may be able to slip a part of an appendage (e.g., a hand or forearm as illustrated in FIG. 85) between the rotational mechanism 2110 and the straps 2106 to secure the case 2102 to the user. In certain embodiments, the hand grip 2104 may be formed integrally with the rotational mechanism 2110. In other embodiments, the hand grip 2104 or a portion thereof (e.g., the straps 2106) may pass through and/or wrap around at least a portion of the rotational mechanism 2110.

The center hub 2108 may include a mechanism such that when it is rotated, the length of the one or more straps 2106 extending outward therefrom are adjusted. For example, when the center hub 2108 is rotated in a particular direction, the length of the one or more straps 2106 may be shortened. Similarly, when the center hub 2108 is rotated in a different direction, the length of the one or more straps may be increased. By allowing for adjustment of the length of the one or more straps 2106, the hand grip 2104 may be sized so as to be secured to a user's appendage (e.g., a hand or forearm) regardless of size.

The rotational mechanism 2110 may include a rotating grommet, a ratcheting swivel or pivot, a ball and socket mechanism, a temporary adhesive, a releasable latch, a clip, one or more buttons, a suction cup, and/or one or more straps allowing for rotational securement of the hand grip 2104 to the case 2102. The inside of the strap 2106 and/or the rotational mechanism 2110 may be lined at least in part with a pad and/or soft material (e.g., microfiber) to provide comfortable use. In certain embodiments, the rotational mechanism 2110 may be a circular shape, as illustrated, to comfortably conform to the palm of a user's hand. In other embodiments, the rotational mechanism 2110 may comprise any suitable and/or ergonomic shape.

When a user is wearing the rotatable holder 2100 by securing the hand grip 2104 to an appendage, the user may change the viewing orientation of the PED 102 disposed in the case 2102 by rotating the case 2102 around the rotational mechanism 2110 while securing the relative position of the hand grip 2104 in a fixed position. For example, a user may orient the rotational mechanism 2110 such that the PED 102 is viewed in a portrait orientation, as illustrated in FIG. 85. By applying rotational force to the PED 102 and/or the case 2102, the case 2102 may be rotated around the rotational mechanism 2110 and viewed in a different orientation including, for example, a landscape orientation. In certain embodiments, the rotational mechanism 2110 may be configured to effectively snap into one or more predetermined orientations including, for example, a portrait orientation and/or a landscape orientation.

In some embodiments, the holder 2100 may not include a case 2102 and the hand grip 2104 may be coupled to the PED 102 directly or via a rotation mechanism 2110. In certain embodiments, the hand grip 2104 and/or rotation mechanism 2110 may be coupled to the PED 102 using one or more straps, buckles, clips, adhesives, and/or other mechanical structures integrated into the PED 102 and/or the hand grip 2104 and/or the rotation mechanism 2110.

FIGS. 87-89 illustrate a support 2200 for a PED 102. The support 2200 may include a case 2202 configured to receive, secure, retain, and carry the PED 102, and may include any combination of the various features and embodiments described in any of the cases and/or holders described herein. As illustrated, the case 2202 may be configured to retain the PED 102 by mechanically securing the PED 102 using a compression fit mechanism or the like. In certain embodiments, the PED 102 may be secured within the case 2202 by one or more securement clips 2204 located on an end of the case 2202 configured to receive the PED 102, as illustrated in FIG. 89.

In some embodiments, the case 2202 may define a window allowing a user to view a display 104 of the PED 102. Further, the case 2202 may include one or more areas exposing the PED 102. In certain embodiments, these areas may aid in removing the PED 102 from the case 2202.

The support 2200 may further comprise one or more kickstands 2206 coupled to the case 2202 that may be configured and arranged to prop up the support 2200 in a viewing position. In certain embodiments, the kickstand 2206 may include any combination of the various features and embodiments described in any of the kickstands described herein. For example, the kickstand 2206 may be rotationally coupled to the case 2202 using a rotational mechanism similar to the rotational mechanism 2018 illustrated in FIGS. 82-84. In such embodiments, the viewing orientation (e.g., portrait and/or landscape orientation) of the PED 102 disposed within the support 2200 may be adjusted by rotating the kickstand 2206 relative to the case 2202. Further, the kickstand 2206 may be adjustable similar to the kickstand 2010 illustrated in FIGS. 82-84.

In certain embodiments, the case 2202 may define a storage region 2208 configured to secure and retain (i.e., store) one or more accessories 2210 associated with the PED 102 to the case 2202. In some embodiments, the one or more accessories 2210 may comprise any PED 102 interface (e.g., a keyboard, a mouse, headphones, and the like) or accessory (e.g., memory devices, cleaning solution, and the like). In certain embodiments, the one or more accessories 2210 may be secured and retained within the storage region 2208 mechanically using a compression fit mechanism or the like. In certain other embodiments, the one or more accessories may be secured within the storage region 2208 using one or more releasable clips, straps, or other locking features that allow for the accessories 2210 to be selectively locked into the storage region 2208 and selectively released from the storage region 2208.

Figure 90:
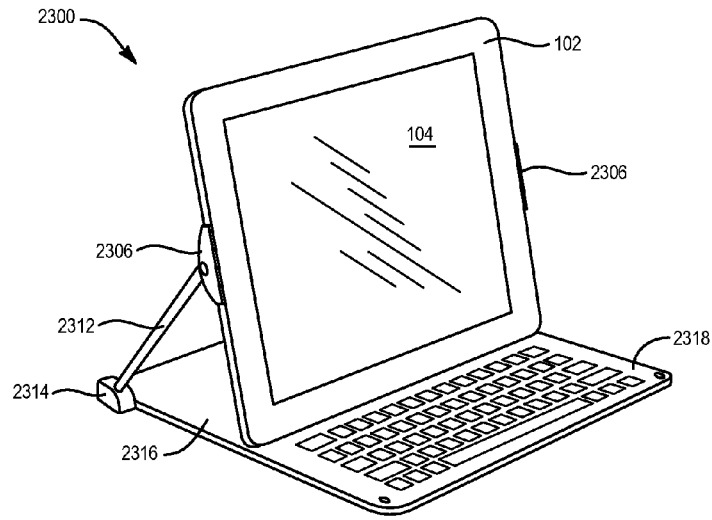
FIG. 90 illustrates a rotatable case for a portable electronic device oriented in a landscape configuration consistent with embodiments of the present disclosure.
Figure 91:
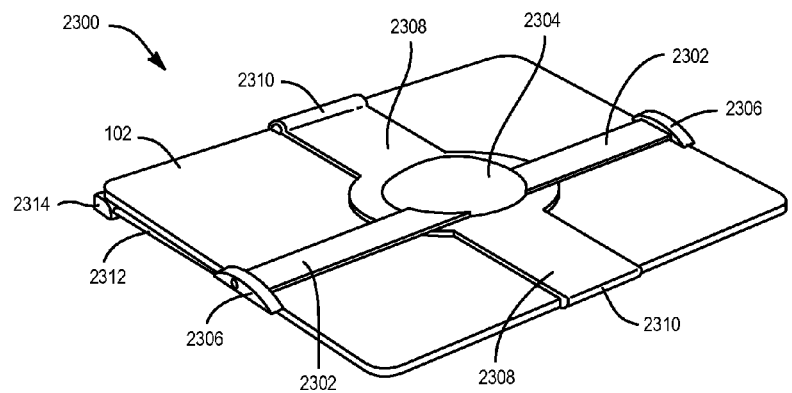
FIG. 91 illustrates the rotatable case illustrated in FIG. 90 configured in a stowage mode consistent with embodiments of the present disclosure.

FIGS. 90-91 illustrates a rotatable case 2300 for a PED 102 oriented in a landscape configuration. In certain embodiments, the rotatable case 2300 may include a holder (not shown) configured to receive, secure, retain, and carry the PED 102, and may include any combination of the various features and embodiments described in any of the cases and/or holders described herein. In other embodiments, as illustrated, the rotatable case 2300 may couple directly to the PED 102.

The rotatable case 2300 may include one or more horizontal supports 2302 extending from a rotational hub 2304 and coupled to an outer edge of the PED 102 via horizontal support clips 2306. In some embodiments, the horizontal support clips 2306 may be coupled to the outer edge of the PED 102 using a compression fit. In alternative embodiments, the horizontal support clips 2306 may be secured to the outer edge of the PED 102 using releasable clips, straps, or any other selectively locking mechanism. In certain embodiments, the length of the horizontal supports 2302 may be adjusted so that the horizontal support clips 2306 fit securely around the outer edge of the PED 102. In this manner, the horizontal supports 2302 may be adjusted to secure PEDs 102 having varied dimensions.

In certain embodiments, the rotational hub 2304 may include a rotational mechanism configured to allow the horizontal supports 2302 to rotate relative to one or more vertical supports 2308. The rotational mechanism may include a rotating grommet, a ratcheting swivel or pivot, a ball and socket mechanism, a temporary adhesive, a releasable latch, a clip, one or more buttons, a suction cup, and/or one or more straps allowing for rotational securement of the horizontal supports 2302 to the vertical supports 2308.

The vertical supports 2308 may be coupled to an outer edge of the PED 102 via vertical support clips 2310. In some embodiments, the vertical support clips 2310 may be coupled to the outer edge of the PED 102 using a compression fit. In alternative embodiments, the vertical support clips 2310 may be secured to the outer edge of the PED 102 using releasable clips, straps, or any other selectively locking mechanism. In certain embodiments, the length of the vertical supports 2308 may be adjusted so that the vertical support clips 2310 fit securely around the outer edge of the PED 102. In this manner, the vertical supports 2308 may be adjusted to secure PEDs 102 having varied dimensions.

Each of the horizontal support clips 2306 may be coupled to the ends of PED supports 2312. In certain embodiments, the horizontal support clips 2306 may be rotatably coupled to the ends of PED supports 2312 such that the PED supports 2312 may rotate in one or more directions relative to the horizontal support clips 2306. In this manner, the PED supports 2312 may be utilized to support the PED 102 when the PED 102 is propped up in an upright and/or elevated viewing position. In certain embodiments, the lengths of the PED supports 2312 may be adjustable.

The other ends of the PED supports 2312 may be coupled to hinges 2314 configured to allow the PED supports 2312 to rotate in one or more directions relative to the hinges 2314. The hinges 2314 may be in turn rigidly coupled to a base 2316. During use of the rotatable case 2300, the base 2316 may be placed on a working surface. The PED 102 may be raised and oriented in a viewing position by placing a bottom edge of the PED 102 on a top surface of the base 2316, as illustrated in FIG. 90. In such a configuration, the PED 102 may be supported in part by PED supports 2312 oriented at an appropriate angle relative to the PED 102 and/or base 2316 via the hinges 2314 and/or the horizontal support clips 2306. In some embodiments, the viewing angle of the PED 102 may be adjusted by changing the relative angle of the PED supports 2312 relative to the PED 102 and/or base 2316. In certain embodiments, the PED supports 2312 may be configured to support the PED 102 at one or more predefined viewing angles using a ratcheting or similar mechanism included in the hinges 2314 and/or the horizontal support clips 2306.

In certain embodiments, the bottom edge of the PED 102 may be positioned in one or more channels (not shown) included on the top surface of the base 2316 that may be similar to the channels 116 illustrated in FIGS. 1-2. In other embodiments, the bottom edge of the PED 102 may be rested on a material included on the top surface of the base 2316 designed to prevent the bottom edge of the PED 102 from easily sliding along the surface (e.g., rubber, suede, or the like).

In certain embodiments, when the PED 102 is in an upright and/or elevated position, the orientation of the PED 102 may be adjusted by rotating the vertical supports 2308 coupled to the PED 102 relative to the horizontal supports 2302 about the rotational hub 2304. For example, the vertical supports 2308 may be rotated about the rotational hub 2304 into a position where the vertical supports 2308 are perpendicular to the horizontal supports 2302 which may correspond to a landscape orientation for the PED 102, as illustrated in FIG. 90. Similarly, the vertical supports 2308 may be rotated about the rotational hub 2304 into a position where the vertical supports 2308 are parallel to the horizontal supports 2302 which may correspond to a portrait orientation for the PED 102.

In some embodiments, the base 2316 may include one or more integrated interfaces 2318 configured to interface with the PED 102. For example, as illustrated in FIG. 90, the base 2316 may include a keyboard. In other embodiments, the interfaces 2318 may include a touch pad, a speaker, or any other interface device capable of being integrated into the base 2316.

When the PED 102 is not in use, the rotatable case 2300 may be reconfigured by a user into a stowage configuration, as illustrated in FIG. 91. To reconfigure the rotatable case 2300 in a stowage configuration, the PED 102 may be articulated around the PED supports 2312, hinges 2314, and/or the horizontal support clips 2306 so as to cover the display 104 of the PED 102 with the top surface of the base 2316. In such a configuration, interfaces 2318 disposed on the top surface of the base 2316 may also be protected from external damage. In certain embodiments, reconfiguration of the case 2300 in a stowage configuration may require that the length of the PED supports 2312 be adjusted. In some embodiments, the base 2316 may be secured to the PED 102 in the stowage configuration via a magnetic connection, one or more releasable clips, straps, and/or other locking mechanism allowing for the rotatable case 2300 to be selectively locked into a stowage configuration and selectively release from the stowage configuration.

FIGS. 92-95 illustrate a rotatable case 2400 for a PED 102 including an integrated keyboard 2406. In certain embodiments, the rotatable case 2400 may include a holder (not shown) configured to receive, secure, retain, and carry the PED 102, and may include any combination of the various features and embodiments described in any of the cases and/or holders described herein. In other embodiments, as illustrated, the rotatable case 2400 may couple directly to the PED 102.

The rotatable case 2400 may include a holder 2402 extending from a rotational hub 2408 and coupled to the outer edges of the PED 102. In some embodiments, the holder 2402 may include clips coupled to the outer edge of the PED 102 using a compression fit. In alternative embodiments, the holder 2402 may be secured to the outer edge of the PED 102 using releasable clips, straps, or any other selectively locking mechanism. In certain embodiments, the length of the holder 2402 may be adjusted so that the holder 2402 fits securely around the outer edge of the PED 102. In this manner, the holder 2402 may be adjusted to secure PEDs 102 having varied dimensions.

In certain embodiments, the rotational hub 2408 may include a rotational mechanism configured to allow the holder 2402 to rotate relative to a vertical support 2404. The rotational mechanism may include a rotating grommet, a ratcheting swivel or pivot, a ball and socket mechanism, a temporary adhesive, a releasable latch, a clip, one or more buttons, a suction cup, and/or one or more straps allowing for rotational securement of the holder 2402 to the vertical support 2404. In certain embodiments, the vertical support 2404 may be configured to support the PED 102 in a substantially upright and/or elevated position allowing for viewing of the display 104. In some embodiments, the rotational hub 2408 may snap into certain specific rotational orientations (e.g., portrait orientation, as illustrated in FIG. 92, and/or landscape orientation, as illustrated in FIG. 93) and require rotational force to move to a different specific orientation. In alternative embodiments, the rotational hub 2408 may not snap into specific orientations but may allow for rotational articulation in any number of orientations. Further, in certain embodiments, the vertical support 2404 may be coupled to the holder 2402 via a non-rotatable connection including, for example, a fixed and/or hinged mechanism.

The vertical support 2404 may be configured to allow for its length to be adjusted using a sliding track or similar adjustable mechanism. In certain embodiments, the length of the vertical support 2404 may be configured to be adjusted to one or more predetermined positions via a selective locking mechanism or the like. In other embodiments, the vertical support 2404 may have a fixed length.

The vertical support 2404 may be coupled to a base 2410 via a hinge 2412 allowing the vertical support 2404 to rotate relative to the base 2410 in one or more directions. In certain embodiments, by varying the orientation of the vertical support 2404 relative to the base 2410 via the hinge 2412, a viewing angle of the PED 102 disposed in the holder 2402 may be adjusted.

In certain embodiments, the base 2410 may include one or more stabilizing supports 2414 configured to extend outward from the base 2410 on one or more sides and/or in one or more directions. In certain embodiments, the stabilizing supports 2414 may increase the surface area of the base 2410 on a working surface, thereby increasing the stability of the rotational case 2400 when in use. In some embodiments, the stabilizing supports 2414 may be slid along a track or similar mechanism into the base 2410 when not in use, as illustrated in FIG. 94, and be slid out of the base 2410 to provide a more stable platform when in use, as illustrated in FIGS. 92-93 and FIG. 95.

In some embodiments, the base 2410 may include one or more integrated interfaces 2406 configured to interface with the PED 102. For example, as illustrated in FIGS. 92-93 and FIG. 95, the base 2410 may include a keyboard 2406. In other embodiments, the interfaces 2406 may include a touch pad, a speaker, or any other interface device capable of being integrated into the base 2410.

When the PED 102 is not in use, the rotatable case 2400 may be reconfigured by a user into a stowage configuration, as illustrated in FIG. 94. To reconfigure the rotatable case 2400 in a stowage configuration, the PED 102 may be articulated around the hinge 2412 so as to cover the display 104 of the PED 102 with the top surface of the base 2410. In such a configuration, interfaces 2406 disposed on the top surface of the base 2410 may also be protected from external damage. In certain embodiments, reconfiguration of the case 2400 into a stowage configuration may require that the length of the vertical support 2404 be adjusted and/or a particular rotational orientation of the PED 102 be achieved. In some embodiments, the base 2410 may be secured to the PED 102 in the stowage configuration via a magnetic connection, one or more releasable clips, straps, and/or other locking mechanism allowing for the rotatable case 2400 to be selectively locked into a stowage configuration and selectively release from the stowage configuration.

FIGS. 96-99 illustrate a rotatable case 2500 for a PED 102 including an integrated keyboard 2502. The rotatable case 2500 may include a holder 2504 configured to receive, secure, retain, and carry the PED 102, and may include any combination of the various features and embodiments described in any of the cases and/or holders described herein. As illustrated, the holder 2504 may be configured to retain the PED 102 by mechanically securing the PED 102 using a compression fit mechanism or the like. In certain embodiments, the holder 2504 may retain the PED 102 by securing one or more corners of the PED 102.

Figure 96:
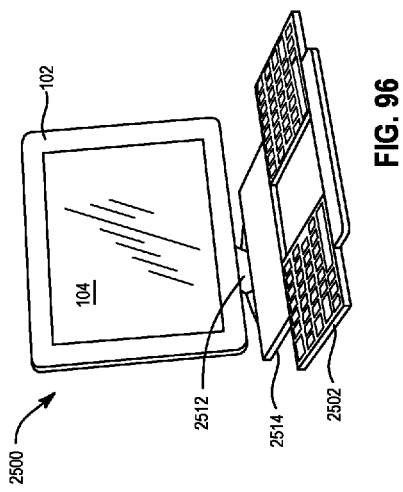
FIG. 96 illustrates a rotatable case for a portable electronic device including an integrated keyboard oriented in a landscape configuration consistent with embodiments of the present disclosure.
Figure 98:
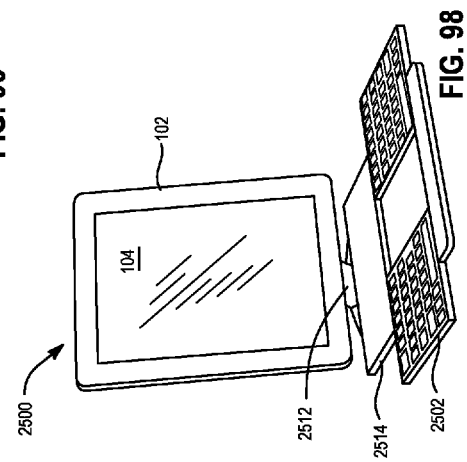
FIG. 98 illustrates the rotatable case illustrated in FIG. 96 oriented in a portrait configuration consistent with embodiments of the present disclosure.

The holder 2504 may be coupled to a rotational mechanism 2506 which in turn may be coupled to a vertical support 2508 via an upper hinge 2510. In certain embodiments, the rotational mechanism 2506 may be configured to allow the holder 2504 to rotate relative to the vertical support 2508. The rotational mechanism 2506 may include a rotating grommet, a rotating hub, a ratcheting swivel or pivot, a ball and socket mechanism, a temporary adhesive, a releasable latch, a clip, one or more buttons, a suction cup, and/or one or more straps allowing for rotational securement of the holder 2504 to the vertical support 2508. In certain embodiments, the vertical support 2508 may be configured to support the PED 102 in a substantially upright and/or elevated position allowing for viewing of the display 104. In some embodiments, the rotational mechanism 2506 may snap into certain specific rotational orientations (e.g., portrait orientation, as illustrated in FIG. 98, and/or landscape orientation, as illustrated in FIG. 96, and require rotational force to move to a different specific orientation. In alternative embodiments, the rotational mechanism 2506 may not snap into specific orientations but may allow for rotational articulation in any number of orientations. Further, in certain embodiments, the vertical support 2508 may be coupled the holder 2504 via a non-rotatable connection including, for example, a fixed and/or hinged mechanism, and may be connected directly or via the upper hinge 2510.

The vertical support 2508 may be configured to allow for its length to be adjusted using a sliding track or similar adjustable mechanism. In certain embodiments, the length of the vertical support 2508 may be configured to be adjusted into one or more predetermined positions via a selective locking mechanism or the like. In other embodiments, the vertical support 2508 may have a fixed length.

The vertical support 2508 may be further coupled to a base 2514 via a lower hinge 2512 allowing the vertical support 2508 to rotate relative to the base 2514 in one or more directions. In certain embodiments, by varying the orientation of the vertical support 2508 relative to the base 2514 via the lower hinge 2512 and/or the holder 2504 via the upper hinge 2510, a viewing angle of the PED 102 disposed in the holder 2404 may be adjusted.

Figure 97:
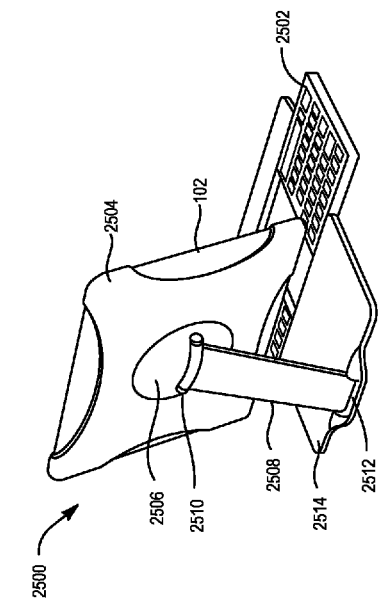
FIG. 97 illustrates a rear perspective view of the rotatable case illustrated in FIG. 96 consistent with embodiments of the present disclosure.

As illustrated, the base 2514 may include one or more integrated interfaces 2502 configured to interface with the PED 102. For example, as illustrated in FIGS. 96-98, the base 2514 may include a keyboard. In other embodiments, the interfaces 2502 may include a touch pad, a speaker, or any other interface device capable of being integrated into the base 2514. In certain embodiments, the interfaces 2502 may be configured to extend outward from the base 2514 on one or more sides and/or in one or more directions. In certain embodiments, by extending outwards, the interfaces 2502 may increase the effective surface area of the base 2514 on a working surface, thereby increasing the stability of the rotational case 2500 when in use. Further, by extending the interfaces 2502 outwards, the effective usable area of the interfaces 2502 may be increased. For example, when the interfaces 2502 include a keyboard, as illustrated in FIGS. 96-98, extending the keyboard outwards may increase the size of the keyboard. In certain embodiments, the interfaces 2502 may be slid along a track or similar mechanism into the base 2514 when not in use, as illustrated in FIG. 99, and be slid out of the base 2514 when in use, as illustrated in FIGS. 96-98.

Figure 99:
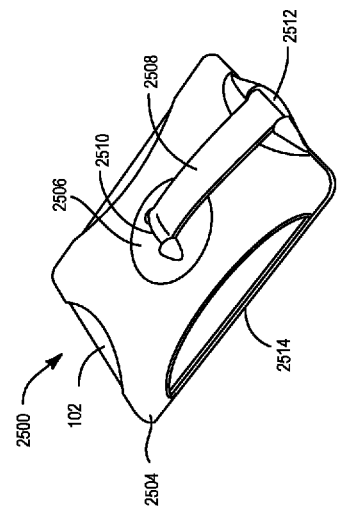
FIG. 99 illustrates the rotatable case illustrated in FIG. 96 configured in a stowage mode consistent with embodiments of the present disclosure.

When the PED 102 is not in use, the rotatable case 2500 may be reconfigured by a user into a stowage configuration, as illustrated in FIG. 99. To reconfigure the rotatable case 2500 in a stowage configuration, the PED 102 may be articulated around the upper hinge 2510 and the lower hinge 2512 so as to cover the display 104 of the PED 102 with the top surface of the base 2514. In such a configuration, interfaces 2502 disposed on the top surface of the base 2514 may also be protected from external damage. In certain embodiments, reconfiguration of the case 2500 into a stowage configuration may require that the length of the vertical support 2508 be adjusted and/or a particular rotational orientation of the PED 102 be achieved. In some embodiments, the base 2514 may be secured to the PED 102 in the stowage configuration via a magnetic connection, one or more releasable clips, straps, and/or other locking mechanism allowing for the rotatable case 2500 to be selectively locked into a stowage configuration and selectively release from the stowage configuration.

Figure 101:
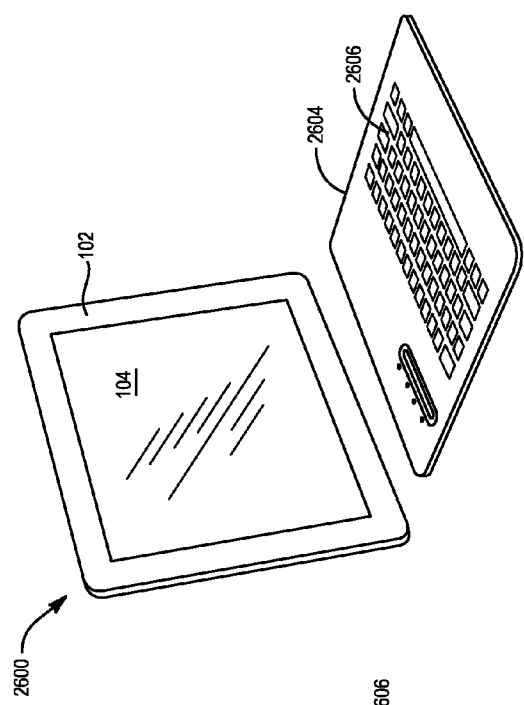
FIG. 101 illustrates a front perspective view the support illustrated in FIG. 100 consistent with embodiments of the present disclosure.
Figure 102:
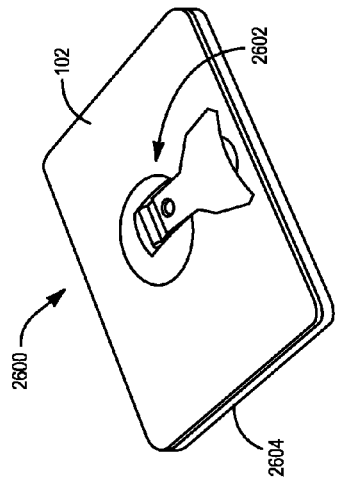
FIG. 102 illustrates the support illustrated in FIG. 100 configured in a stowage mode consistent with embodiments of the present disclosure.
Figure 100:
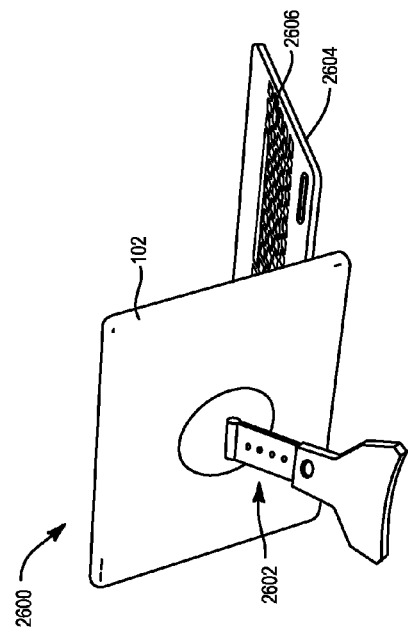
FIG. 100 illustrates a support for a portable electronic device consistent with embodiments of the present disclosure.

FIGS. 100-102 illustrates a support 2600 for a PED 102. As illustrated, the support 2600 may include a holder (not shown) configured to receive, secure, retain, and carry the PED 102, and may include any combination of the various features and embodiments described in any of the cases and/or holders described herein. In certain embodiments, a rotatable kickstand 2602 may be coupled to the holder and configured to support the holder and PED 102 in an substantially upright and/or elevated position In other embodiments, as illustrated, the support 2600 may include a rotatable kickstand 2602 coupled directly to the PED 102 one or more straps, buckles, clips, adhesives, and/or any other similar attachment feature.

In certain embodiments, the rotatable kickstand 2602 may incorporate similar features to the kickstand 1908 described above in reference to FIGS. 78-81. In this manner, the viewing angle of the PED 102 may be adjusted by articulating the rotatable kickstand 2602 in various manners (e.g., changing the relative angle between the kickstand 2602 and the PED 102, adjusting the length of the kickstand 2602, and the like). Further, the viewing orientation of the PED 102 may be adjusted by rotating the relative position of the kickstand 2602 relative to the PED 102 using a rotational mechanism.

The support 2600 may further include a cover 2604 which in some embodiments, may include one or more integrated interfaces 2606 configured to interface with the PED 102. For example, as illustrated in FIGS. 100-101, the cover 2604 may include a keyboard. In other embodiments, the interfaces 2606 may include a touch pad, a speaker, or any other interface device capable of being integrated into the cover 2604.

When the PED 102 is not in use, the support 2600 may be reconfigured by a user into a stowage configuration, as illustrated in FIG. 102. To reconfigure the support 2600 in a stowage configuration, the cover 2604 may be secured over a side of the PED 102 so as to cover the display 104 of the PED 102 with the cover 2604 and protect it from external damage. In such a configuration, interfaces 2606 disposed on an inner surface of the cover 2604 may also be protected from external damage. In some embodiments, the cover 2604 may be secured to the PED 102 in the stowage configuration via a magnetic connection, one or more releasable clips, straps, and/or other locking mechanism allowing for the cover 2604 to be selectively locked into a stowage configuration and selectively release from the stowage configuration.

FIG. 103 illustrates an interaction between a support panel 2708 of a rotatable case 2700 and a securing panel 2702 via a selectively detachable rotational mechanism 2716, 2718. In certain embodiments, the rotatable case 2700 may include any combination of the various features and embodiments illustrated and described in reference to the rotatable case 800 of FIGS. 22-32. As illustrated, the rotatable case 2700 may include a securing panel 2702 configured to receive, secure, retain, and carry a PED, and may include any combination of the various features and embodiments described in any of the cases and/or holders described herein.

The rotatable case 2700 may include a base 2706 with one or more support channels 2710 and a supporting panel 2708 comprising a lower portion 2712 and a pivot flat 2714. The selectively detachable rotational mechanism 2716, 2718 may include a rear portion 2716 coupled to the supporting panel 808 and a front portion 2718 coupled to the securing panel 2702, which may include one or more access ports 2704. In certain embodiments, the rear portion 2716 may be coupled to the pivot flat 2714 of the supporting panel 2708.

According to various embodiments, the front portion 2718 of the selectively detachable rotational mechanism 2716, 2718 may be mated with the rear portion 2716 of the selectively detachable rotational mechanism 2716, 2718 in order to rotatably secure the securing panel 2702 to the pivot flap 2714 and/or supporting panel 2708. In this manner, the securing panel 2702 may be free to rotate 360 degrees relative to the supporting panel 2708 about the selectively detachable rotational mechanism 2716, 2718.

In certain embodiments, the front portion 2718 and the rear portion 2716 of the grommet may be joined together during manufacturing or assembly and are not configured to be selectively separated by a user. Alternatively, a user may selectively separate the front portion 2718 from the rear portion 2716 in order to remove the securing panel 2702 from the pivot flap 2714, as illustrated in FIG. 103. In other embodiments, the front portion 2718 and the rear portion 2716 of the grommet are inseparable and the grommet may be selectively detachable from the pivot flap 2714 and/or the securing panel 2702.

Figure 104:
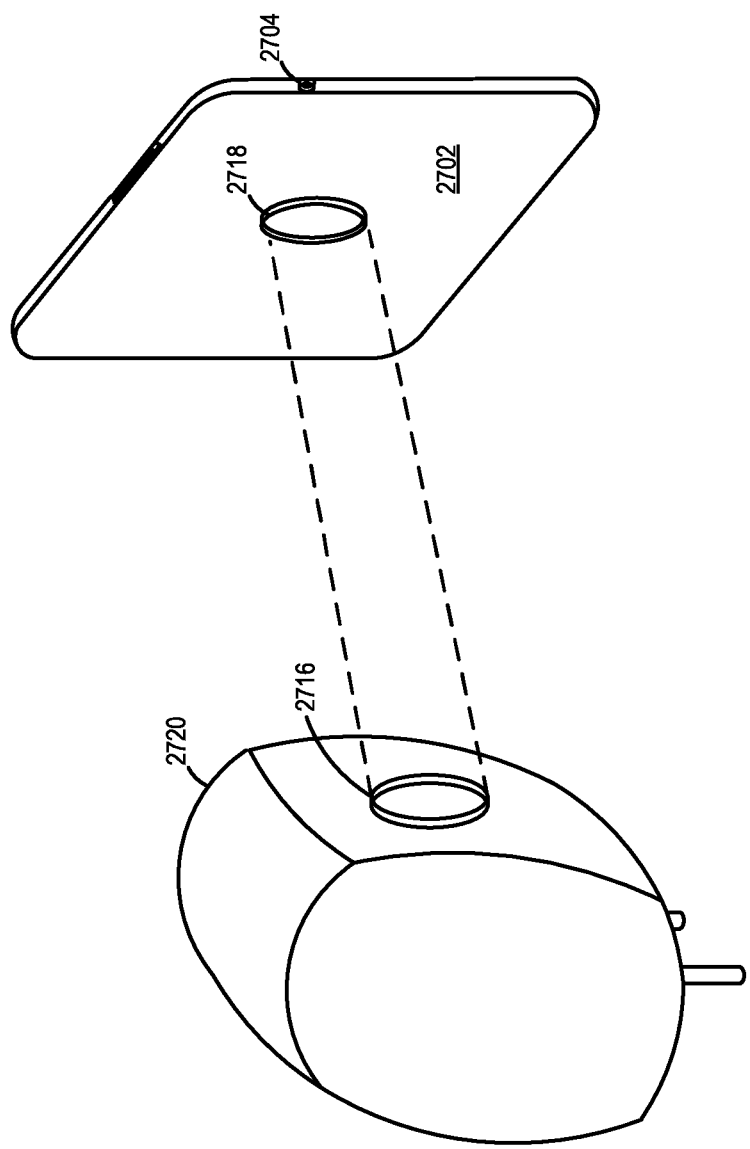
FIG. 104 illustrates an interaction of a selectively detachable rotational mechanism and a securing panel of a rotatable case for a portable electronic device consistent with embodiments of the present disclosure.

FIG. 104 illustrates an interaction of a selectively detachable rotational mechanism 2716, 2718 and a securing panel 2702 of a rotatable case 2700 for a PED (not shown). Particularly, FIG. 104 illustrates the securing panel 2702 of FIG. 103 mounted on a surface 2720 which may, as shown, be a back of a car seat. In alternative embodiments, the surface 2720 may be refrigerator door, a wall, a door, a desk, a window, and/or any other appropriate surface.

To mount the securing panel 2702 on the surface 2720, the rear portion 2716 of the rotational grommet may be mounted to the surface 2720, and the front portion 2718 may be secured to the rear portion 2716, thereby rotationally securing the securing panel 2702 to the surface 2720. In certain embodiments, the rear portion 2716 may be mounted to the surface 2720 using, for example, an adhesive, hook and loop mechanisms, buttons, one or more zippers, and/or clamps. Further, in some embodiments, the rear portion 2716 may be mounted to the surface 2720 using a mechanism allowing for rotation of the rear portion 2716 in one or more directions relative to the surface 2720 such as, for example, a hinge, a ball and socket joint, and the like. In certain embodiments, the mechanism allowing for rotation of the rear portion 2716 in one or more directions may allow a viewing angle of a PED disposed in the securing panel 2702 to be adjusted relative to the surface 2720.

Figure 105:
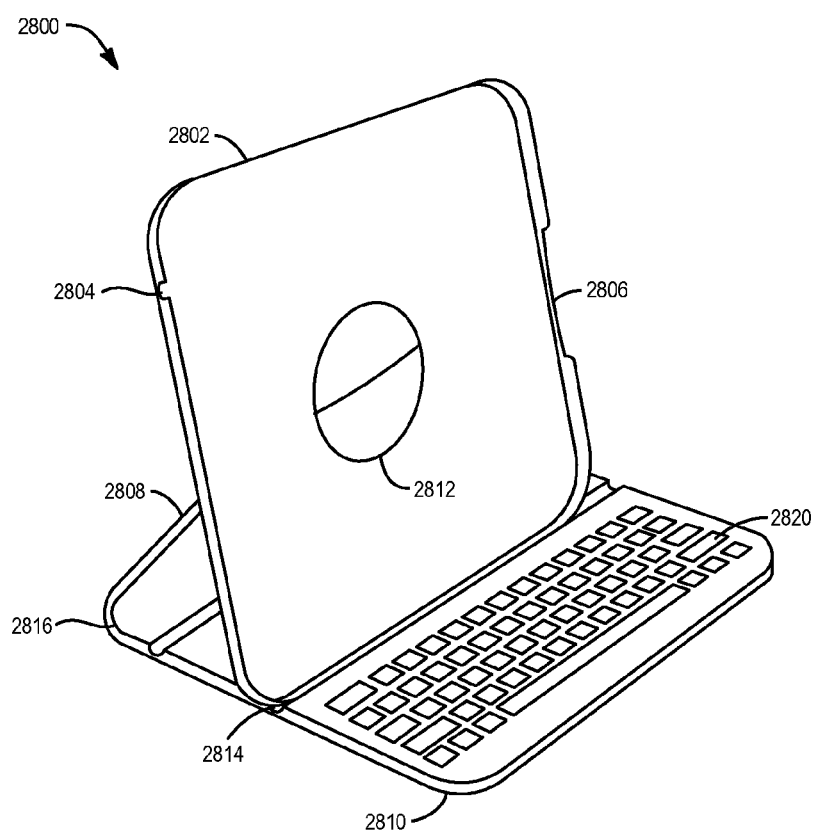
FIG. 105 illustrates a rotatable case including a user interface consistent with embodiments of the present disclosure.

FIG. 105 illustrates a rotatable case 2800 including a user interface 2820. As illustrated, the rotatable case 2800 may include a securing panel 2802 configured to receive, secure, retain, and carry the PED (not shown), and may include any combination of the various features and embodiments described in any of the cases and/or holders described herein. According to various embodiments, the rotatable case 2800 may include various access ports (such as 2804 and 2806) to facilitate interfacing a PED disposed within the rotatable case 2800 with connector plugs, cables, headphones, speakers, and/or power adaptors. In certain embodiments, the rotatable case 2800 may include built-in cords to route power, connectivity, and/or headphone cables from a PED to an external device. Moreover, according to various embodiments, a battery may be built into a panel or pocket of the rotatable case 2800.

In certain embodiments, the rotatable case 2800 may have the ability to rotate the securing panel 2802 with respect to a supporting panel 2808 and a base panel 2810. Any of a wide variety of rotatable securing devices may be employed to rotatably secure securing panel 2802 to supporting panel 2808. For example, bushings, flanged bushings, grommets, rivets, eyelets, plain bearings, bearings, and/or any combination thereof may be employed to rotatably secure the securing panel 2802 to the supporting panel 2808. For example, as illustrated, a grommet 2812 may be configured to rotatably secure the securing panel 2802 to the supporting panel 2808. In some embodiments, the grommet 2812 may comprise a ring that may allow a logo to show through the hole in the middle of grommet 2812. In certain embodiments, one or more interchangable accessories and/or inserts may "snap" into the hole in the middle of grommet 2812 including, for example, a logo insert, a proximity alarm or other loss prevention accessory, and the like.

The base panel 2812 may be configured with channels or groves 2814 to secure the bottom edge of securing panel 2802 when the securing panel 2802 is in an upright and/or elevated position. According to various alternative embodiments, in place of channels 2814 a frictional surface (e.g., rubberized surface or the like) or frictional contact patches may be utilized to secure the bottom edge of the securing panel 2802 in an upright and/or elevated position.

The supporting panel 2808 may be configured to provide a counterforce to the securing panel 2802 in order to support securing panel 2802 in an upright and/or elevated position. As illustrated, the supporting panel 2808 and the base panel 2810 may comprise a single panel folded or bent at 2816. According to various embodiments, the relative proportions of the base panel 2810 and the supporting panel 2808 may be adapted for a particular application. Further, in certain embodiments, the rotatable case 2800 may be configured to support a PED at one or more angles relative to the base panel 2810 and in a plurality of orientations, including portrait and landscape.

In certain embodiments, the rotatable case 2800 may be configured in a stowage mode, wherein the base panel 2810 may be oriented so as to cover and protect a display of a PED secured in the securing panel 2802 from external damage. In some embodiments, the base panel 2810 may include one or more integrated interfaces 2820 including, as illustrated in FIG. 105, a keyboard. In other embodiments, the interfaces 2820 may include a touch pad, a speaker, or any other interface device capable of being integrated into the base 2810. In certain embodiments, when the rotatable case 2800 is configured in a stowage mode, the securing panel 2802 and/or the PED may cover and protect the interfaces 2820 from external damage.

It will be understood by those having skill in the art that changes may be made to the details of the above-described embodiments without departing from the underlying principles presented herein. For example, the rotating and/or pivoting systems allowing for adjustable viewing orientation disclosed herein may be integrated into a stand, a mount, or any other type of accessory configured to receive a PED. In addition, any suitable combination of various embodiments, or the features thereof, is contemplated. Further, any methods disclosed herein may comprise one or more steps or actions for performing the described method. These method steps and/or actions may be interchanged with one another. In other words, unless a specific order of steps or actions is required for proper operation of the embodiment, the order and/or use of specific steps and/or actions may be modified.

Throughout this specification, any reference to "one embodiment," "an embodiment," or "the embodiment" means that a particular feature, structure, or characteristic described in connection with that embodiment is included in at least one embodiment. Thus, the quoted phrases, or variations thereof, as recited throughout this specification are not necessarily all referring to the same embodiment. Similarly, it should be appreciated that in the above description of embodiments, various features are sometimes grouped together in a single embodiment, figure, or description thereof for the purpose of streamlining the disclosure. This method of disclosure, however, is not to be interpreted as reflecting an intention that any claim require more features than those expressly recited in that claim. Rather, inventive aspects lie in a combination of fewer than all features of any single foregoing disclosed embodiment. It will be apparent to those having skill in the art that changes may be made to the details of the above-described embodiments without departing from the underlying principles set forth herein.

What is claimed is:

1. A case for a portable electronic device, the portable electronic device including a back side and a display side, the case comprising:
    a base panel configured to sit on a working surface;
    a support member pivotally coupled to the base panel and configured to support the portable electronic device in an elevated position;
    a rotational mechanism coupled to the support member; and
    a holder comprising,
        a back surface coupled to the rotational mechanism,
        a front surface configured to receive the portable electronic device and secure the portable electronic device with the display side exposed,
        a first side extending from the front surface, and
        a second side extending from the front surface,
    wherein the support member is configured to pivot the holder to the elevated position wherein the display side is accessible and the rotational mechanism is configured to allow the holder to rotate to a first position wherein the first side rests on the base panel and to rotate to a second position wherein the second side rests on the base panel, and
    wherein the support member is configured to pivot the holder to a stowage position wherein the display side is covered by the base panel.

2. The case of claim 1, wherein in the stowage position, the back surface of the holder defines a portion of the exterior of the case and the support member extends along the back surface of the holder.

3. The case of claim 1, wherein the rotational mechanism comprises a rotational grommet.

4. The case of claim 3, wherein the rotational grommet comprises a first portion coupled to the support member and a second portion coupled to the holder.

5. The case of claim 4, wherein the first portion is configured to selectively detach from the second portion.

6. The case of claim 1, wherein the rotational mechanism comprises a ball and socket mechanism.

7. The case of claim 1, wherein the support member comprises a panel.

8. The case of claim 7, wherein the support member, proximate to the pivotal coupling with the base panel, includes a width substantially the same as a width of the base panel.

9. The case of claim 1, wherein the rotational mechanism is configured to hold into one or more predetermined relative rotational orientations of the holder and the support member.

10. The case of claim 9, wherein the base panel includes an interior surface and the front surface of the holder includes a surface area that is substantially the same as a surface area of the interior surface.

11. The case of claim 1, wherein the holder includes an aperture extending through the front and back surfaces and wherein the rotational mechanism is coupled to the holder proximate to the aperture.

12. A case for a portable electronic device, the portable electronic device including a back side and a display side, the case comprising:
    a base panel including an interior surface and an exterior surface, the base panel configured to sit on a working surface;
    a support member pivotally coupled to the base panel and configured to support the portable electronic device in an elevated position;
    a rotational mechanism coupled to the support member; and
    a holder comprising,
        a back side coupled to the rotational mechanism, and
        a front side configured to receive the portable electronic device and secure the portable electronic device with the display side exposed,
    wherein the support member is configured to pivot the holder to the elevated position wherein the holder rests on the interior surface of the base panel and the display side is accessible and, in the elevated position, the rotational mechanism is configured to allow the holder to rotate to a first position wherein the holder rests on the interior surface of the base panel and to rotate to a second position wherein the holder rests on the interior surface of the base panel, and wherein the support member is configured to pivot the holder to a stowage position wherein the front side of the holder is covered by the interior surface of the base panel.

13. The case of claim 12, wherein in the stowage position, the exterior surface of the base panel defines a first part of an exterior of the case and the back side of the holder defines a second part of the exterior of the case.

14. The case of claim 13, wherein in the stowage position, the support member extends along the back side of the holder.

15. The case of claim 12, wherein the rotational mechanism comprises a rotational grommet.

16. The case of claim 15, wherein the rotational grommet comprises a first portion coupled to the support member and a second portion coupled to the holder.

17. The case of claim 12, wherein the support member comprises a panel.

18. The case of claim 17, wherein the support member, proximate to the pivotal coupling with the base panel, includes a width substantially the same as a width of the base panel.

19. The case of claim 12, wherein the front side of the holder includes a surface area that is substantially the same as a surface area of the interior surface of the base panel.

20. The case of claim 12, wherein the holder includes an aperture extending through the front and back sides and wherein the rotational mechanism is coupled to the holder proximate to the aperture.

* * * * *